(12) United States Patent  
Tachibana et al.

(10) Patent No.: US 8,722,307 B2  
(45) Date of Patent: May 13, 2014

(54) NEAR-INFRARED ABSORPTIVE LAYER-FORMING COMPOSITION AND MULTILAYER FILM COMPRISING NEAR-INFRARED ABSORPTIVE LAYER

(75) Inventors: Seiichiro Tachibana, Joetsu (JP); Kazumi Noda, Joetsu (JP); Masaki Ohashi, Joetsu (JP); Takeshi Kinsho, Joetsu (JP); Wu-Song Huang, Hopewell Junction, NY (US); Dario L. Goldfarb, Yorktown Heights, NY (US); Wai-Kin Li, Hopewell Junction, NY (US); Martin Glodde, Hopewell Junction, NY (US)

(73) Assignees: International Business Machines Corporation, Armonk, NY (US); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/118,013

(22) Filed: May 27, 2011

(65) Prior Publication Data

US 2012/0301828 A1    Nov. 29, 2012

(51) Int. Cl.  
*G03F 7/004* (2006.01)  
*G03F 7/11* (2006.01)

(52) U.S. Cl.  
USPC .................. 430/270.1; 430/271.1; 430/280.1

(58) Field of Classification Search  
USPC ....................... 430/270.1, 271.1, 272.1, 280.1  
See application file for complete search history.

(56) References Cited

U.S. PATENT DOCUMENTS

| | | | |
|---|---|---|---|
| 4,558,949 A | 12/1985 | Uehara et al. |
| 4,962,318 A | 10/1990 | Nishi |
| 5,380,621 A | 1/1995 | Dichiara et al. |
| 5,412,214 A | 5/1995 | Suzuki et al. |
| 5,541,235 A | 7/1996 | Busman et al. |
| 5,632,910 A | 5/1997 | Nagayama et al. |
| 5,643,700 A | 7/1997 | Otsuka |
| 5,650,483 A | 7/1997 | Malik et al. |
| 6,008,350 A | 12/1999 | Roschger et al. |

(Continued)

FOREIGN PATENT DOCUMENTS

| | | |
|---|---|---|
| JP | 58-113706 A | 7/1983 |
| JP | 2-54103 A | 2/1990 |

(Continued)

OTHER PUBLICATIONS

Office Action dated Aug. 19, 2011 for U.S. Appl. No. 13/108,534.

(Continued)

*Primary Examiner* — Anca Eoff  
(74) *Attorney, Agent, or Firm* — Birch, Stewart, Kolasch & Birch, LLP

(57) ABSTRACT

A composition comprising a polymer comprising repeat units selected from formulae (1) to (4), an aromatic ring-containing polymer, a near-infrared absorbing dye, and a solvent is used to form a near-infrared absorptive film. $R^1$, $R^7$, $R^9$, and $R^{14}$ are H, methyl, fluorine or trifluoromethyl, $R^2$ to $R^6$ are H, F, trifluoromethyl, $-C(CF_3)_2OR^{16}$, alkyl or alkoxy, at least one of $R^2$ to $R^6$ being F or a fluorinated group, $R^{16}$, $R^8$ and $R^{13}$ are H or a monovalent organic group, $L^1$ is a single bond or $-C(=O)O-$, m is 0 or 1, $L^2$ is a di- or trivalent hydrocarbon group, n is 1 or 2, $R^{10}$ to $R^{12}$ are H, hydroxyl, halogen or a monovalent organic group, and $R^{15}$ is a fluorinated $C_2$-$C_{15}$ hydrocarbon group.

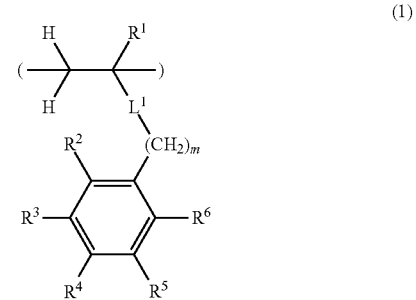

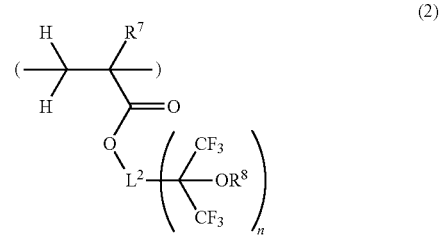

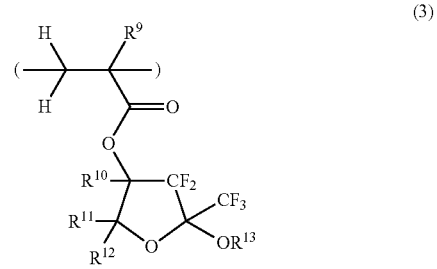

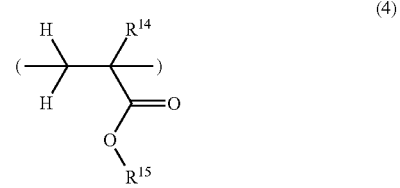

23 Claims, 5 Drawing Sheets

(56) References Cited

U.S. PATENT DOCUMENTS

| | | | |
|---|---|---|---|
| 6,025,117 | A | 2/2000 | Nakano et al. |
| 6,312,867 | B1 | 11/2001 | Kinsho et al. |
| 6,329,125 | B2 | 12/2001 | Takechi et al. |
| 6,475,590 | B1 | 11/2002 | Kitayama et al. |
| 6,503,692 | B2 | 1/2003 | Angelopoulos et al. |
| 6,830,872 | B2 * | 12/2004 | Mizutani et al. ............ 430/276.1 |
| 7,105,270 | B2 * | 9/2006 | Fujita et al. ................. 430/270.1 |
| 7,163,778 | B2 | 1/2007 | Hatakeyama et al. |
| 7,510,820 | B2 | 3/2009 | Hatakeyama et al. |
| 7,531,289 | B2 | 5/2009 | Kinsho et al. |
| 7,771,913 | B2 | 8/2010 | Kaneko et al. |
| 7,868,199 | B2 | 1/2011 | Hasegawa et al. |
| 7,879,530 | B2 * | 2/2011 | Tachibana et al. .......... 430/271.1 |
| 2003/0232281 | A1 * | 12/2003 | Watanabe et al. ............. 430/302 |
| 2007/0238300 | A1 | 10/2007 | Ogihara et al. |
| 2008/0008955 | A1 | 1/2008 | Brodsky et al. |
| 2008/0038662 | A1 | 2/2008 | Hatakeyama et al. |
| 2008/0048155 | A1 | 2/2008 | Toriniwa et al. |
| 2008/0318160 | A1 | 12/2008 | Ohsawa et al. |
| 2009/0087799 | A1 | 4/2009 | Tachibana et al. |
| 2009/0136869 | A1 | 5/2009 | Ogihara et al. |
| 2009/0208865 | A1 | 8/2009 | Brunner et al. |
| 2009/0246694 | A1 | 10/2009 | Ohsawa et al. |
| 2011/0042653 | A1 * | 2/2011 | Glodde et al. ................... 257/40 |
| 2011/0042771 | A1 * | 2/2011 | Huang et al. ................... 257/437 |
| 2012/0119171 | A1 * | 5/2012 | Ohashi et al. ................. 252/587 |

FOREIGN PATENT DOCUMENTS

| | | | |
|---|---|---|---|
| JP | 5-291208 | A | 11/1993 |
| JP | 6-29186 | A | 2/1994 |
| JP | 6-84789 | A | 3/1994 |
| JP | 7-146551 | A | 6/1995 |
| JP | 7-181688 | A | 7/1995 |
| JP | 7-183194 | A | 7/1995 |
| JP | 8-253705 | A | 10/1996 |
| JP | 9-73173 | A | 3/1997 |
| JP | 10-60409 | A | 3/1998 |
| JP | 11-23837 | A | 1/1999 |
| JP | 11-60735 | A | 3/1999 |
| JP | 2000-81511 | A | 3/2000 |
| JP | 2000-336121 | A | 12/2000 |
| JP | 2004-310019 | A | 11/2004 |
| JP | 2005-15532 | A | 1/2005 |
| JP | 2005-520354 | A | 7/2005 |
| JP | 2005-250434 | A | 9/2005 |
| JP | 2006-152255 | A | 6/2006 |
| JP | 2007-145797 | A | 6/2007 |
| JP | 2007-171895 | A | 7/2007 |
| JP | 2007-204385 | A | 8/2007 |
| JP | 2007-297590 | A | 11/2007 |
| JP | 2007-302873 | A | 11/2007 |
| JP | 2008-65303 | A | 3/2008 |
| JP | 2008-83668 | A | 4/2008 |
| JP | 2008-88426 | A | 4/2008 |
| JP | 2009-98639 | A | 5/2009 |
| JP | 2009-126940 | A | 6/2009 |
| JP | 2009-258695 | A | 11/2009 |
| JP | 2010-253448 | A | 11/2010 |
| WO | WO 2006/006573 | A1 | 1/2006 |

OTHER PUBLICATIONS

Narayanan, N. et al. "A New Method for the Synthesis of Heptamethine Cyanine Dyes: Synthesis of New Near-Infrared Fluorescent Labels", J. Org. Chem., 1995, vol. 60, No. 8, pp. 2391-2395.

Rubingh, R. et al.,"Lithographic Performance of a Dual Stage, 0.93NA ArF Step & Scan System", Proc. of SPIE, vol. 5754, p. 681-692, 2005.

* cited by examiner

US 8,722,307 B2

NEAR-INFRARED ABSORPTIVE LAYER-FORMING COMPOSITION AND MULTILAYER FILM COMPRISING NEAR-INFRARED ABSORPTIVE LAYER

TECHNICAL FIELD

This invention relates to a composition for forming a near-infrared absorptive layer for use in microfabrication in the semiconductor device manufacture process, and more particularly, to a near-infrared absorptive layer-forming composition adapted for exposure to ArF excimer laser radiation (193 nm). It also relates to a multilayer film formed using the composition.

BACKGROUND ART

Semiconductor devices are manufactured by the microfabrication technology based on photolithography. In the photolithography, a photoresist layer is formed on a silicon wafer. Using an exposure apparatus, an image on an original plate known as a reticle or mask is transferred to the photoresist layer, which is developed into a resist pattern. Then the silicon or a metal or another material underneath the resist pattern is etched for forming an electronic circuit on the silicon wafer. In order to form a pattern of finer size for further integration of semiconductor devices, efforts have been made to reduce the wavelength of the exposure light used in the photolithography. In the mass production process of 64 Mbit DRAM, for example, KrF excimer laser (248 nm) is utilized. For the fabrication of DRAMs requiring a finer patterning size of 0.13 μm or less, ArF excimer laser (193 nm) is utilized. It is under investigation to fabricate 65-nm node devices by combining light of such shorter wavelength with a lens having an increased NA of 0.9. For the fabrication of next generation 45-nm node devices, the $F_2$ lithography of 157 nm wavelength became a candidate. However, for the reasons that the projection lens uses a large amount of expensive $CaF_2$ single crystal, the scanner thus becomes expensive, hard pellicles are adopted due to the extremely low durability of soft pellicles, the optical system must be accordingly altered, and the etch resistance of resist is low; the development of $F_2$ lithography is abandoned, and the ArF immersion lithography is now under study.

In the photolithography wherein a photoresist layer is exposed through a reticle, the moving stage on which a wafer rests is finely moved in the exposure apparatus in a projection light axis direction, so that the wafer surface may be in register with the best image plane of the projection optical system, that is, so as to enhance focus. Used as a sensor for such focusing is an optical focus detection system of the off-axis illumination type in which an imaging light flux (of non-exposure wavelength) is obliquely projected onto the wafer surface and the reflected light is detected, as disclosed in JP-A S58-113706. The imaging light flux used for this purpose is infrared light, especially near-infrared light, as disclosed in JP-A H02-54103, JP-A H06-29186, JP-A H07-146551, and US 20090208865.

The exposure apparatus using infrared light in the focus detection system suffers from the problem that an exact focus cannot be detected because infrared light is transmitted by a photoresist layer. That is, part of infrared light for focus detection is transmitted by the photoresist layer, the transmitted light is reflected by the substrate surface and enters the detection system along with the light reflected by the wafer top surface. As a result, the accuracy of focus detection is degraded.

The optical auto-focusing is such that the position of the top surface of the wafer is determined by reflecting infrared light on the wafer top surface and detecting the reflected light, after which the wafer is driven so as to fall in register with the imaging plane of the projection lens. Apart from the light reflected by the wafer top surface, there is present light that is transmitted by the resist layer and reflected by the substrate surface. If detection light having a certain band of light intensity distribution enters the detection system, the position measurement value represents the center of the light intensity distribution, leading to the degraded accuracy of focus detection. In general, the substrate has a multilayer structure including patterned metal, dielectric material, insulating material, ceramic material and the like, and the patterned substrate makes reflection of infrared light complex so that focus detection may be difficult. If the accuracy of focus detection is degraded, the projected image becomes vague to detract from the contrast, failing to form a satisfactory photoresist pattern.

To increase the accuracy of optical auto-focusing near infrared light, JP-A H07-146551 proposes the use of a photoresist layer containing a near-infrared absorbing dye. In this case, near-infrared light is not transmitted by the photoresist layer, and no reflected light other than the light reflected by the wafer top surface enters the focus detecting system, and as a result, the accuracy of focus detection is improved. However, since the near-infrared absorbing dye used therein should not be one that absorbs exposure light or degrades the resolution of a photoresist film, it is least amenable to the photolithography using ArF excimer laser. US 20090208865 proposes a method for introducing a near-infrared absorbing dye-containing layer below a photoresist layer, which method can prevent degradation of the resolution of the resist.

One alternative to the optical autofocus technique is a method based on the principle that detects the pressure of air discharged onto the wafer surface, known as Air Gauge Improved Leveling (AGILE™). See Proc. of SPIE Vol. 5754, p. 681 (2005). Albeit excellent accuracy of position measurement, this method takes a long time for measurement and is not accepted in the mass production of semiconductor devices requiring improved throughputs.

It would be desirable to have a method capable of brief accurate auto-focusing in optical lithography.

CITATION LIST

Patent Document 1: JP-A S58-113706
Patent Document 2: JP-A H02-54103
Patent Document 3: JP-A H06-29186
Patent Document 4: JP-A H07-146551
Patent Document 5: US 20090208865
Non-Patent Document 1: Proc. of SPIE Vol. 5754, p. 681 (2005)

DISCLOSURE OF INVENTION

An object of the invention is to provide a material for forming a near-infrared absorptive layer used in optical auto-focusing for enabling high accuracy auto-focusing during an optical lithography process used in semiconductor microfabrication. Another object is to provide a multilayer film comprising a near-infrared absorptive layer of the near-infrared absorptive layer-forming material and a photoresist layer.

The inventors first studied a method of introducing a near-infrared (NIR) absorptive layer underneath a photoresist layer in order to enable high accuracy optical auto-focusing. It is believed that the introduction of a NIR absorptive layer prevents the NIR light (that is transmitted by the photoresist layer) from being reflected from the substrate and entering a focus detection system, thus improving the accuracy of focus detection. It is also believed that this method is fully acceptable in commercial application because the optical focus detection system commonly used in the current semiconductor manufacturing plant can be used without modification, and the time taken for focus detection is as in the prior art.

In order to introduce a NIR absorptive layer, the inventors then attempted to additionally endow the existing antireflective coating for exposure light with a NIR absorption function so that the currently commercially applied wafer multilayer stacking process may be used without modification. One current approach is a trilayer process that uses a trilayer structure including a resist layer, a silicon-containing layer underneath the resist layer, and an underlayer having a high carbon density and high etch resistance, known as organic planarization layer (OPL), underneath the silicon-containing layer wherein the substrate may be processed utilizing an etching selective ratio between the layers and the reflection of exposure light may be prevented by adjusting optical properties of the layers, as disclosed in JP-A 2005-250434, JP-A 2007-171895, and JP-A 2008-65303. The inventors reached a concept of introducing a NIR absorbing dye into the OPL to endow the OPL with a NIR absorption function.

The base resin of OPL should have high etch resistance as well as sufficient optical properties to prevent reflection of exposure light. Also the resin used must undergo crosslinking reaction with the aid of acid or heat so that the OPL may be fully cured, since the OPL should not be impaired upon subsequent deposition of a silicon-containing layer or the like. For example, in the step where a NIR absorbing dye-containing OPL is overlaid with another film by spin coating, if the OPL experiences a loss of its thickness or allows the NIR absorbing dye to be leached out, it becomes impossible to control reflection of exposure light and reflection of NIR light. A problem will also arise in subsequent etching. Therefore, the OPL must have been fully cured so that it is substantially insoluble in a solvent used in forming a multilayer film.

In order to improve the etch resistance of an antireflective coating or underlayer film, aromatic ring-containing polymers are used. On the other hand, in order that a film fully cure and exert resistance to solvents, polymers must have a structure capable of crosslinking reaction with the aid of acid or heat as described in JP-A H06-84789, JP-A 2005-15532, and JP-A 2005-250434. The structure capable of effective crosslinking reaction generally contains a heteroatom and has low etch resistance. If a proportion of aromatic ring incorporated is increased to seek for etch resistance, a proportion of the structure capable of crosslinking reaction incorporated is accordingly reduced, resulting in a film with degraded solvent resistance. Namely, a film encounters a contradictory choice between etch resistance and solvent resistance.

Then the inventors presumed that both etch resistance and solvent resistance might be established when an OPL is formed of a base resin having high etch resistance and overlaid with a thin barrier layer having solvent resistance.

A photoresist material having a fluorinated polymer added thereto is described in JP-A 2007-297590. When a photoresist film is formed by spin coating the photoresist material, the fluorinated polymer segregates at the surface of the film so that the photoresist film may exhibit good barrier performance against water used in the immersion lithography process. Also US 20080008955 describes an antireflective coating (ARC) having a high antireflective ability in which a plurality of polymer components having different optical properties are perpendicularly segregated. With these teachings in mind, the inventors attempted to add a fluorinated polymer to a NIR absorptive film-forming material. When a film is formed of this material, the fluorinated polymer segregates at the film surface so that the polymer layer may function as a barrier layer against solvents. With this approach, a barrier layer can be introduced by the conventional film forming process without a need for additional steps.

Based on these investigations, the inventors prepared a NIR absorptive layer-forming composition comprising (A) a polymer comprising repeat units having at least one of formulae (1) to (4), (B) an aromatic ring-containing polymer, (C) a near-infrared absorbing dye, and (D) a solvent and applied it onto a wafer. The polymer (A) segregates on the surface of the resulting NIR absorptive layer to form a surface layer having improved solvent resistance. The present invention is predicated on this finding.

Accordingly, the present invention provides a NIR absorptive layer-forming composition, and a multilayer film comprising a NIR absorptive layer formed of the composition.

In one aspect, the invention provides a near-infrared absorptive layer-forming composition comprising (A) at least one polymer comprising repeat units of at least one type selected from the general formulae (1) to (4), (B) at least one aromatic ring-containing polymer other than the polymer (A), (C) at least one near-infrared absorbing dye, and (D) at least one solvent.

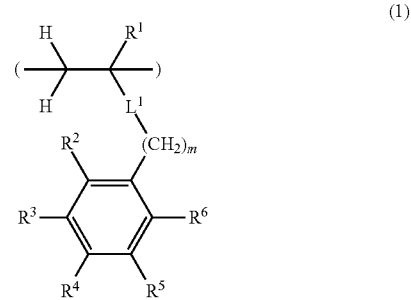

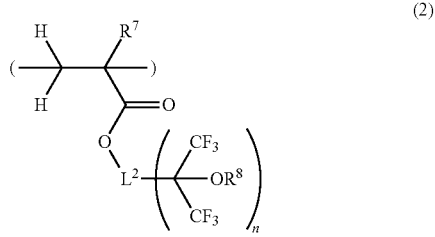

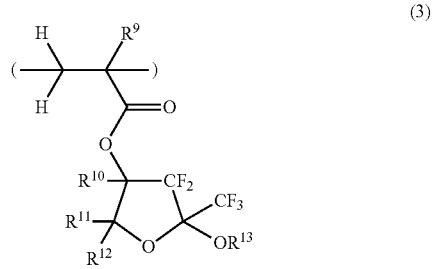

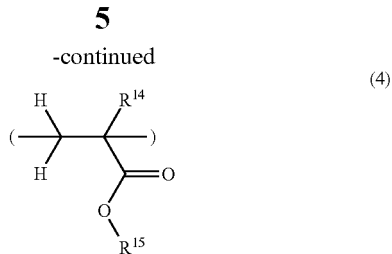

(4)

Herein $R^1$, $R^7$, $R^9$, and $R^{14}$ are each independently hydrogen, methyl, fluorine or trifluoromethyl; $R^2$ to $R^6$ are each independently hydrogen, fluorine, trifluoromethyl, —$C(CF_3)_2$ $OR^{16}$, or a $C_1$-$C_5$ alkyl or alkoxy group in which at least one hydrogen may be substituted by fluorine, at least one of $R^2$ to $R^6$ being fluorine or a fluorinated group; $R^{16}$, $R^8$ and $R^{13}$ are each independently hydrogen or a straight, branched or cyclic, monovalent organic group of 1 to 20 carbon atoms; $L^1$ is a single bond or —C(=O)O—, m is 0 or 1; $L^2$ is a straight, branched or cyclic, di- or trivalent hydrocarbon group of 1 to 15 carbon atoms, n is 1 or 2; $R^{10}$ to $R^{12}$ are each independently hydrogen, hydroxyl, halogen, or a straight, branched or cyclic, monovalent organic group of 1 to 15 carbon atoms, any two or more of $R^{10}$ to $R^{12}$ may bond together to form a ring with the carbon atom to which they are attached; and $R^{15}$ is a $C_2$-$C_{15}$ hydrocarbon group in which at least one hydrogen is substituted by fluorine.

In a preferred embodiment, the polymer (A) accounts for at least 2% by weight of the overall polymers. Preferably, the polymer (A) may further comprise repeat units of at least one type capable of undergoing crosslinking reaction with the aid of heat or acid. Preferably, the polymer (B) comprises repeat units of at least one type capable of undergoing crosslinking reaction with the aid of heat or acid. Typically the repeat units capable of undergoing crosslinking reaction with the aid of heat or acid have an oxirane structure and/or oxetane structure. In a preferred embodiment, the near-infrared absorbing dye (C) comprises at least one cyanine dye capable of absorbing radiation in a wavelength range of 500 to 1,200 nm. The composition may further comprise an acid generator, a crosslinker, and/or a surfactant.

In another aspect, the invention provides a multilayer film comprising a near-infrared absorptive layer which is formed by coating the near-infrared absorptive layer-forming composition defined above, and a photoresist layer which is formed on the near-infrared absorptive layer by coating a photoresist composition. In a preferred embodiment, the multilayer film further comprises a silicon-containing layer disposed beneath the photoresist layer, the near-infrared absorptive layer being disposed beneath the silicon-containing layer.

In a preferred embodiment, the near-infrared absorptive layer functions as a layer for absorbing near-infrared radiation used in optical auto-focusing. In another preferred embodiment, the near-infrared absorptive layer functions as an antireflective coating for preventing reflection of exposure radiation used in resist pattern formation.

ADVANTAGEOUS EFFECTS OF INVENTION

By coating a NIR absorptive layer-forming composition according to the invention, a NIR absorptive layer having improved solvent resistance can be formed. When a multilayer film comprising the NIR absorptive layer and a photoresist layer is used in optical lithography, the detection accuracy of the currently employed optical auto-focusing method is improved. This allows the optical lithography to produce a definite projection image with an improved contrast, succeeding in forming a better photoresist pattern.

DESCRIPTION OF EMBODIMENTS

Figure 1:
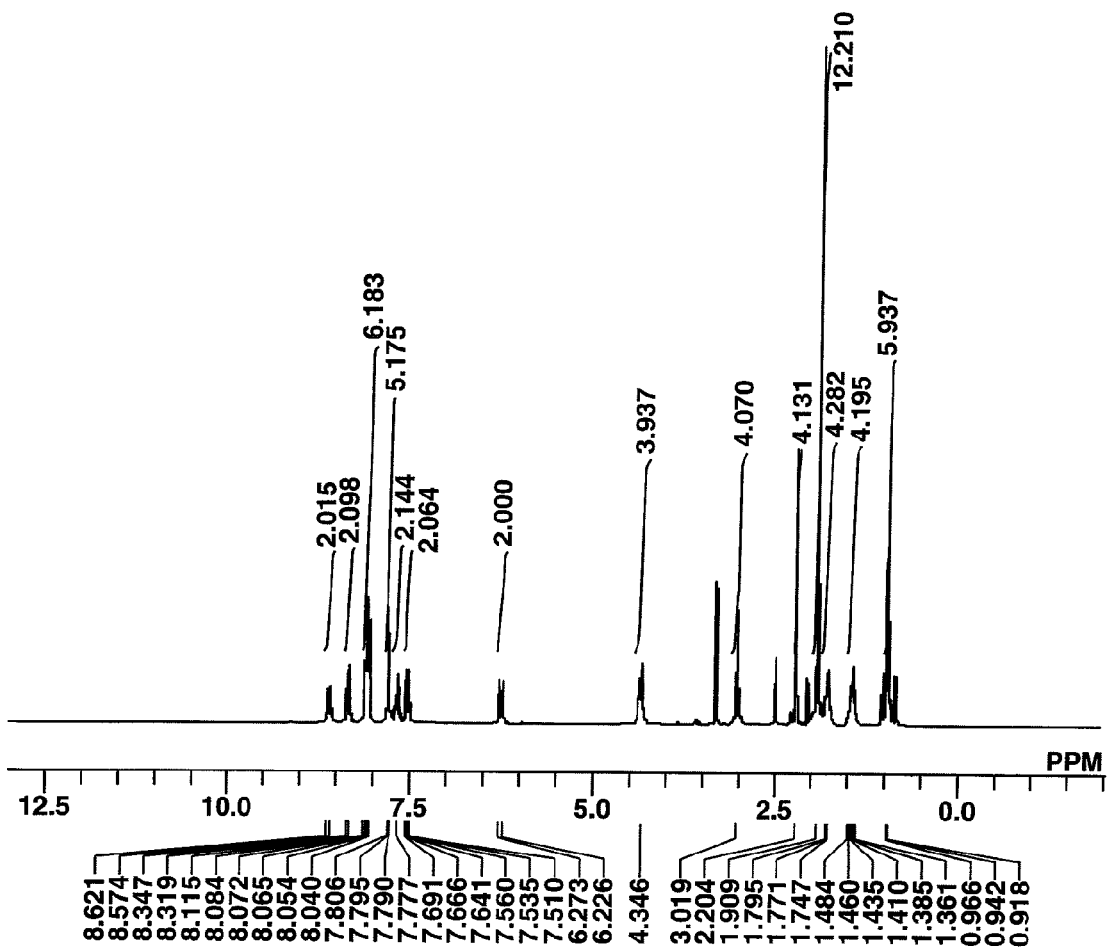
FIG. 1 is a $^1$H-NMR/DMSO-$d_6$ spectrum of NIR absorbing dye C2 in Synthesis Example 12.

The terms "a" and "an" herein do not denote a limitation of quantity, but rather denote the presence of at least one of the referenced item. As used herein, the notation ($C_n$-$C_m$) means a group containing from n to m carbon atoms per group. As used herein, the term "layer" is used interchangeably with "film" or "coating."

The abbreviations and acronyms have the following meaning.

NIR: near infrared radiation
OPL: organic planarization layer
Mw: weight average molecular weight
Mn: number average molecular weight
Mw/Mn: molecular weight distribution or dispersity
GPC: gel permeation chromatography
PGMEA: propylene glycol monomethyl ether acetate The NIR absorptive layer-forming composition of the invention is defined as comprising (A) at least one polymer comprising repeat units of at least one type selected from formulae (1) to (4), (B) at least one aromatic ring-containing polymer other than the polymer (A), (C) at least one NIR absorbing dye, and (D) at least one solvent. When the composition is coated onto a wafer to form a NIR absorptive film, the polymer (A) segregates on the surface of the resulting NIR absorptive film to form a barrier layer. This barrier layer prevents any film components from being eluted in an organic solvent. As a result, the film has improved solvent resistance.

Components (A) to (D) are described below in detail.

A) Polymer

Component (A) is a polymer comprising repeat units of at least one type selected from the general formulae (1) to (4).

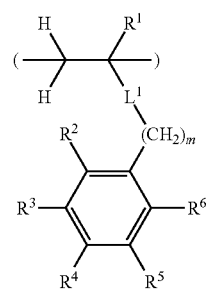

(1)

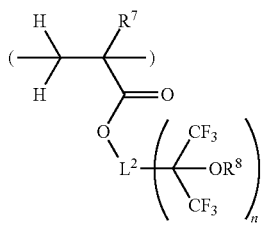

(2)

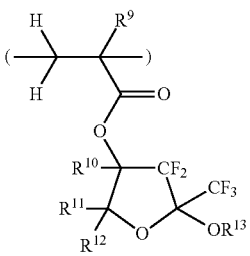

(3)

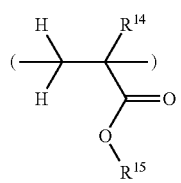

(4)

Herein $R^1$, $R^7$, $R^9$, and $R^{14}$ are each independently hydrogen, methyl, fluorine or trifluoromethyl.

$R^2$ to $R^6$ are each independently hydrogen, fluorine, trifluoromethyl, —C(CF$_3$)$_2$OR$^{16}$, or a C$_1$-C$_5$ alkyl or alkoxy group in which at least one hydrogen may be substituted by fluorine, at least one of $R^2$ to $R^6$ being fluorine or a fluorinated group. When $R^2$ to $R^6$ are a C$_1$-C$_5$ alkoxy group in which at least one hydrogen may be substituted by fluorine, suitable alkoxy groups include methoxy, ethoxy, n-propyloxy, isopropyloxy, cyclopentyloxy, n-butoxy, sec-butoxy, tert-butoxy, cyclobutoxy, n-pentyloxy, and cyclopentyloxy, in which some or all hydrogen atoms may be substituted by fluorine atoms.

$R^{16}$, $R^8$ and $R^{13}$ are each independently hydrogen or a straight, branched or cyclic, monovalent organic group of 1 to 20 carbon atoms. As the monovalent organic group, protective groups for hydroxyl may be used. Typical organic groups are monovalent hydrocarbon groups such as methyl, ethyl, propyl, isopropyl, n-butyl, sec-butyl, tert-butyl, tert-amyl, n-pentyl, n-hexyl, n-heptyl, n-octyl, n-nonyl, n-decyl, eicosanyl, cyclopropyl, cyclobutyl, cyclopentyl, cyclopentylmethyl, cyclopentylethyl, cyclopentylbutyl, cyclohexyl, cyclohexylmethyl, cyclohexylethyl, cyclohexylbutyl, methylcyclohexylmethyl, ethylcyclohexylmethyl, ethylcyclohexylethyl, and bicyclo[2.2.1]heptyl. In these monovalent hydrocarbon groups, some hydrogen may be substituted by halogen or any moiety —CH$_2$— may be replaced by —O— or —C(=O)—.

Also included are groups of the general formulae (R1-1) and (R1-2) shown below, tertiary alkyl groups of 4 to 20 carbon atoms, preferably 4 to 15 carbon atoms, trialkylsilyl groups in which each alkyl moiety has 1 to 5 carbon atoms, oxoalkyl groups of 4 to 20 carbon atoms, preferably 4 to 15 carbon atoms, and acyl groups of 1 to 10 carbon atoms.

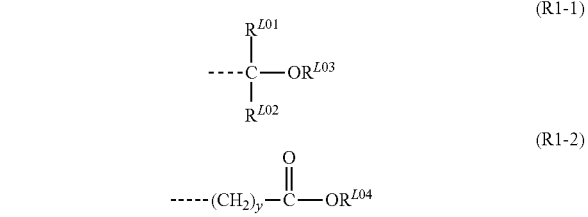

(R1-1)

(R1-2)

It is noted that the broken line denotes a valence bond herein and throughout the specification. In formula (R1-1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples of the substituted alkyl groups are shown below.

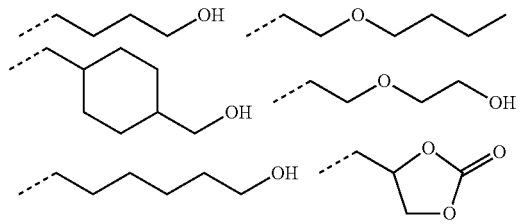

A pair of $R^{L01}$ and $R^{L02}$, $R^{L01}$ and $R^{L03}$, or $R^{L02}$ and $R^{L03}$ may bond together to form a ring with the carbon and oxygen atom to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (R1-2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (R1-1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Exemplary acyl groups include formyl, acetyl, ethylcarbonyl, pivaloyl, methoxycarbonyl, ethoxycarbonyl, tert-butoxycarbonyl, trifluoroacetyl, and trichloroacetyl. The subscript y is an integer of 0 to 6.

Of the protective groups of formula (R1-1), the straight and branched ones are exemplified by the following groups.

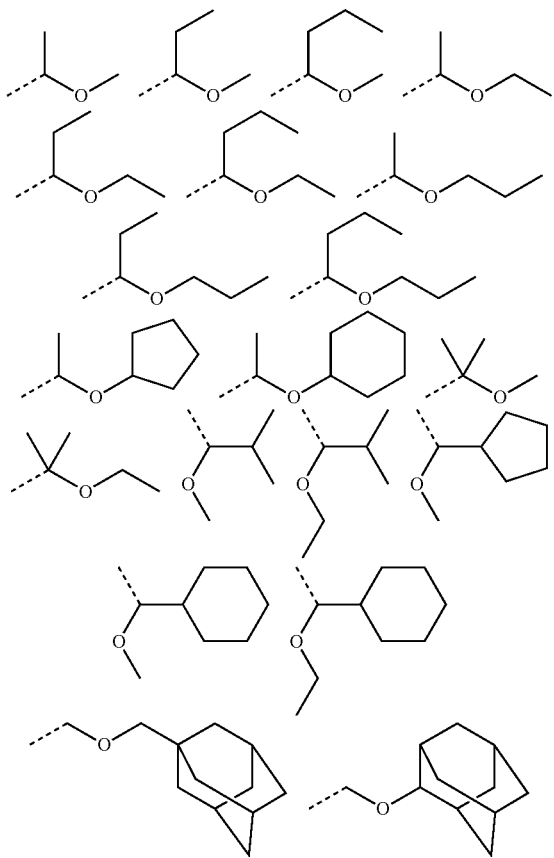

Of the protective groups of formula (R1-1), the cyclic ones are, for example, tetrahydrofuran-2-yl, 2-methyltetrahydrofuran-2-yl, tetrahydropyran-2-yl, and 2-methyltetrahydropyran-2-yl.

Examples of the protective groups of formula (R1-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

In formula (1), $L^2$ is a single bond or —C(=O)O—, and m is 0 or 1.

In formula (2), $L^2$ is a straight, branched or cyclic, di- or trivalent hydrocarbon group of 1 to 15 carbon atoms. Exemplary groups include hydrocarbons such as methane, ethane, propane, n-butane, n-pentane, n-hexane, n-heptane, n-octane, n-nonane, n-decane, 2-methylpropane, 2-methylbutane, 2,2-dimethylpropane, 2-methylpentane, 2-methylhexane, 2-methylheptane, cyclopentane, cyclohexane, methylcyclopentane, methylcyclohexane, ethylcyclopentane, methylcycloheptane, ethylcyclohexane, 1-methyladamantane, 2-methyladamantane, 1-ethyladamantane, and 2-ethyladamantane, with two or three hydrogen being eliminated. The subscript n is 1 or 2.

In formula (3), $R^{10}$ to $R^{12}$ are each independently hydrogen, hydroxyl, halogen, or a straight, branched or cyclic, monovalent organic group of 1 to 15 carbon atoms. Any two or more of $R^{10}$ to $R^{12}$ may bond together to form a ring with the carbon atom to which they are attached. Examples of the straight, branched or cyclic, monovalent organic group of 1 to 15 carbon atoms include monovalent hydrocarbon groups, for example, straight, branched or cyclic alkyl groups such as methyl, ethyl, propyl, isopropyl, n-butyl, sec-butyl, tert-butyl, tert-amyl, n-pentyl, n-hexyl, n-heptyl, n-octyl, n-nonyl, n-decyl, cyclopropyl, cyclobutyl, cyclopentyl, cyclopentylmethyl, cyclopentylethyl, cyclopentylbutyl, cyclohexyl, cyclohexylmethyl, cyclohexylethyl, cyclohexylbutyl, methylcyclohexylmethyl, ethylcyclohexylmethyl, ethylcyclohexylethyl, bicyclo[2.2.1]heptyl, bicyclo[2.2.1]heptylmethyl, bicyclo[2.2.1]heptylethyl, bicyclo[2.2.1]heptylbutyl, methylbicyclo[2.2.1]heptylmethyl, ethylbicyclo[2.2.1]heptylmethyl, ethylbicyclo[2.2.1]heptylethyl, bicyclo[2.2.2]octyl, bicyclo[2.2.2]octylmethyl, bicyclo[2.2.2]octylethyl, bicyclo[2.2.2]octylbutyl, methylbicyclo[2.2.2]octylmethyl, ethylbicyclo[2.2.2]octylmethyl, ethylbicyclo[2.2.2]octylethyl, tricyclo[5.2.1.0$^{2,6}$]decyl, tricyclo[5.2.1.0$^{2,6}$]decylmethyl, tricyclo[5.2.1.0$^{2,6}$]decylethyl, tricyclo[5.2.1.0$^{2,6}$]decylbutyl, methyltricyclo[5.2.1.0$^{2,6}$]decylmethyl, ethyltricyclo[5.2.1.0$^{2,6}$]decylmethyl, ethyltricyclo[5.2.1.0$^{2,6}$]decylethyl, adamantyl, adamantylmethyl, adamantylethyl, adamantylbutyl, methyladamantylmethyl, ethyladamantylmethyl, ethyladamantylethyl, tetracyclo[4.4.0.1$^{2,5}$.1$^{7,10}$]dodecyl, tetracyclo[4.4.0.1$^{2,5}$.1$^{7,10}$]dodecylmethyl, tetracyclo[4.4.0.1$^{2,5}$.1$^{7,10}$]dodecylethyl, tetracyclo[4.4.0.1$^{2,5}$.1$^{7,10}$]dodecylbutyl, tetracyclo[4.4.0.1$^{2,5}$.1$^{7,10}$]dodecylmethyl, ethyltetracyclo[4.4.0.1$^{2,5}$.1$^{7,10}$]dodecylmethyl, and ethyltetracyclo[4.4.0.1$^{2,5}$.1$^{7,10}$]dodecylethyl, aryl groups such as phenyl, methylphenyl, naphthyl, anthryl, and phenanthryl, and aralkyl groups such as benzyl, diphenylmethyl and phenethyl; alkoxy groups such as methoxy, ethoxy and propoxy, and acyloxy groups such as formyloxy and acetoxy, and substituted forms of the foregoing groups in which some hydrogen atoms are substituted by halogen atoms, alkyl, aryl, alkoxy, alkoxycarbonyl, oxo, alkoxyalkyl, acyloxy, acyloxyalkyl, alkoxyalkoxy or other groups.

At least two of $R^{10}$ to $R^{12}$ in any combination may bond together to form a ring with the carbon atom(s) to which they are attached. A typical ring-forming combination is a pair of $R^{10}$ and $R^{11}$, a pair of $R^{10}$ and $R^{11}$, or a pair of $R^{11}$ and $R^{12}$. Exemplary rings thus formed are alicyclic hydrocarbons of 3 to 12 carbon atoms such as cyclopropane, cyclobutane, cyclopentane, cyclohexane, bicyclo[2.2.1]heptane, bicyclo[2.2.2]octane, tricyclo[5.2.1.0$^{2,6}$]decane, adamantane, and tetracyclo[4.4.0.1$^{2,5}$.1$^{7,10}$]dodecane, and fused rings containing at least one of the foregoing. Also included are substituted forms of the foregoing alicyclic hydrocarbons in which some hydrogen atoms are replaced by halogen atoms, hydroxyl, alkyl, aryl, alkoxy, alkoxycarbonyl, oxo, alkoxyalkyl, acyloxy, acyloxyalkyl, alkoxyalkoxy or other groups.

In formula (4), $R^{15}$ is a $C_2$-$C_{15}$ hydrocarbon group in which at least one hydrogen is substituted by fluorine. Exemplary groups include ethyl, propyl, isopropyl, n-butyl, sec-butyl, tert-butyl, tert-amyl, n-pentyl, n-hexyl, n-heptyl, n-octyl, n-nonyl, n-decyl, cyclopropyl, cyclobutyl, cyclopentyl, cyclopentylmethyl, cyclopentylethyl, cyclopentylbutyl, cyclohexyl, cyclohexylmethyl, cyclohexylethyl, cyclohexylbutyl, methylcyclohexylmethyl, ethylcyclohexylmethyl, ethylcyclohexylethyl, bicyclo[2.2.1]heptyl, and adamantyl, in which some or all hydrogen atoms are substituted by fluorine.
Illustrative examples of the repeat units having formula (1) are given below, but not limited thereto.
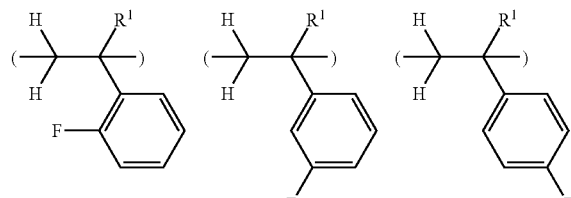
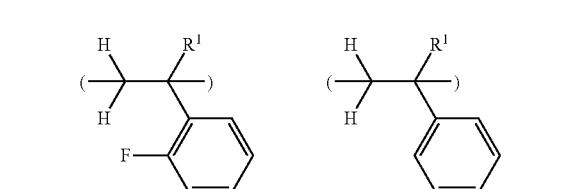
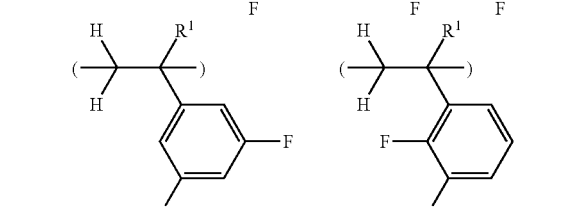
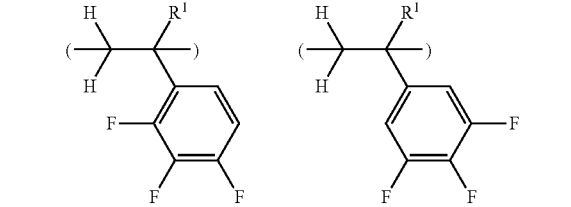
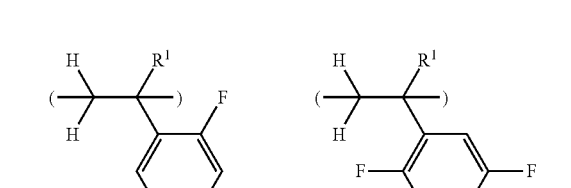
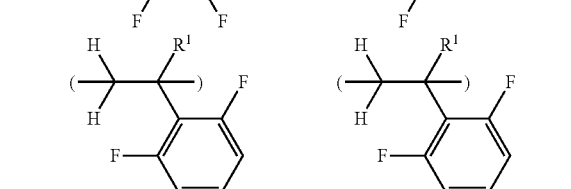
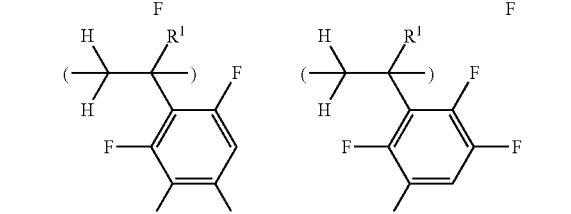
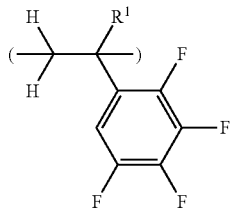
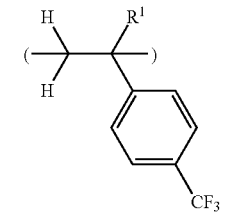
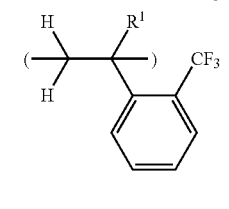
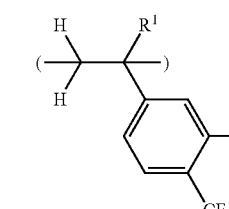
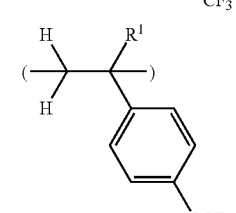
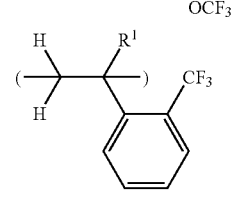
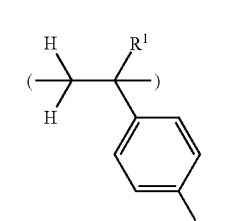
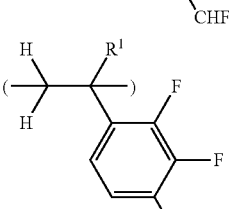
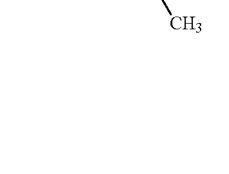
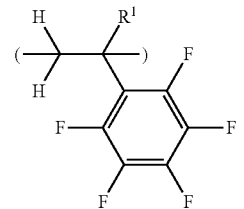
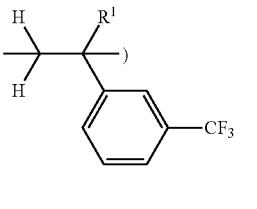
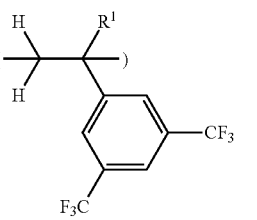
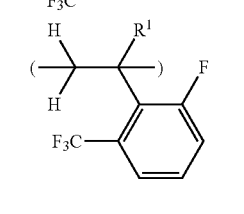
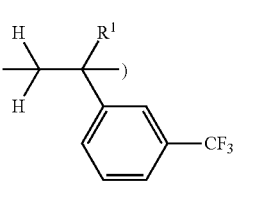
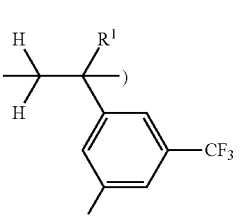
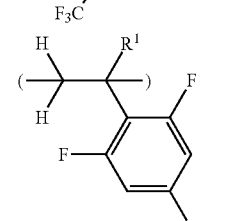
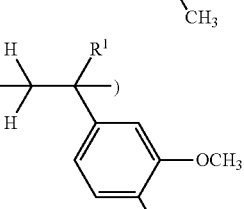
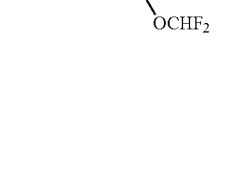

-continued
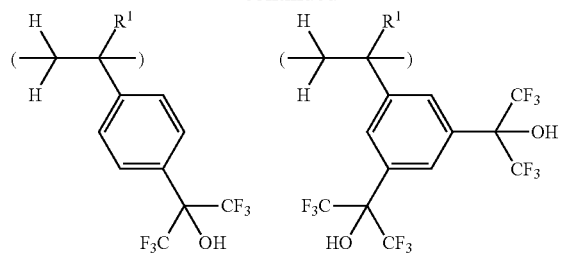
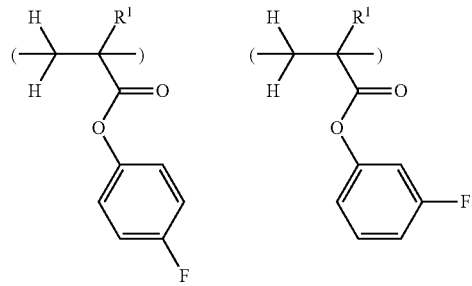
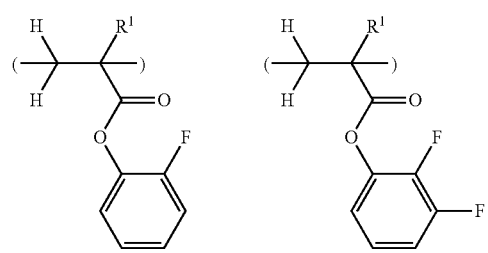
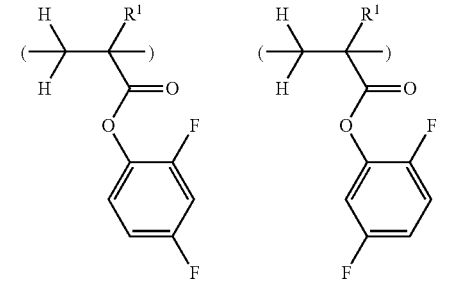
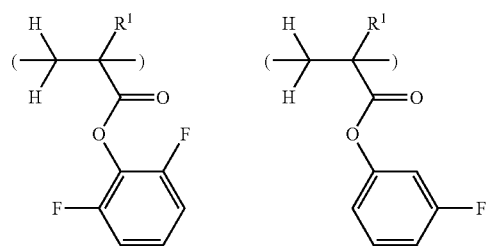
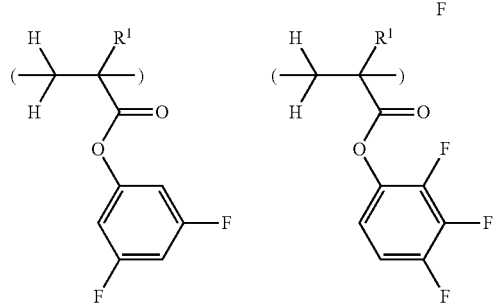
-continued
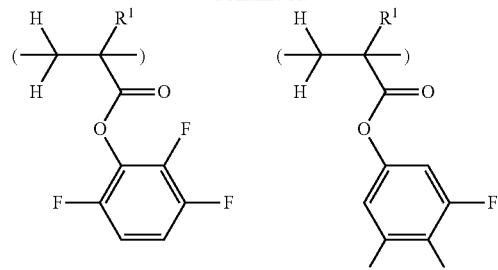
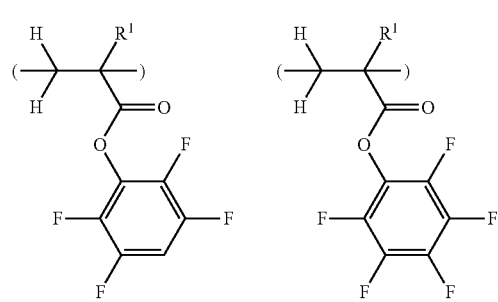
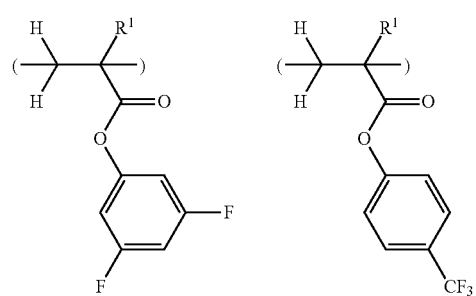
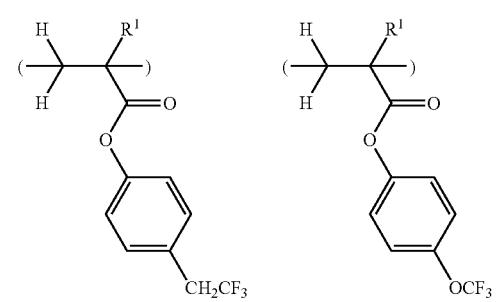
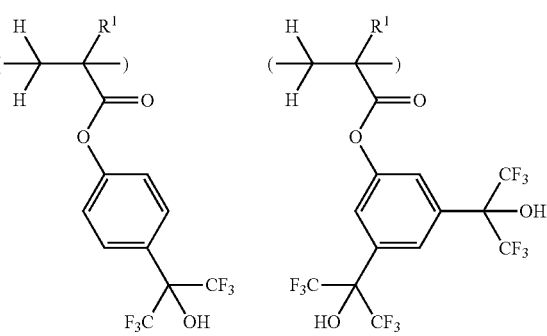

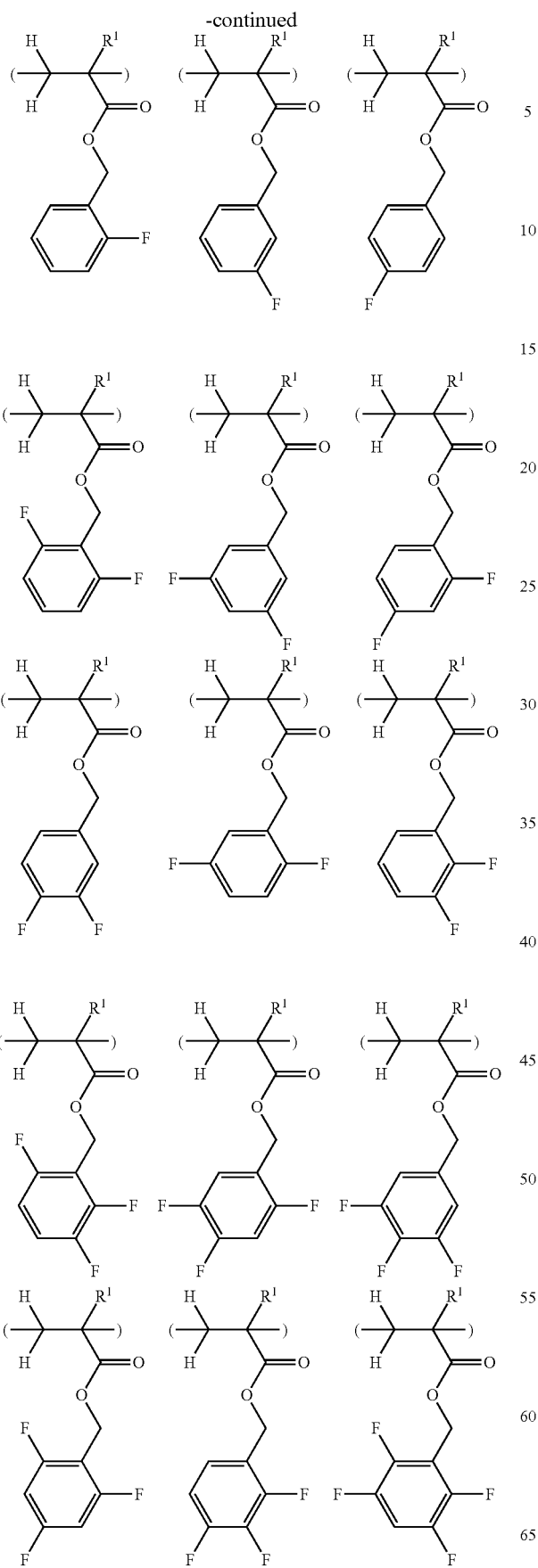
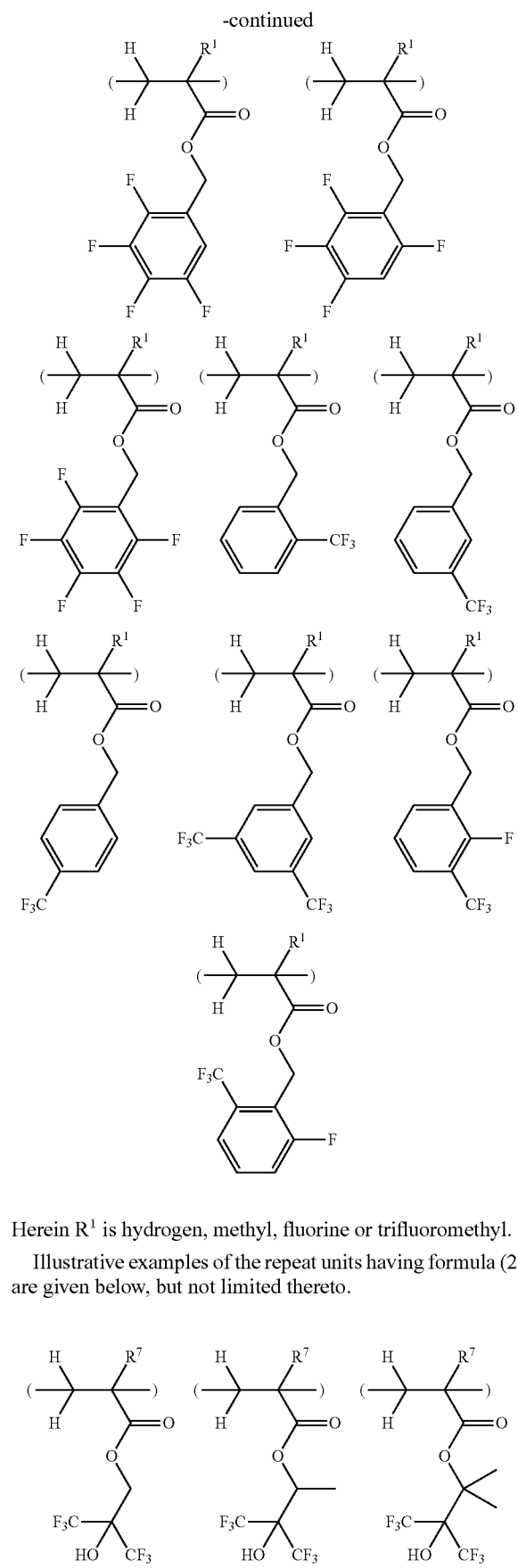
Herein R¹ is hydrogen, methyl, fluorine or trifluoromethyl.
Illustrative examples of the repeat units having formula (2) are given below, but not limited thereto.
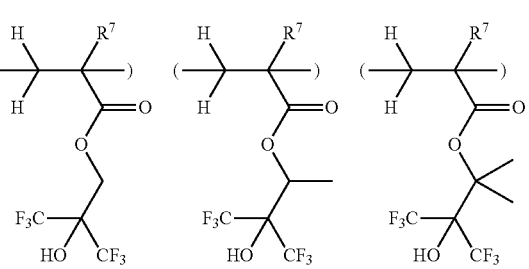

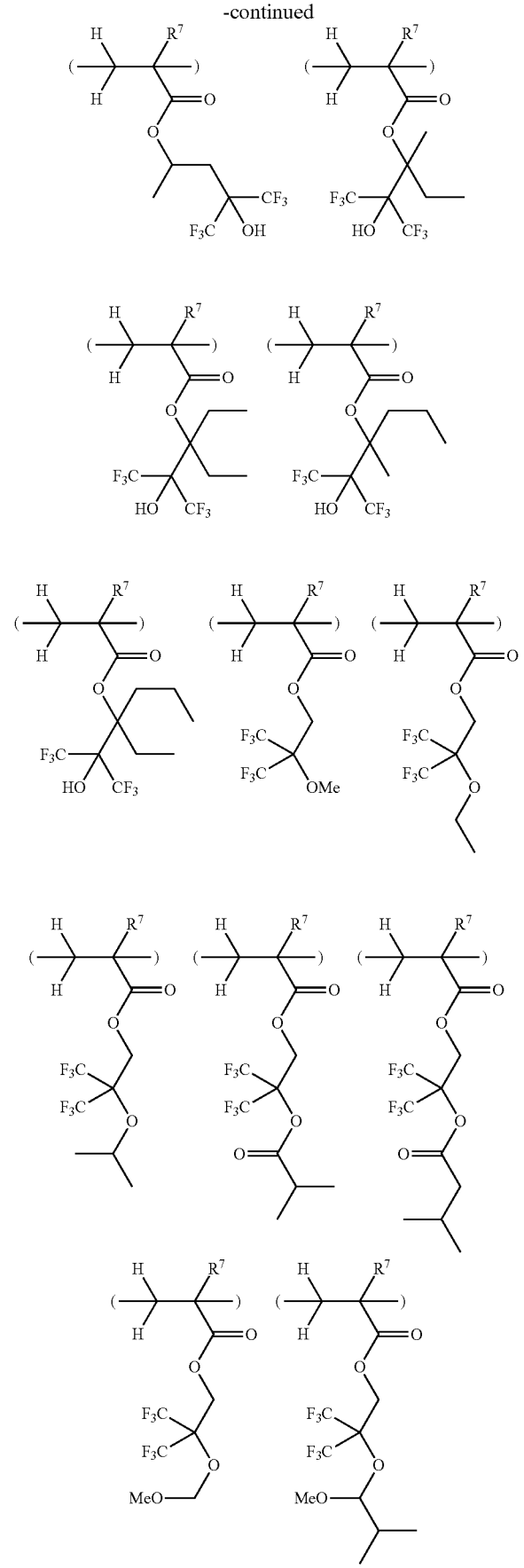

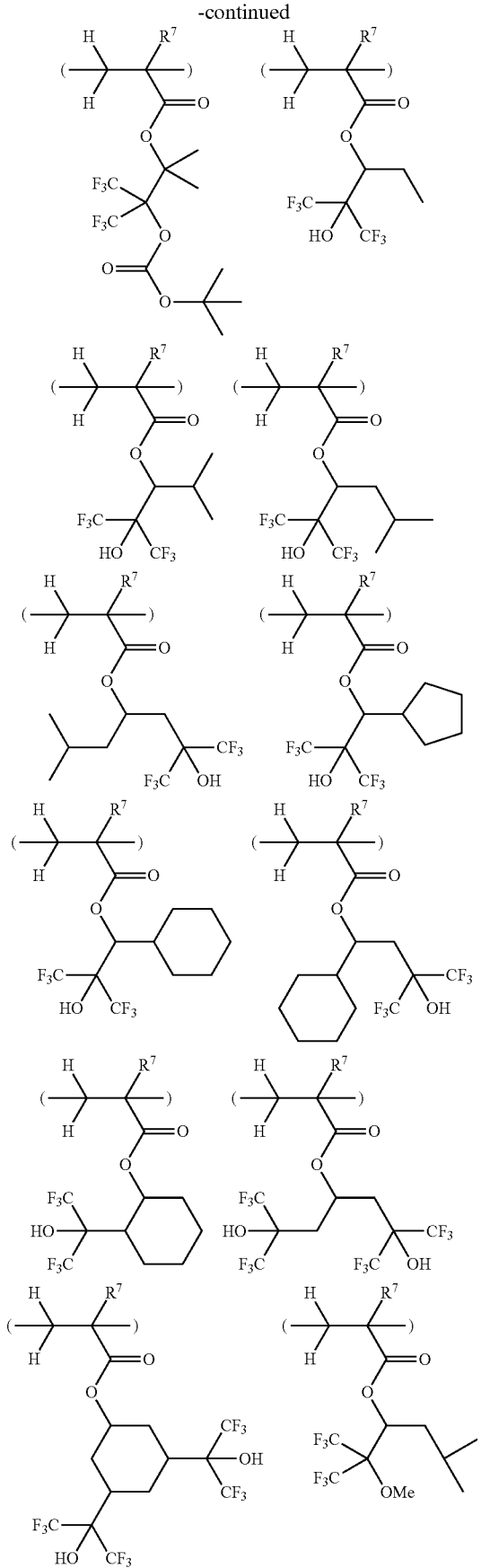
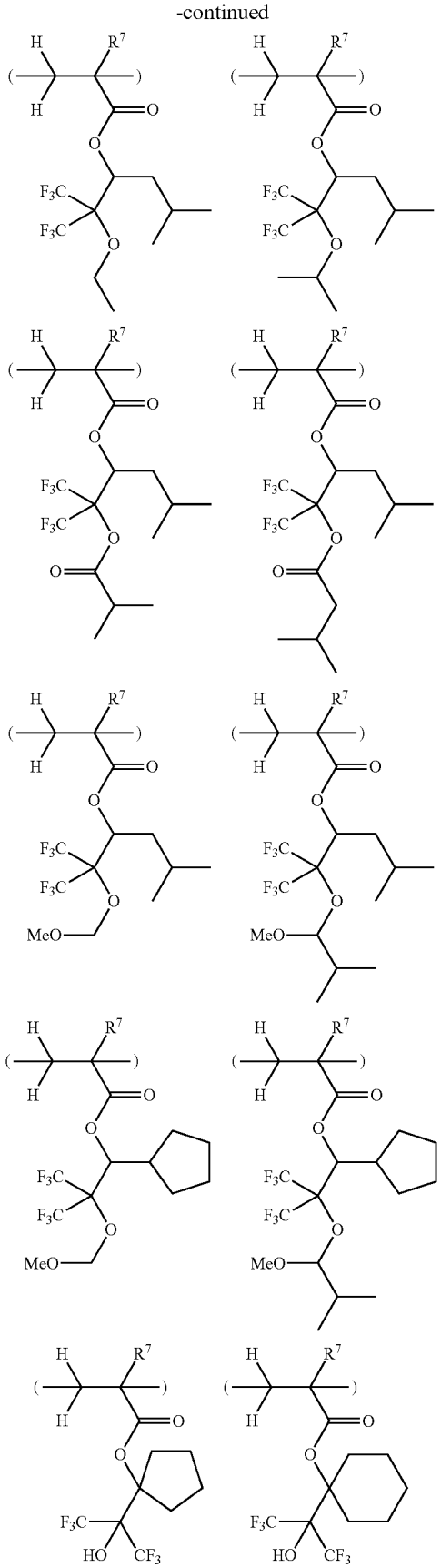

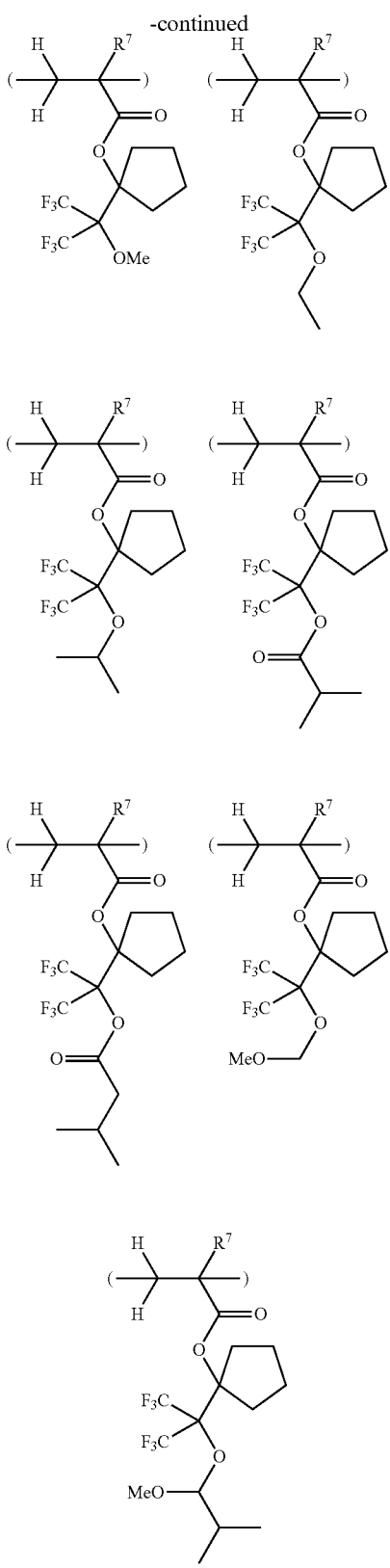
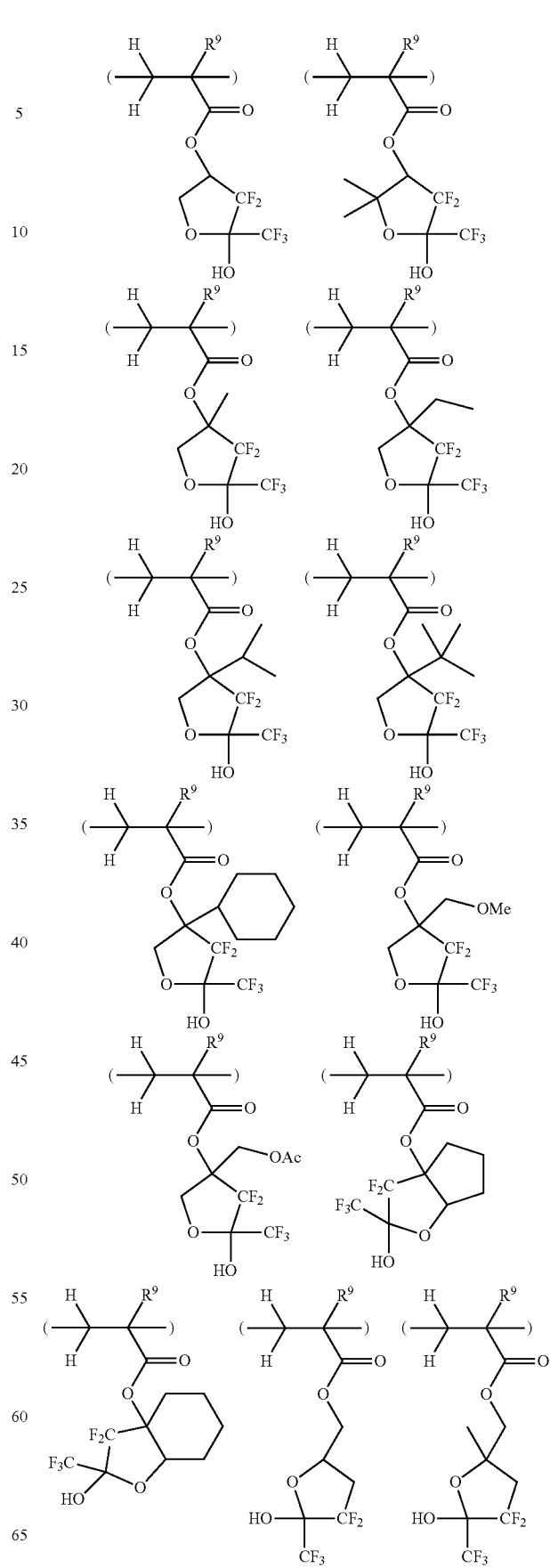
Herein R⁷ is hydrogen, methyl, fluorine or trifluoromethyl, and Me stands for methyl.
Illustrative examples of the repeat units having formula (3) are given below, but not limited thereto.

-continued
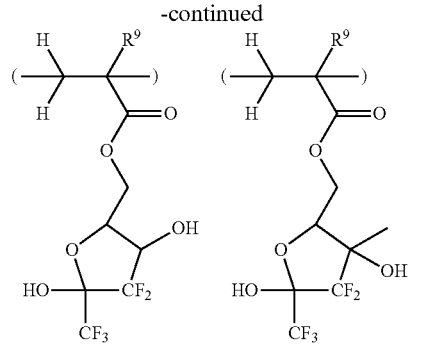
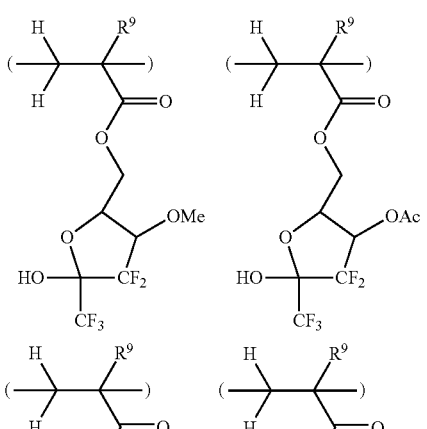
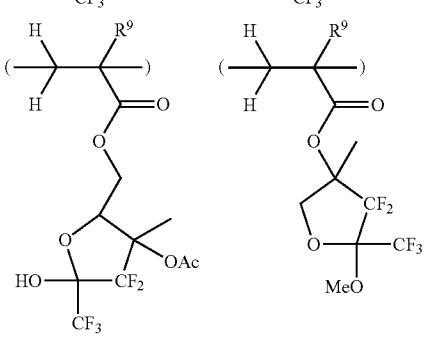
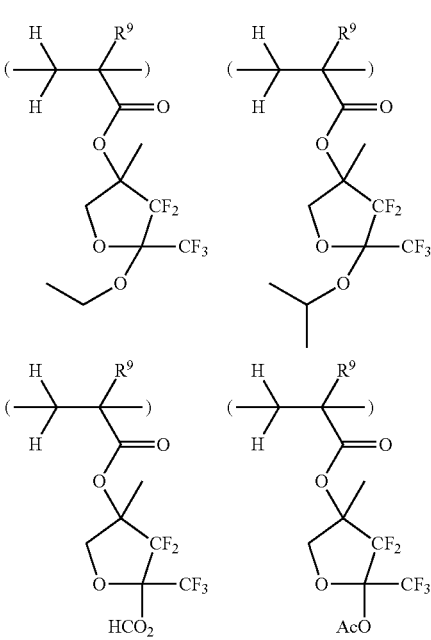
-continued
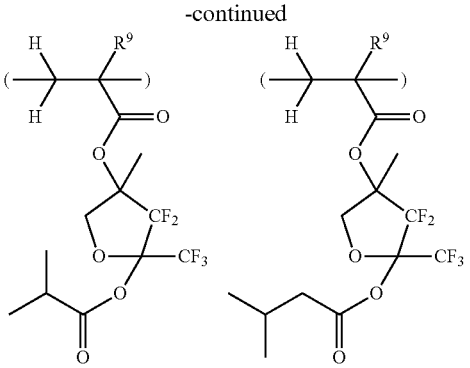
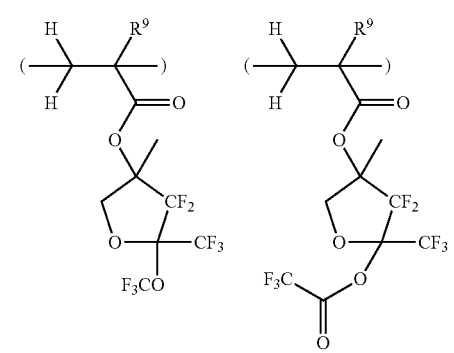
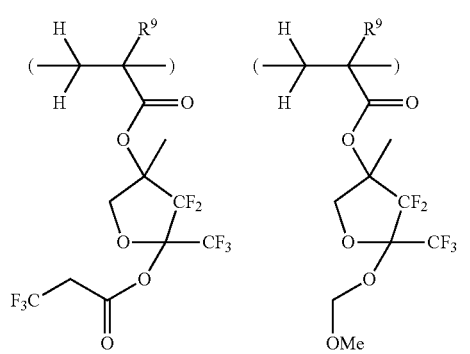
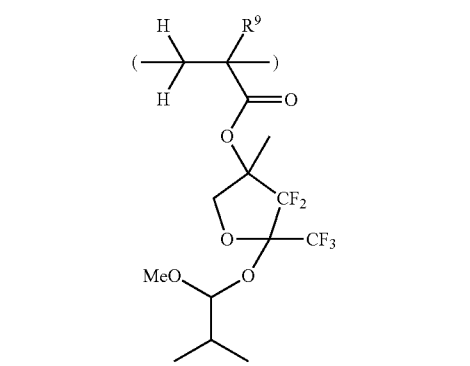
Herein $R^9$ is hydrogen, methyl, fluorine or trifluoromethyl, Me stands for methyl, and Ac stands for acetyl.
Illustrative examples of the repeat units having formula (4) are given below, but not limited thereto.

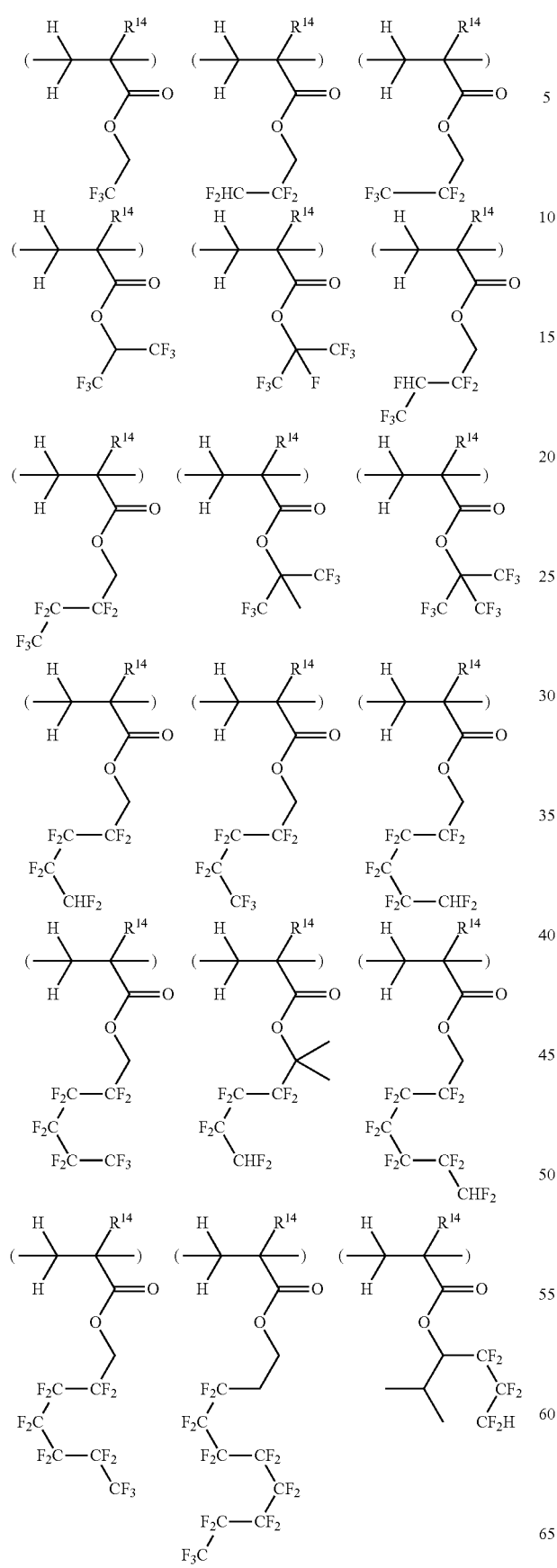

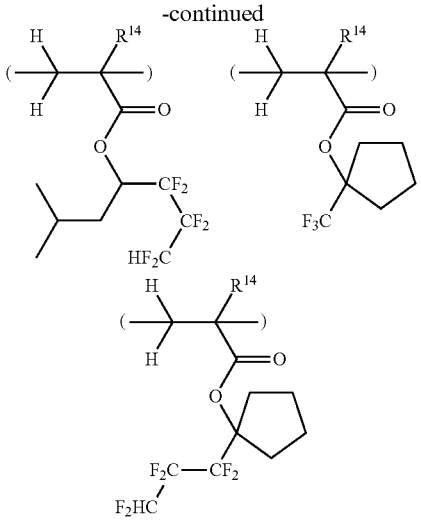

Herein $R^{14}$ is hydrogen, methyl, fluorine or trifluoromethyl.

Preferably the polymer as component (A) further comprises repeat units of at least one type which undergo crosslinking reaction with the aid of heat or acid, for example, repeat units of at least one type containing a hydroxyl group, carboxyl group, or cyclic ether structure such as oxirane or oxetane. The polymer becomes more effectively curable and thus forms a hard, dense barrier layer at the surface of a NIR absorptive film, exhibiting higher solvent resistance. Among the repeat units capable of crosslinking reaction, oxirane and/or oxetane structure-bearing repeat units are most preferred because they have high crosslinking reactivity with the aid of heat or acid and enable to form a hard, dense barrier layer.

Examples of the repeat units capable of crosslinking reaction with the aid of heat or acid are given below, but not limited thereto.

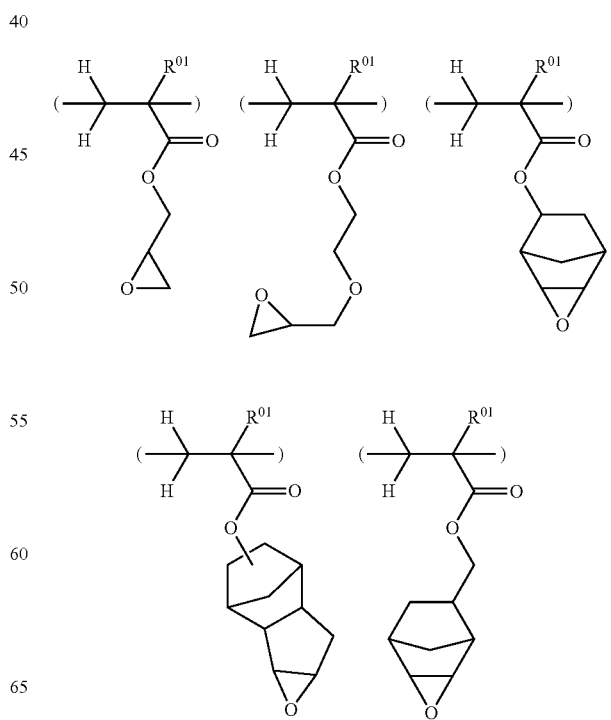

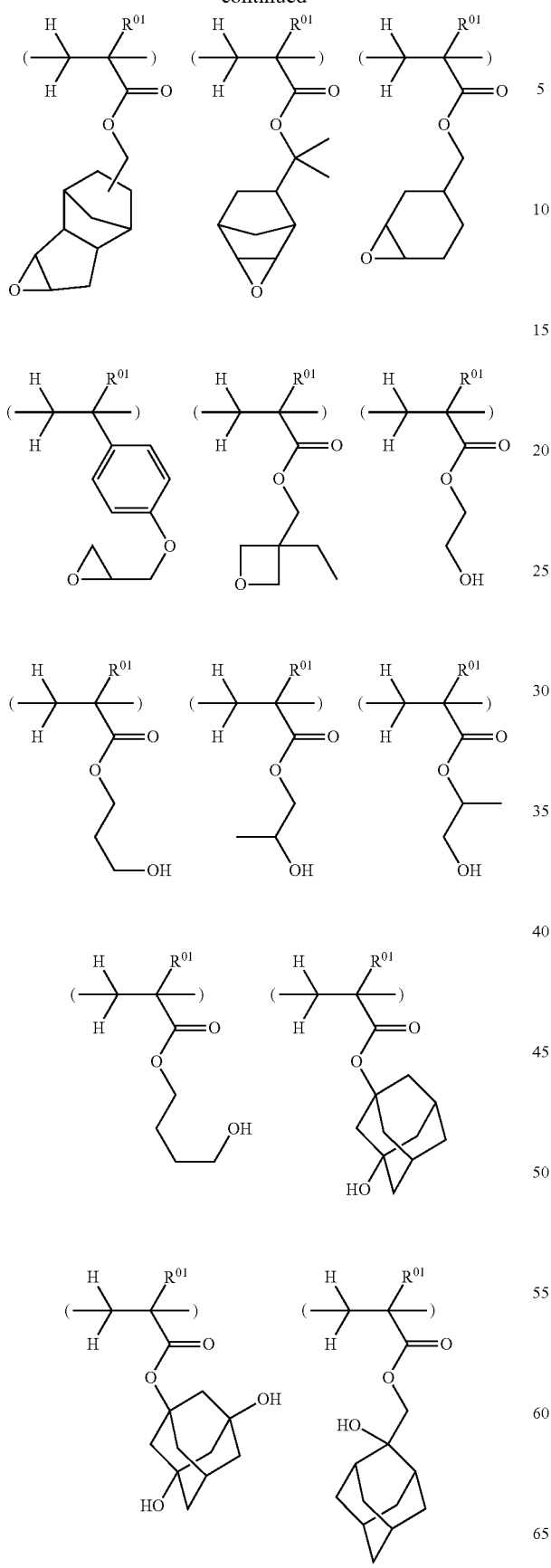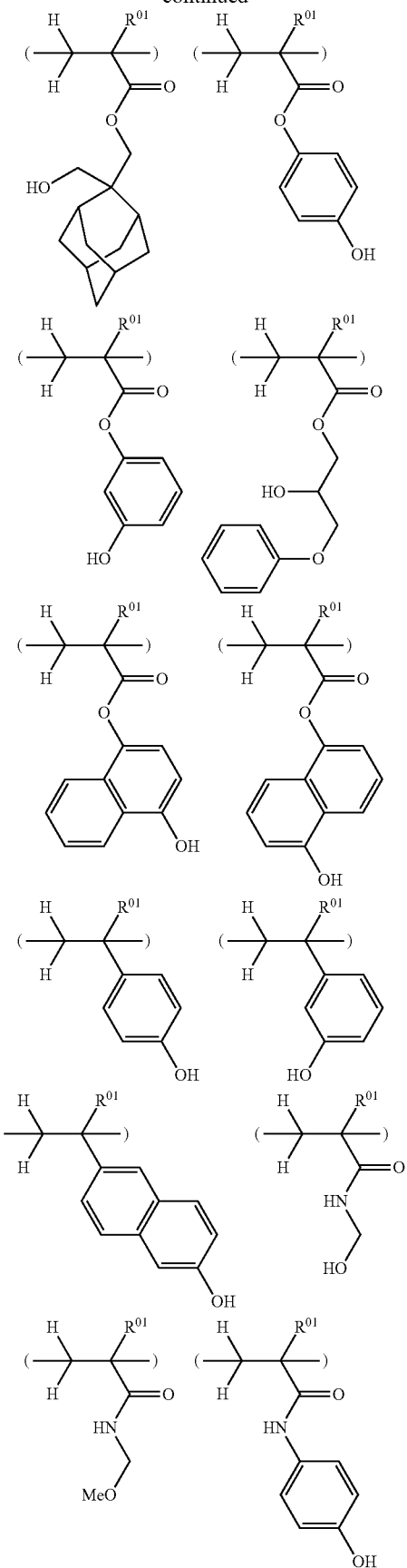

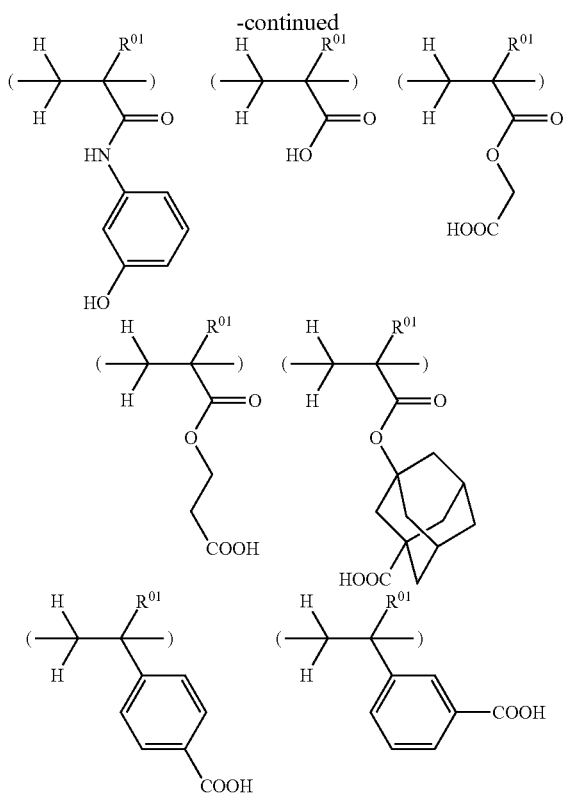

Herein $R^{01}$ is hydrogen, methyl, fluorine, hydroxymethyl or trifluoromethyl, and Me stands for methyl.

In a preferred embodiment, repeat units derived from a monomer having a carbon-carbon double bond other than the foregoing may be incorporated into the polymer (A) for the purpose of imparting etch resistance or for imparting solubility in the solvent (D) in the NIR absorptive layer-forming composition. Suitable monomers from which these repeat units are derived include (meth)acrylates such as methyl (meth)acrylate, cyclohexyl(meth)acrylate, 2-norbornyl (meth)acrylate, isobornyl(meth)acrylate, 1-adamantyl(meth) acrylate, phenyl(meth)acrylate, benzyl(meth)acrylate, 1-naphthyl(meth)acrylate, 2-naphthyl(meth)acrylate, and 9-anthranylmethyl(meth)acrylate; and aromatic ring-bearing monomers such as styrene, 2-methylstyrene, 3-methylstyrene, 4-methylstyrene, 3-vinylanisole, 4-vinylanisole, 4-t-butoxystyrene, 4-t-amyloxystyrene, 4-(1-ethoxyethoxy)styrene, 4-acetyloxystyrene, 4-t-butoxycarbonylstyrene, 2-vinylpyridine, 4-vinylpyridine, 1-vinylnaphthalene, 2-vinylnaphthalene, 9-vinylcarbazole, 9-vinylanthracene, indene, indole, methyleneindane, and acenaphthylene.

The polymer (A) may comprise individual repeat units in a preferred compositional proportion range as shown below, but is not limited thereto. Specifically, the polymer may preferably comprise:

8 to 90 mol %, more preferably 10 to 85 mol %, and even more preferably 15 to 80 mol % of repeat units of formulae (1) to (4), 8 to 90 mol %, more preferably 10 to 85 mol %, and even more preferably 15 to 80 mol %, in total, of repeat units capable of heat or acid-induced crosslinking reaction, and 0 to 40 mol %, more preferably 1 to 35 mol %, and even more preferably 3 to 30 mol %, in total, of other repeat units, provided that these units total to 100 mol %.

Monomers from which repeat units of formulae (1) to (4) are derived are commercially available. They may also be prepared using any well-known organic chemistry procedure. Specifically, some monomers from which repeat units of formula (2) are derived may be prepared by the method described in JP-A 2007-204385, and monomers from which repeat units of formula (3) are derived may be prepared by the method described in JP-A 2006-152255.

Likewise, monomers from which repeat units capable of heat or acid-induced crosslinking reaction are derived and monomers from which other repeat units are derived are commercially available. They may also be prepared using any well-known organic chemistry procedure.

The polymerization reaction to produce the polymer (A) may be any of well-known polymerization reactions, but preferably radical polymerization.

For radical polymerization, preferred reaction conditions include (1) a solvent selected from hydrocarbon solvents such as benzene, toluene and xylene, glycol solvents such as propylene glycol monomethyl ether and PGMEA, ether solvents such as diethyl ether, diisopropyl ether, dibutyl ether, tetrahydrofuran, and 1,4-dioxane, ketone solvents such as acetone, methyl ethyl ketone, methyl isobutyl ketone and methyl amyl ketone, ester solvents such as ethyl acetate, propyl acetate, butyl acetate and ethyl lactate, lactone solvents such as γ-butyrolactone, and alcohol solvents such as ethanol and isopropyl alcohol; (2) a polymerization initiator selected from well-known radical polymerization initiators including azo compounds such as 2,2'-azobisisobutyronitrile (AIBN), 2,2'-azobis-2-methylisobutyronitrile, dimethyl 2,2'-azobisisobutyrate (MAIB), 2,2'-azobis-2,4-dimethylvaleronitrile, 1,1'-azobis(cyclohexane-1-carbonitrile), and 4,4'-azobis(4-cyanovaleric acid), and peroxides such as lauroyl peroxide and benzoyl peroxide; (3) a radical chain transfer agent, if necessary for molecular weight control, selected from thiol compounds including 1-butanethiol, 2-butanethiol, 2-methyl-1-propanethiol, 1-octanethiol, 1-decanethiol, 1-tetradecanethiol, cyclohexanethiol, 2-mercaptoethanol, 1-mercapto-2-propanol, 3-mercapto-1-propanol, 4-mercapto-1-butanol, 6-mercapto-1-hexanol, 1-thioglycerol, thioglycolic acid, 3-mercaptopropionic acid, and thiolactic acid; (4) a reaction temperature in the range of about 0° C. to about 140° C.; and (5) a reaction time in the range of about 0.5 to about 48 hours. Reaction parameters outside these ranges need not be excluded.

The polymer comprising repeat units of formulae (1) to (4) preferably has a weight average molecular weight (Mw) of 1,000 to 200,000, and more preferably 2,000 to 150,000, as measured by GPC versus polystyrene standards. A polymer having too high a Mw may not dissolve in a solvent or may dissolve in a solvent to form a solution, which may be less effective to coat, failing to form a layer of uniform thickness over the entire wafer surface by spin coating. On the other hand, a polymer having too low a Mw may fail to form an effective barrier layer or to impart solvent resistance.

The polymer (A) should preferably account for at least 2% by weight, more preferably at least 5% by weight based on the overall polymers. A less proportion of the polymer (A) may fail to form an effective barrier layer or to impart solvent resistance. As to the upper limit, the proportion of polymer (A) is preferably up to 60%, more preferably up to 50% by weight.

B) Aromatic Ring-Bearing Polymer

In the NIR absorptive layer-forming composition, an aromatic ring-bearing polymer is present as component (B). It is a main component of the NIR absorptive layer-forming composition and the NIR absorptive layer formed thereof. Understandably, those aromatic ring-bearing polymers which fall in the scope of component (A) are excluded from component (B). An aromatic ring is introduced into a polymer for the purpose of providing a film with higher etch resistance.

As the aromatic ring-bearing polymer (B), use may be made of any polymers containing an aromatic ring, for example, polymers used as the base resin in photoresist underlayer film. Suitable polymers include polymers comprising repeat units resulting from polyaddition of styrene or derivatives thereof, aromatic ring-bearing (meth)acrylic acid derivatives, vinylnaphthalene or derivatives thereof, vinylanthracene or derivatives thereof, and monomers having a polymerizable unsaturated bond such as vinyl carbazole; and polymers resulting from polycondensation of aromatic ring-bearing compounds such as phenol derivatives and naphthol derivatives.

Of the polymer (B), exemplary polymers resulting from polyaddition include, but are not limited to, polymers comprising repeat units resulting from (co)polymerization of monomers such as phenyl(meth)acrylate, benzyl(meth)acrylate, 1-naphthyl(meth)acrylate, 2-naphthyl(meth)acrylate, 9-anthranylmethyl(meth)acrylate, 3-hydroxyphenyl(meth)acrylate, 4-hydroxyphenyl(meth)acrylate, 4-hydroxy-1-naphthyl(meth)acrylate, N-(4-hydroxyphenyl)(meth)acrylamide, styrene, 2-methylstyrene, 3-methylstyrene, 4-methylstyrene, 3-hydroxystyrene, 4-hydroxystyrene, 3-carboxystyrene, 4-carboxystyrene, 3-vinylanisole, 4-vinylanisole, 4-t-butoxystyrene, 4-t-amyloxystyrene, 4-(1-ethoxyethoxy)styrene, 4-acetyloxystyrene, 4-t-butoxycarbonylstyrene, 2-vinylpyridine, 4-vinylpyridine, 1-vinylnaphthalene, 2-vinylnaphthalene, 6-hydroxy-2-vinylnaphthalene, 9-vinylcarbazole, 9-vinylanthracene, indene, indole, methyleneindane, and acenaphthylene.

In addition to the aromatic ring-bearing repeat units, the preferred polymer resulting from polyaddition as component (B) further comprises repeat units of at least one type which undergo crosslinking reaction with the aid of heat or acid as long as etch resistance is not degraded to an unacceptable level. Examples of the repeat units capable of crosslinking reaction include repeat units containing a hydroxyl group, carboxyl group, or cyclic ether structure such as oxirane or oxetane, as described in conjunction with polymer (A). The polymer becomes more effectively curable and thus forms a film with higher solvent resistance. Among the repeat units capable of crosslinking reaction, oxirane and/or oxetane structure-bearing repeat units are most preferred.

Examples of the repeat units capable of heat or acid-induced crosslinking reaction are the same as exemplified in conjunction with polymer (A).

In the polymer resulting from polyaddition as component (B), repeat units derived from a monomer having a carbon-carbon double bond other than the foregoing may be incorporated for the purpose of imparting solubility in the solvent (D) in the NIR absorptive layer-forming composition. Suitable monomers from which these repeat units are derived include methyl(meth)acrylate, ethyl(meth)acrylate, isopropyl(meth)acrylate, cyclopentyl(meth)acrylate, cyclohexyl(meth)acrylate, 2-norbornyl(meth)acrylate, isobornyl(meth)acrylate, and 1-adamantyl(meth)acrylate.

The polymer (B) may comprise repeat units resulting from polyaddition in a preferred compositional proportion range as shown below, but is not limited thereto. Specifically, the polymer may preferably comprise:

20 to 100 mol %, more preferably 30 to 98 mol %, and even more preferably 40 to 95 mol % of aromatic ring-bearing repeat units, 0 to 80 mol %, more preferably 5 to 80 mol %, even more preferably 8 to 75 mol %, and most preferably 10 to 70 mol %, in total, of repeat units capable of heat or acid-induced crosslinking reaction, and 0 to 40 mol %, more preferably 1 to 35 mol %, and even more preferably 3 to 30 mol %, in total, of other repeat units, provided that these units total to 100 mol %.

Monomers from which aromatic ring-bearing repeat units are derived are commercially available. They may also be prepared using any well-known organic chemistry procedure.

Likewise, monomers from which repeat units capable of heat or acid-induced crosslinking reaction are derived and monomers from which other repeat units are derived are commercially available. They may also be prepared using any well-known organic chemistry procedure.

Upon preparation of polymers through polyaddition as the polymer (B), any well-known polymerization reactions including radical, cationic and anionic polymerization reactions may be used. Inter alia, radical polymerization is preferred.

For radical polymerization, preferred reaction conditions include (1) a solvent selected from hydrocarbon solvents such as benzene, toluene and xylene, glycol solvents such as propylene glycol monomethyl ether and PGMEA, ether solvents such as diethyl ether, diisopropyl ether, dibutyl ether, tetrahydrofuran, and 1,4-dioxane, ketone solvents such as acetone, methyl ethyl ketone, methyl isobutyl ketone and methyl amyl ketone, ester solvents such as ethyl acetate, propyl acetate, butyl acetate and ethyl lactate, lactone solvents such as γ-butyrolactone, and alcohol solvents such as ethanol and isopropyl alcohol; (2) a polymerization initiator selected from well-known radical polymerization initiators including azo compounds such as 2,2'-azobisisobutyronitrile (AIBN), 2,2'-azobis-2-methylisobutyronitrile, dimethyl 2,2'-azobisisobutyrate (MAIB), 2,2'-azobis-2,4-dimethylvaleronitrile, 1,1'-azobis(cyclohexane-1-carbonitrile), and 4,4'-azobis(4-cyanovaleric acid), and peroxides such as lauroyl peroxide and benzoyl peroxide; (3) a radical chain transfer agent, if necessary for molecular weight control, selected from thiol compounds including 1-butanethiol, 2-butanethiol, 2-methyl-1-propanethiol, 1-octanethiol, 1-decanethiol, 1-tetradecanethiol, cyclohexanethiol, 2-mercaptoethanol, 1-mercapto-2-propanol, 3-mercapto-1-propanol, 4-mercapto-1-butanol, 6-mercapto-1-hexanol, 1-thioglycerol, thioglycolic acid, 3-mercaptopropionic acid, and thiolactic acid; (4) a reaction temperature in the range of about 0° C. to about 140° C.; and (5) a reaction time in the range of about 0.5 to about 48 hours. Reaction parameters outside these ranges need not be excluded.

The polymer resulting from polyaddition as the polymer (B) preferably has a weight average molecular weight (Mw) of 1,000 to 200,000, and more preferably 2,000 to 150,000, as measured in tetrahydrofuran solvent by GPC versus polystyrene standards. A polymer having too high a Mw may not dissolve in a solvent or may dissolve in a solvent to form a solution, which may be less effective to coat, failing to form a layer of uniform thickness over the entire wafer surface by spin coating. On the other hand, a polymer having too low a Mw may fail to endow a film with solvent resistance.

Of the polymer (B), polymers resulting from polycondensation include novolac resins. Exemplary are novolac resins obtained from polycondensation with aldehydes of the following: phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, glycidyl-2-methylphenyl ether, 1-naphthol, 2-naphthol, 2-methyl-1-naphthol, 4-methoxy-1-naphthol, 7-methoxy-2-naphthol; dihydroxynaphthalenes such as 1,5-dihydroxynaphthalene, 1,7-dihydroxynaphthalene, 2,6-dihydroxynaphthalene, and 2,7-dihydroxynaphthalene; methyl 3-hydroxy-naphthalene-2-carboxylate, indene, hydroxyanthracene, acenaphthylene, biphenyl, bisphenol, trisphenol, isothymol, polyindene, polyacenaphthylene, polystyrene, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spiro-biindene-6,6'-diol, 3,3,3',3',4,4'-hexamethyl-2,3,2',3'-tetrahydro-(1,1')-spiro-biindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spiroblindene-6,6'-diol;
and the foregoing polymers resulting from polyaddition.

Suitable aldehydes used herein include formaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthaldehyde, 2-naphthaldehyde, and furfural. Of these, formaldehyde, benzaldehyde, 1-naphthylaldehyde, and 2-naphthylaldehyde are preferred.

Most preferably formaldehyde is used. These aldehydes may be used alone or in admixture of two or more. An appropriate amount of the aldehyde used is 0.2 to 5 moles, more preferably 0.5 to 2 moles per mole of the aromatic ring-containing compound from which the novolac resin is formed.

Formaldehyde is typically supplied as formaldehyde aqueous solution. Alternatively, any compounds which display the same reactivity as formaldehyde during polycondensation reaction may be used, for example, paraformaldehyde, hexamethylenetetramine, and acetals such as formaldehyde dimethylacetal.

Among the polymer (B), the novolac resin resulting from polycondensation may be obtained from condensation between an aromatic ring-containing compound and an aldehyde in the presence of an acid catalyst. Examples of the acid catalyst include hydrochloric acid, nitric acid, sulfuric acid, formic acid, oxalic acid, acetic acid, methanesulfonic acid, camphorsulfonic acid, tosylic acid, and trifluoromethanesulfonic acid. The acid catalyst is preferably used in an amount of $1 \times 10^{-5}$ to $5 \times 10^{-1}$ mole per mole of the aromatic ring-containing compound.

Polycondesation reaction may be conducted in a solvent, examples of which include water, methanol, ethanol, propanol, butanol, tetrahydrofuran, 2-methoxyethanol, propylene glycol monomethyl ether, dioxane, and mixtures thereof. Preferably the solvent is used in an amount of 0 to 2,000 parts by weight per 100 parts by weight of the reactants.

The reaction temperature may be selected appropriate in accordance with the reactivity of the reactants although it is generally in a range of 10 to 200° C.

Polycondesation reaction may be conducted by charging the aromatic ring-containing compound, aldehyde and acid catalyst all at once, or by adding dropwise the aromatic ring-containing compound and the aldehyde in the presence of the acid catalyst. After the completion of polycondesation reaction, the unreacted reactants and acid catalyst are removed from the reaction system. To this end, the reaction system is heated to a temperature of 130 to 230° C. under a pressure of 1 to 50 mmHg for evaporating off volatile components.

For polymerization, the aromatic ring-containing compound defined above may be used alone while a mixture of the aromatic ring-containing compound defined above and another aromatic ring-containing compound may also be used.

The polymer (B) resulting from condensation of an aromatic ring-containing compound and an aldehyde in the presence of an acid catalyst preferably has a weight average molecular weight (Mw) of 1,000 to 30,000, and more preferably 1,500 to 20,000, as measured by GPC versus polystyrene standards. A polymer having too high a Mw may not dissolve in a solvent or may dissolve in a solvent to form a solution, which may be less effective to coat, failing to form a layer of uniform thickness over the entire wafer surface by spin coating. On the other hand, a polymer having too low a Mw may form a film which is less curable, failing to gain solvent resistance.

C) NIR Absorbing Dye

Component (C) is a near-infrared absorbing dye. It may be any dye capable of absorbing radiation in a wavelength range of 500 to 1,200 nm. Suitable NIR-absorbing dyes include the structures of the general formulae (5) to (8), but are not limited thereto.

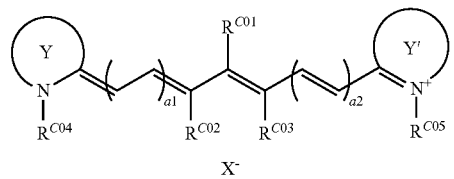

(5)

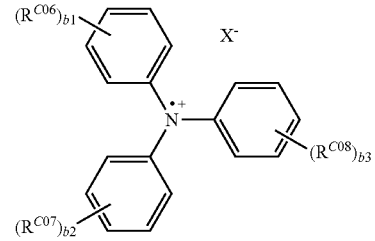

(6)

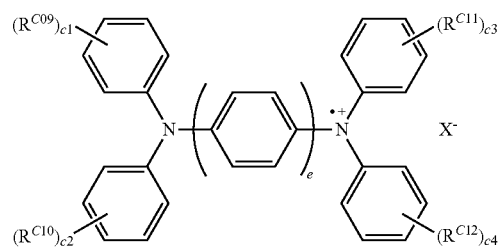

(7)

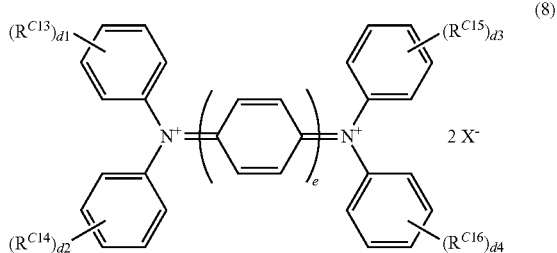 (8)

In formula (5), $R^{CO1}$ is hydrogen, halogen, cyano or a straight, branched or cyclic $C_1$-$C_{20}$ monovalent hydrocarbon group which may contain a heteroatom. $R^{CO2}$ and $R^{CO3}$ are each independently hydrogen or a straight or branched $C_1$-$C_{10}$ monovalent hydrocarbon group, and $R^{CO2}$ and $R^{CO3}$ may bond together to form a ring with the carbon atoms to which they are attached and the intervening carbon atom. $R^{CO4}$ and $R^{CO5}$ are each independently a straight, branched or cyclic $C_1$-$C_{20}$ monovalent hydrocarbon group which may contain a heteroatom. The subscripts a1 and a2 are each independently an integer of 0 to 5. The partial structures in formula (5):

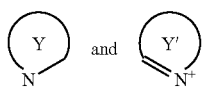

are each independently an aliphatic or aromatic nitrogen-containing heterocyclic compound of 4 to 15 carbon atoms which may contain a heteroatom such as oxygen atom or sulfur atom.

In formula (5), $R^{CO1}$ is hydrogen, halogen, cyano or a straight, branched or cyclic $C_1$-$C_{20}$ monovalent hydrocarbon group which may contain a heteroatom. Specifically, exemplary of $R^{CO1}$ are hydrogen, halogen and cyano. Suitable straight or branched alkyl groups include methyl, ethyl, propyl, isopropyl, n-butyl, sec-butyl, tert-butyl, pentyl, isopentyl, neopentyl, tert-pentyl, 1-methylpentyl, 2-methylpentyl, hexyl, isohexyl, 5-methylhexyl, heptyl, octyl, nonyl, decyl and dodecyl. Suitable alicyclic hydrocarbon groups include cyclopentyl, cyclohexyl, cycloheptyl, cyclopropylmethyl, 4-methylcyclohexyl, cyclohexylmethyl, norbornyl, and adamantyl. Suitable aromatic hydrocarbon groups include phenyl, o-tolyl, m-tolyl, p-tolyl, xylyl, mesityl, o-cumenyl, m-cumenyl, p-cumenyl, biphenylyl, naphthyl, and anthryl. Suitable alkenyl groups include vinyl, allyl, 1-propenyl, 2-propenyl, isopropenyl, butenyl, hexenyl, and cyclohexenyl. Suitable heteroatom-containing hydrocarbon groups include alkoxy groups such as methoxy, ethoxy, propoxy, and butoxy, aryloxy groups such as phenoxy, and the foregoing hydrocarbon groups having such alkoxy or aryloxy substituted thereon, the foregoing hydrocarbon groups having carbonyl substituted thereon, the foregoing hydrocarbon groups having hydroxyl substituted thereon, acetyl, benzoyl, phenyloxycarbonyl, or the foregoing hydrocarbon groups having such an ester bond-containing substituent group, the foregoing hydrocarbon groups having carboxyl substituted thereon, the foregoing hydrocarbon groups having sulfonic acid substituted thereon, the foregoing hydrocarbon groups having fluorine, chlorine, bromine or iodine substituted thereon, phenylsulfonyl or the foregoing hydrocarbon groups having phenylsulfonyl substituted thereon, alkylamino and arylamino groups (e.g., dimethylamino, diethylamino, diphenylamino) or the foregoing hydrocarbon groups having such alkylamino or arylamino substituted thereon, thioalkoxy and thioaryloxy groups (e.g., thiomethoxy, thioethoxy, thiophenoxy) or the foregoing hydrocarbon groups having such thioalkoxy or thioaryloxy substituted thereon, and hydrocarbon groups comprising a combination of two or more substituent groups selected from among the foregoing.

$R^{CO2}$ and $R^{CO3}$ are each independently hydrogen or a straight or branched $C_1$-$C_{10}$ monovalent hydrocarbon group, and $R^{CO2}$ and $R^{CO3}$ may bond together to form a ring, typically a non-aromatic ring, with the carbon atoms to which they are attached and the intervening carbon atom. Specifically, exemplary of $R^{CO2}$ and $R^{CO3}$ are hydrogen, methyl, ethyl, propyl, isopropyl, n-butyl, sec-butyl, tert-butyl, pentyl, isopentyl, neopentyl, tert-pentyl, 1-methylpentyl, 2-methylpentyl, and hexyl. When $R^{CO2}$ and $R^{CO3}$ bond together to form a ring with the carbon atoms to which they are attached and the intervening carbon atom, the ring is preferably 5 or 6-membered. In the cyclic structure thus formed, some hydrogen may be substituted by a straight or branched monovalent hydrocarbon group.

$R^{CO4}$ and $R^{CO5}$ are each independently a straight, branched or cyclic $C_1$-$C_{20}$ monovalent hydrocarbon group which may contain a heteroatom. Specifically, suitable straight or branched alkyl groups include methyl, ethyl, propyl, isopropyl, n-butyl, sec-butyl, tert-butyl, pentyl, isopentyl, neopentyl, tert-pentyl, 1-methylpentyl, 2-methylpentyl, hexyl, isohexyl, 5-methylhexyl, heptyl, octyl, nonyl, decyl and dodecyl. Suitable alicyclic hydrocarbon groups include cyclopentyl, cyclohexyl, cycloheptyl, cyclopropylmethyl, 4-methylcyclohexyl, cyclohexylmethyl, norbornyl, and adamantyl. Suitable aromatic hydrocarbon groups include phenyl, o-tolyl, m-tolyl, p-tolyl, xylyl, mesityl, o-cumenyl, m-cumenyl, p-cumenyl, biphenylyl, naphthyl, and anthryl. Suitable alkenyl groups include vinyl, allyl, 1-propenyl, 2-propenyl, isopropenyl, butenyl, hexenyl, and cyclohexenyl. Suitable heteroatom-containing hydrocarbon groups include the foregoing hydrocarbon groups having alkoxy or aryloxy (e.g., methoxy, ethoxy, propoxy, butoxy, and phenoxy) substituted thereon, the foregoing hydrocarbon groups having carbonyl substituted thereon, the foregoing hydrocarbon groups having hydroxyl substituted thereon, the foregoing hydrocarbon groups having an ester bond-containing substituent group (e.g., acetyl, benzoyl or phenyloxycarbonyl) substituted thereon, the foregoing hydrocarbon groups having carboxyl substituted thereon, the foregoing hydrocarbon groups having sulfonic acid substituted thereon, the foregoing hydrocarbon groups having fluorine, chlorine, bromine or iodine substituted thereon, the foregoing hydrocarbon groups having an amino group (e.g., dimethylamino, diethylamino, diphenylamino) substituted thereon, the foregoing hydrocarbon groups having thioalkoxy or thioaryloxy (e.g., thiomethoxy, thioethoxy, thiophenoxy) substituted thereon, and hydrocarbon groups comprising a combination of two or more substituent groups selected from among the foregoing.

The subscripts a1 and a2 are each independently an integer of 0 to 5. As these subscripts vary, i.e., the length of conjugated system varies, the NIR absorbing dye changes its absorption wavelength. From the standpoints of the wavelength suited for the intended application and the availability of starting reactants, a1 and a2 are preferably 0 to 2, more preferably 1 or 2.

The partial structure in formula (5):

is an aliphatic or aromatic nitrogen-containing heterocyclic compound of 4 to 15 carbon atoms which may contain a heteroatom such as oxygen atom or sulfur atom. An exemplary partial structure is one of partial structures of the general formulae (9) to (13).

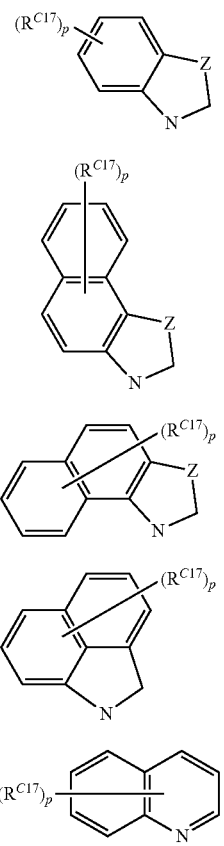

Herein $R^{C17}$ is halogen, an alkoxy group of 1 to 10 carbon atoms, preferably 1 to 6 carbon atoms, a nitro group, or a monovalent hydrocarbon group of 1 to 10 carbon atoms, preferably 1 to 6 carbon atoms; p is an integer of 0 to 4; Z is an oxygen atom, sulfur atom or —C($R^z$)$_2$—, and $R^z$ is hydrogen or a monovalent hydrocarbon group of 1 to 10 carbon atoms, preferably 1 to 6 carbon atoms.

Examples of $R^{C17}$ include fluorine, chlorine, bromine, iodine, methoxy, ethoxy, n-butoxy, t-butoxy, and nitro, while suitable monovalent hydrocarbon groups of 1 to 10 carbon atoms include methyl, ethyl, propyl, isopropyl, n-butyl, sec-butyl, tert-butyl, pentyl, isopentyl, neopentyl, tert-pentyl, 1-methylpentyl, 2-methylpentyl, hexyl, cyclopentyl, and cyclohexyl.

The subscript p is an integer of 0 to 4. For the availability of starting reactants, p is preferably 0 to 2, more preferably 0 or 1.

Examples of $R^z$ include hydrogen, methyl, ethyl, propyl, isopropyl, n-butyl, sec-butyl, tert-butyl, pentyl, isopentyl, neopentyl, tert-pentyl, 1-methylpentyl, 2-methylpentyl, hexyl, cyclopentyl, and cyclohexyl, with hydrogen or methyl being preferred.

The partial structure in formula (5):

is an aliphatic or aromatic nitrogen-containing heterocyclic compound of 4 to 15 carbon atoms which may contain a heteroatom such as oxygen atom or sulfur atom. An exemplary partial structure is one of partial structures of the general formulae (9') to (13').

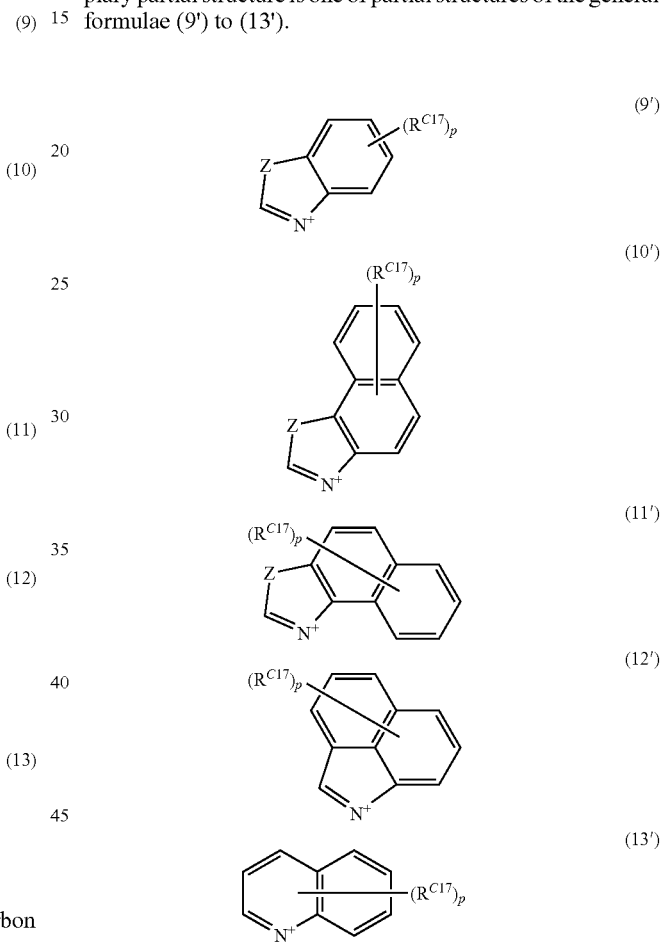

Herein $R^{C17}$, p and Z are as defined above.

In formula (6), $R^{C06}$, $R^{C07}$, and $R^{C08}$ are each independently hydrogen, halogen, cyano, amino, —$R^{C18}$, —$OR^{C18}$, —$SR^{C18}$, —$SO_2R^{C18}$, —$O_2CR^{C18}$, —$CO_2R^{C18}$, or —$N(R^{C18})_2$ wherein $R^{C18}$ is a monovalent organic group optionally containing a heteroatom, such as an alkyl group of 1 to 20 carbon atoms, preferably 1 to 12 carbon atoms, or a fluorine, cyano or hydroxyl-substituted alkyl group. Inter alia, preference is given to amino, dimethylamino, diethylamino, dipropylamino, dibutylamino, diisobutylamino, di-sec-butylamino, bis(2,2,2-trifluoroethyl)amino, bis(4,4,4-trifluorobutyl)amino, and bis(4-hydroxybutyl)amino. The subscripts b1, b2, and b3 are each independently an integer of 0 to 5.

In formula (7), $R^{C09}$, $R^{C10}$, $R^{C11}$, and $R^{C12}$ are each independently hydrogen, halogen, cyano, amino, —$R^{C18}$, —OR$^{C18}$, —SR$^{C18}$, —SO$_2$R$^{C18}$, —O$_2$CR$^{C18}$, —CO$_2$R$^{18}$, or —N(R$^{C18}$)$_2$ wherein R$^{C18}$ is as defined above. Inter alia, preference is given to amino, dimethylamino, diethylamino, dipropylamino, dibutylamino, diisobutylamino, di-sec-butylamino, bis(2,2,2-trifluoroethyl)amino, bis(4,4,4-trifluorobutyl)amino, and bis(4-hydroxybutyl)amino. The subscripts c1, c2, c3, and c4 are each independently an integer of 0 to 5, and e is 1 or 2.

In formula (8), R$^{C13}$, R$^{C14}$, R$^{C15}$, and R$^{C16}$ are each independently hydrogen, halogen, cyano, amino, —R$^{C18}$, —OR$^{C18}$, —SR$^{C18}$, —SO$_2$R$^{C18}$, —O$_2$CR$^{C18}$, —CO$_2$R$^{C18}$, or —N(R$^{C18}$)$_2$ wherein R$^{C18}$ is as defined above. Inter alia, preference is given to amino, dimethylamino, diethylamino, dipropylamino, dibutylamino, diisobutylamino, di-sec-butylamino, bis(2,2,2-trifluoroethyl)amino, bis(4,4,4-trifluorobutyl)amino, and bis(4-hydroxybutyl)amino. The subscripts d1, d2, d3, and d4 are each independently an integer of 0 to 5.

In formulae (5) to (8), X$^-$ is an anion. Exemplary anions include halide ions such as chloride, bromide and iodide ions, fluoroalkylsulfonates such as triflate, 1,1,1-trifluoroethanesulfonate, pentafluoroethanesulfonate, and nonafluorobutanesulfonate, arylsulfonates such as tosylate, benzenesulfonate, 4-fluorobenzenesulfonate, and 1,2,3,4,5-pentafluorobenzenesulfonate, alkylsulfonates such as mesylate and butanesulfonate, and conjugate bases of imide acids such as bis(trifluoromethylsulfonyl)imide, bis(perfluoroethylsulfonyl)imide, bis(perfluoropropylsulfonyl)imide, and bis(perfluorobutylsulfonyl)imide, methide acids such as to tris(trifluoromethylsulfonyl)methide and tris(perfluoroethylsulfonyl)methide, and mineral acids such as BF$_4^-$, PF$_6^-$, ClO$_4^-$, NO$_3^-$, and SbF$_6^-$. Preferred anions of X$^-$ include triflate, 1,1,1-trifluoroethanesulfonate, pentafluoroethanesulfonate, and nonafluorobutanesulfonate, conjugate base of bis(trifluoromethylsulfonyl)imide acid, and conjugate base of tris(trifluoromethylsulfonyl)methide acid.

Also included are NIR absorbing dyes having an anion X$^-$ of the general formula (14), as described in Japanese Patent Application No. 2010-253448.

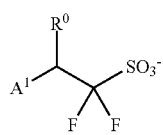

(14)

Herein A$^1$ is hydrogen or trifluoromethyl, R$^0$ is hydroxyl or —OC(=O)—R', and R' is a straight, branched or cyclic C$_1$-C$_{50}$ monovalent hydrocarbon group which may contain a heteroatom.

The NIR absorbing dye having an anion X$^-$ of formula (14) has not only good optical properties and heat resistance, but also excellent solvent solubility which ensures effective coating and working in the film forming step. Because of the structure devoid of a heavy metal, the dye is advantageous in the process of fabricating semiconductor devices. Therefore, this dye is desirable as the NIR absorbing dye (C) in the NIR absorptive layer-forming composition.

It is noted that the NIR-absorbing dye (C) may be amphoteric and in this case, X$^-$ is unnecessary.

Of the foregoing NIR-absorbing dyes, those cyanine dyes of formula (5) capable of absorbing radiation having a wavelength of 500 to 1,200 nm are preferred for heat resistance and solvent solubility.

The foregoing NIR-absorbing dyes may be used alone or in admixture of two or more. When a combination of two or more dyes is used, a plurality of cations of the structures having formulae (5) to (8) may be used. When two or more dyes having different wavelength bands of NIR absorption are used in combination, an absorption wavelength band which is not available with a single dye is achievable. This provides for effective absorption of NIR light used in optical auto-focusing, sometimes leading to an improvement in the accuracy of focusing.

The cation of the NIR-absorbing dye of formula (5) is illustrated by the following exemplary structures, but not limited thereto.

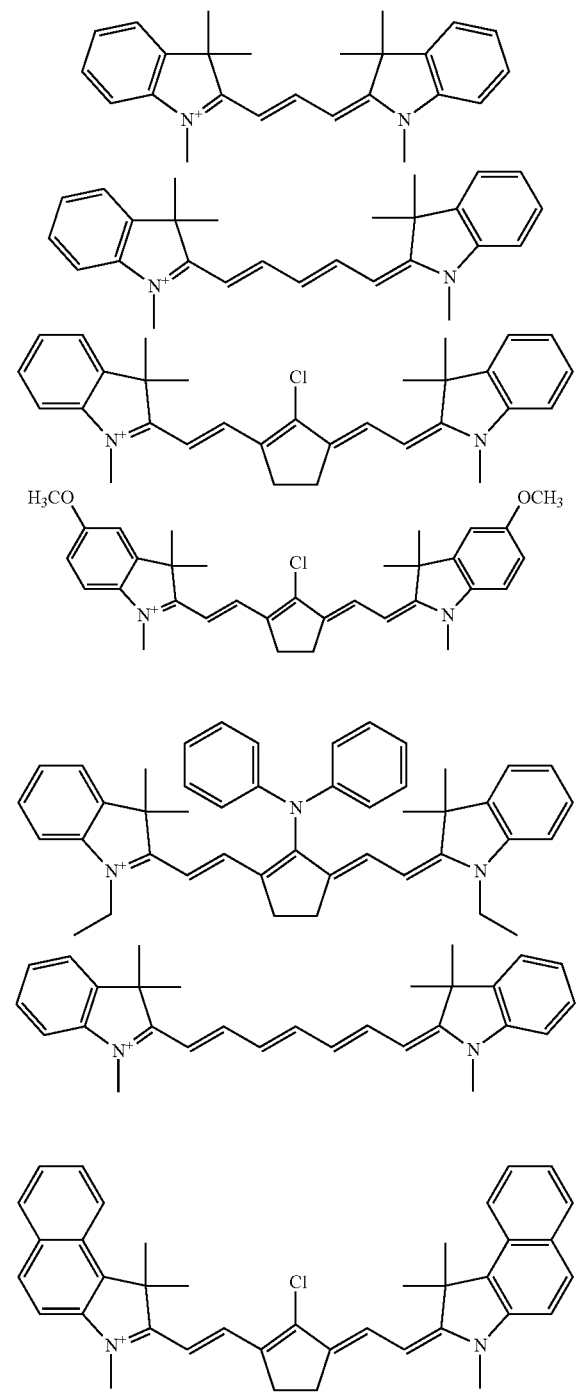

41
-continued
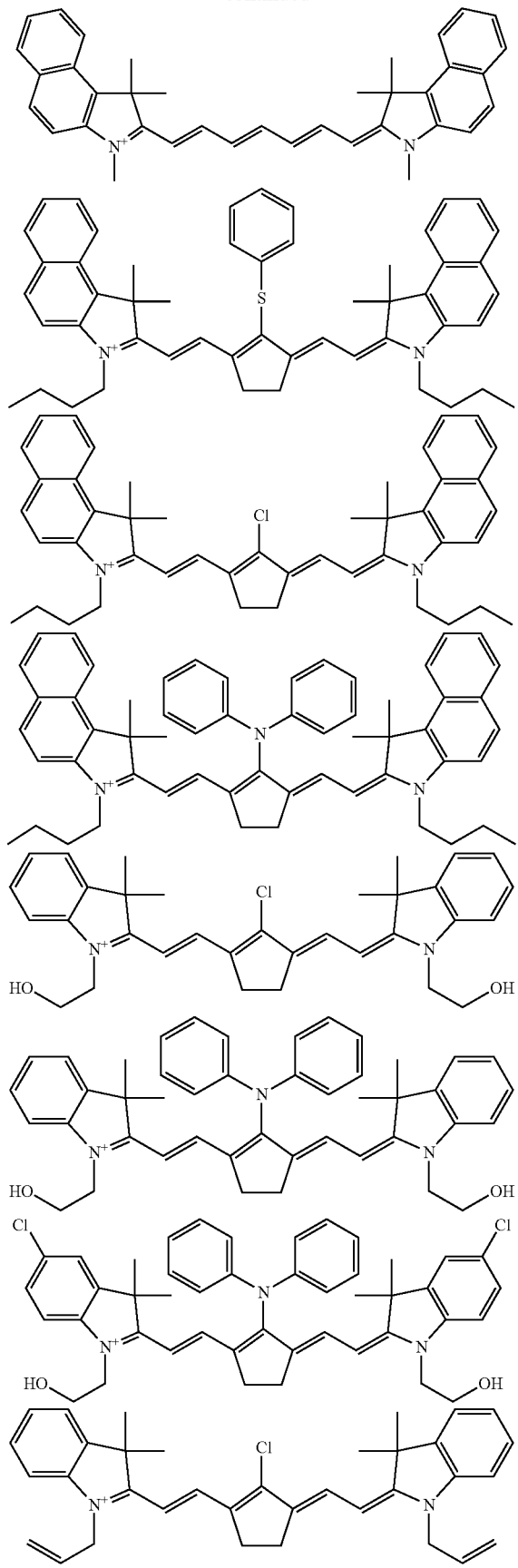
42
-continued
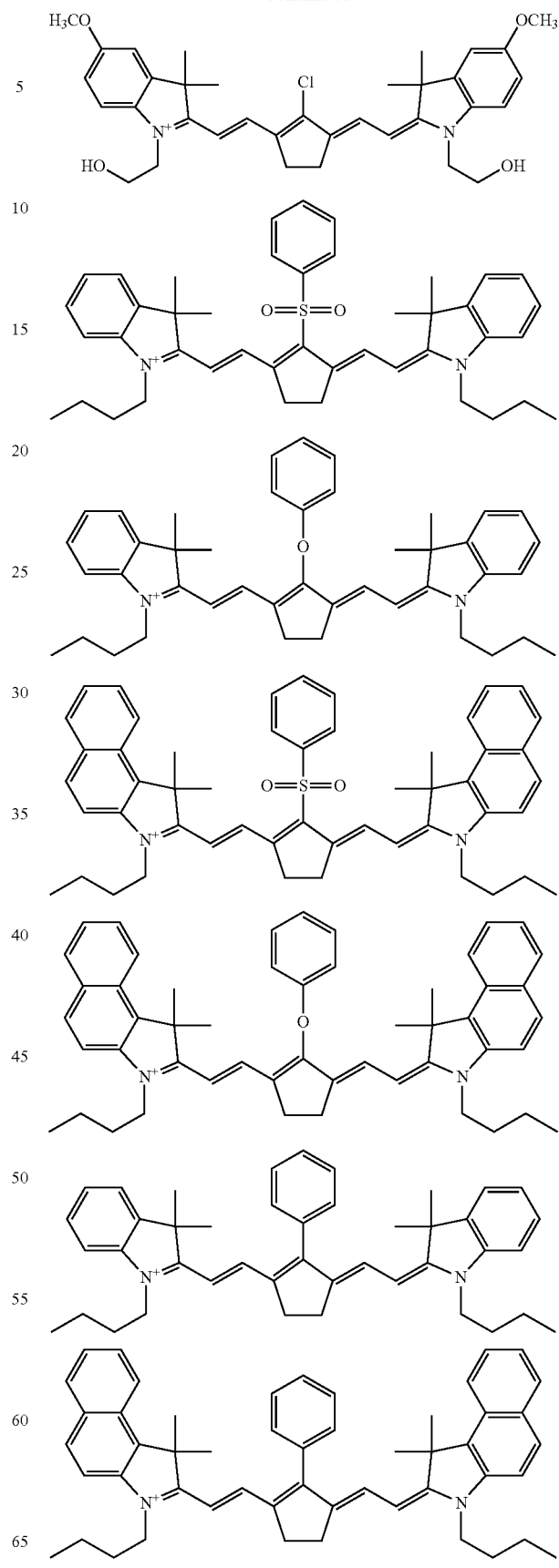

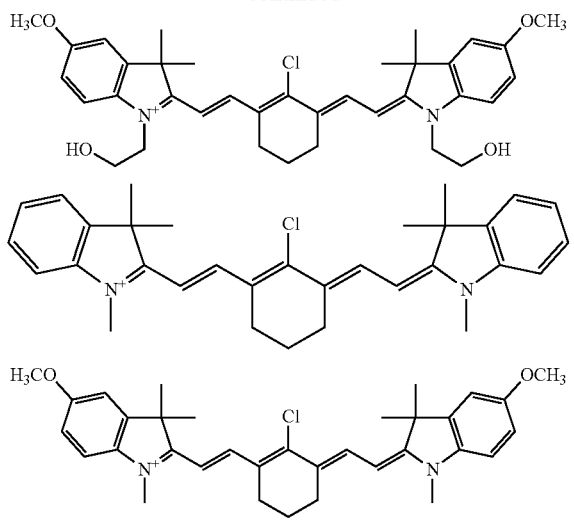
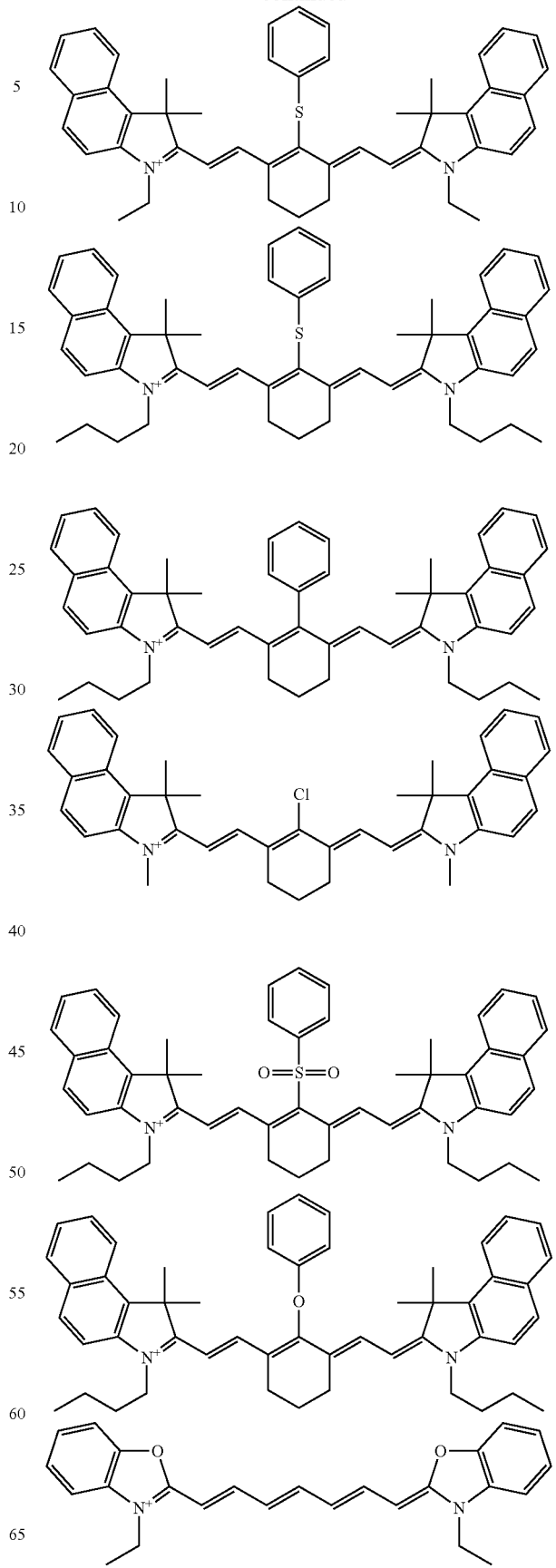

45
-continued
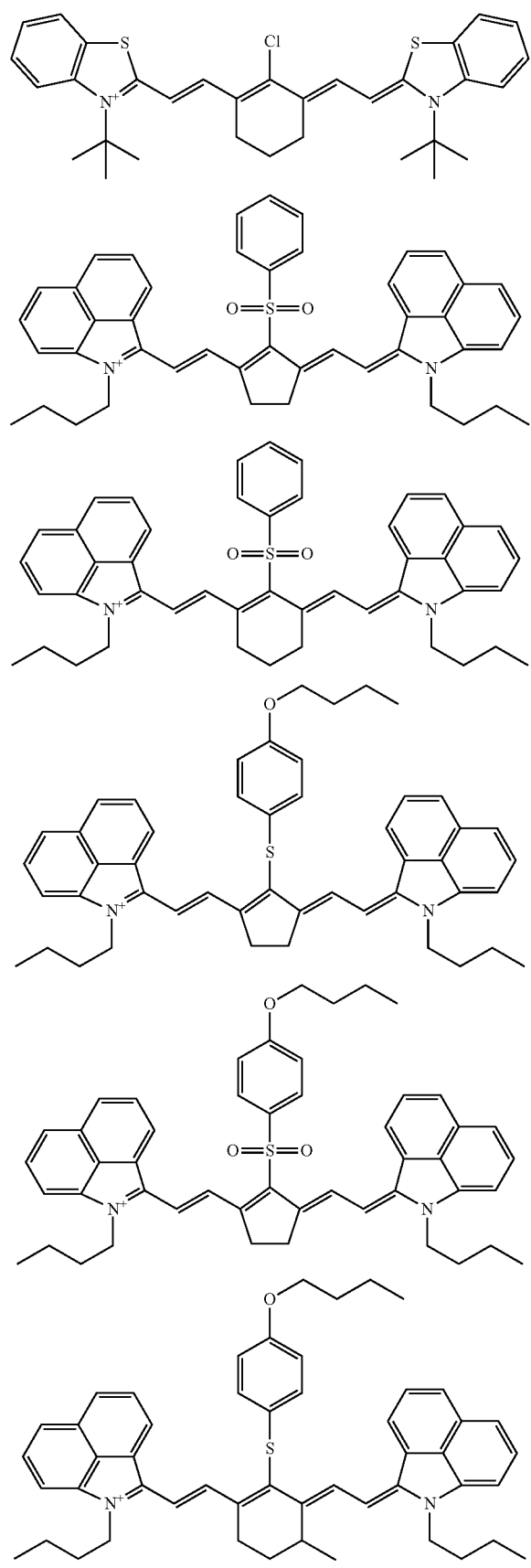
46
-continued
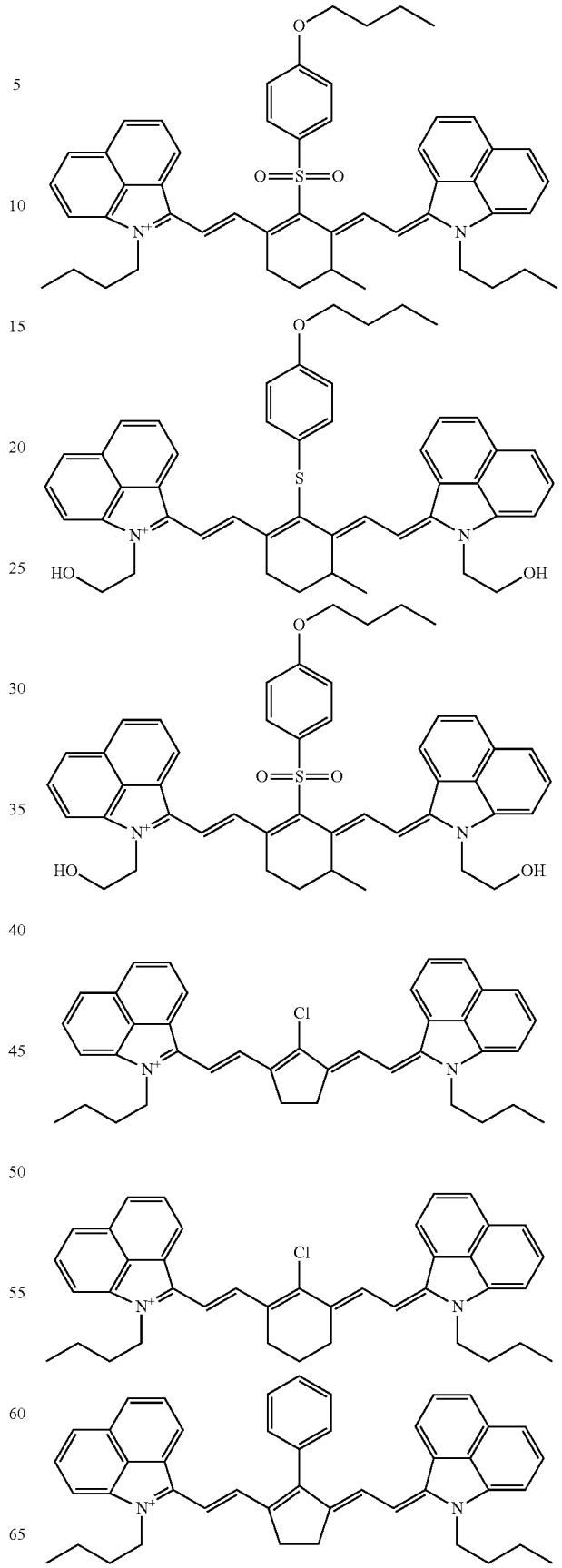

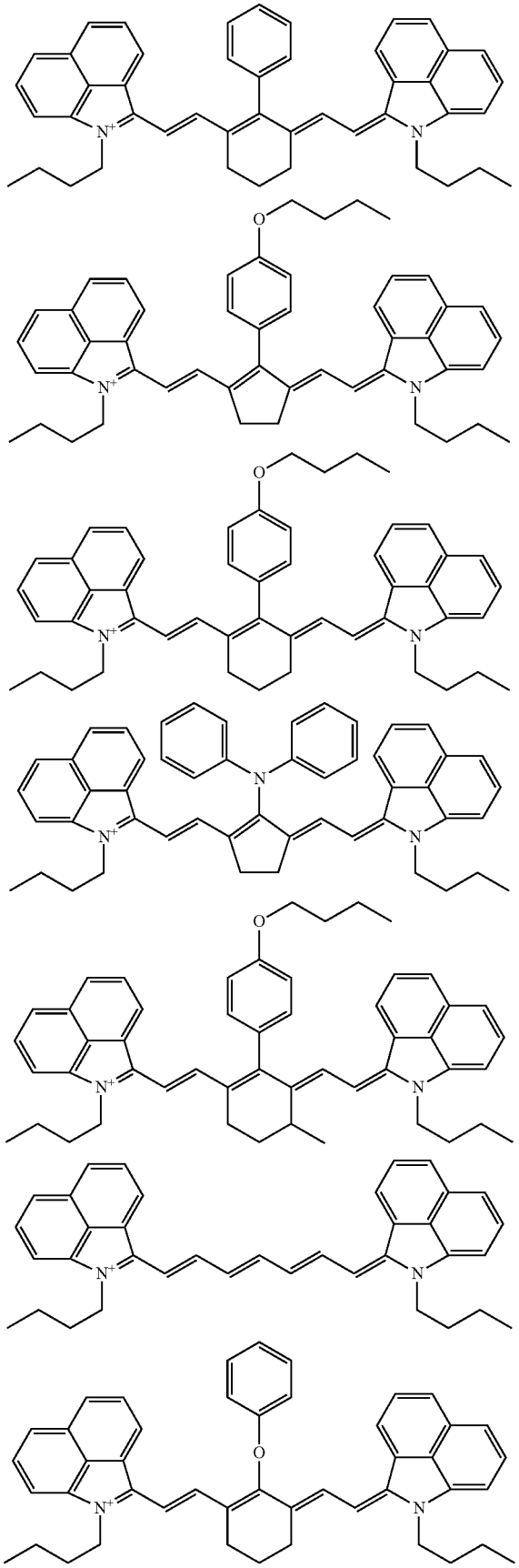
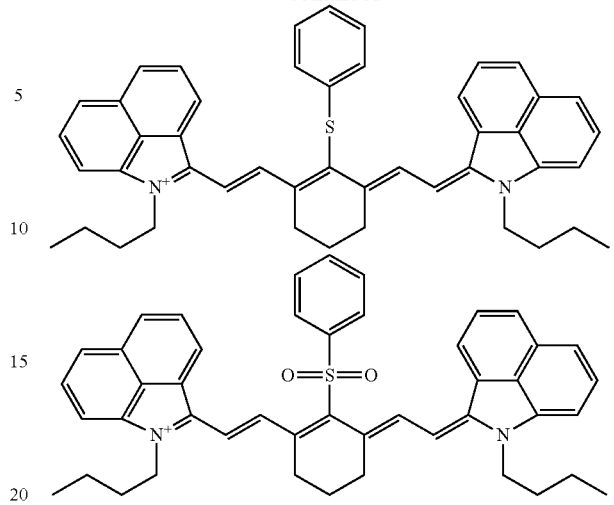
The cation of the NIR-absorbing dye of formula (6) is illustrated by the following exemplary structures, but not limited thereto.
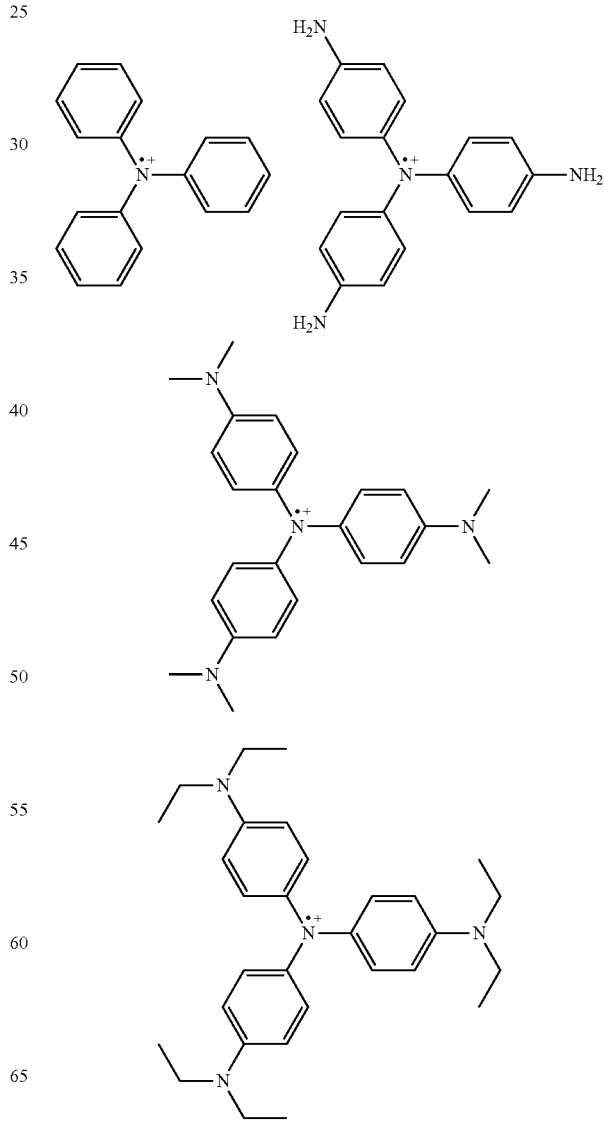

-continued
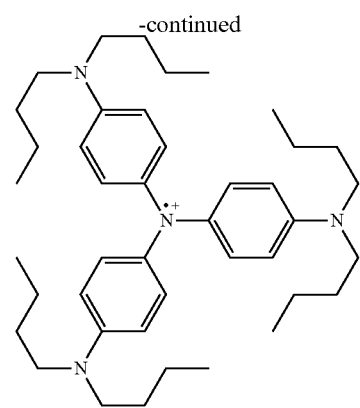
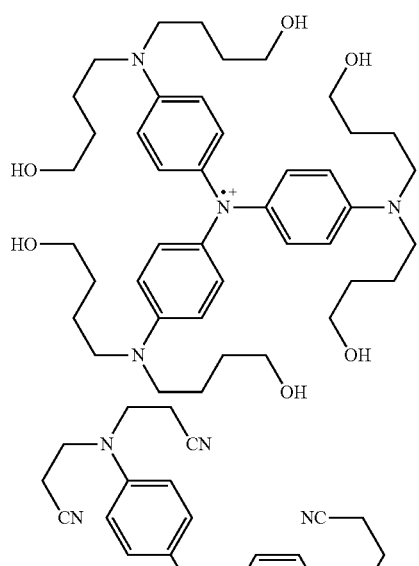
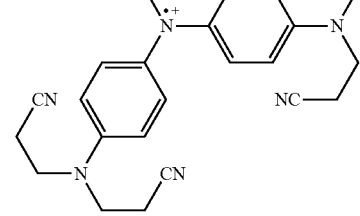
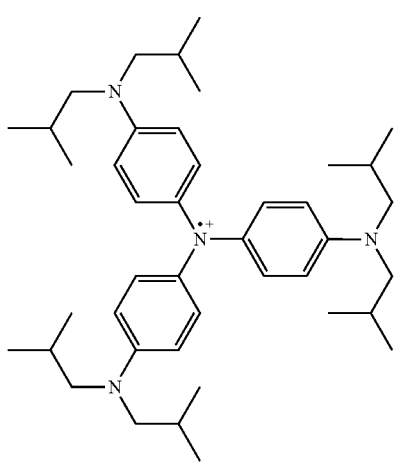
-continued
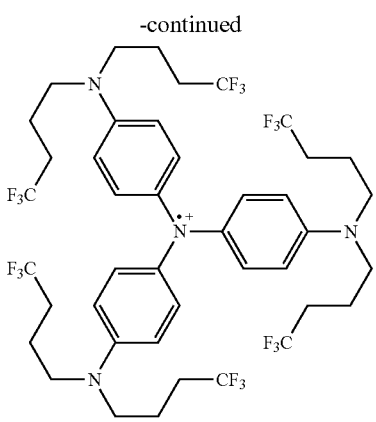
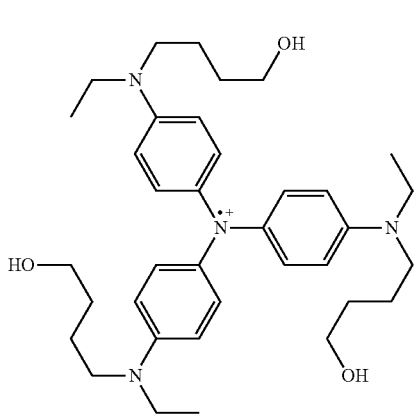
The cation of the NIR-absorbing dye of formula (7) is illustrated by the following exemplary structures, but not limited thereto.
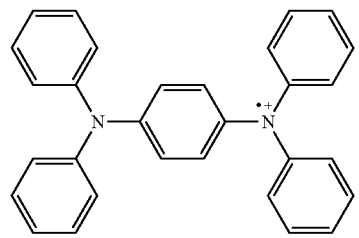
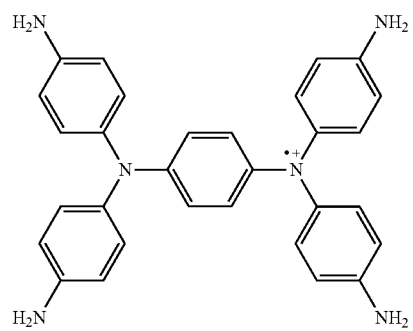

-continued
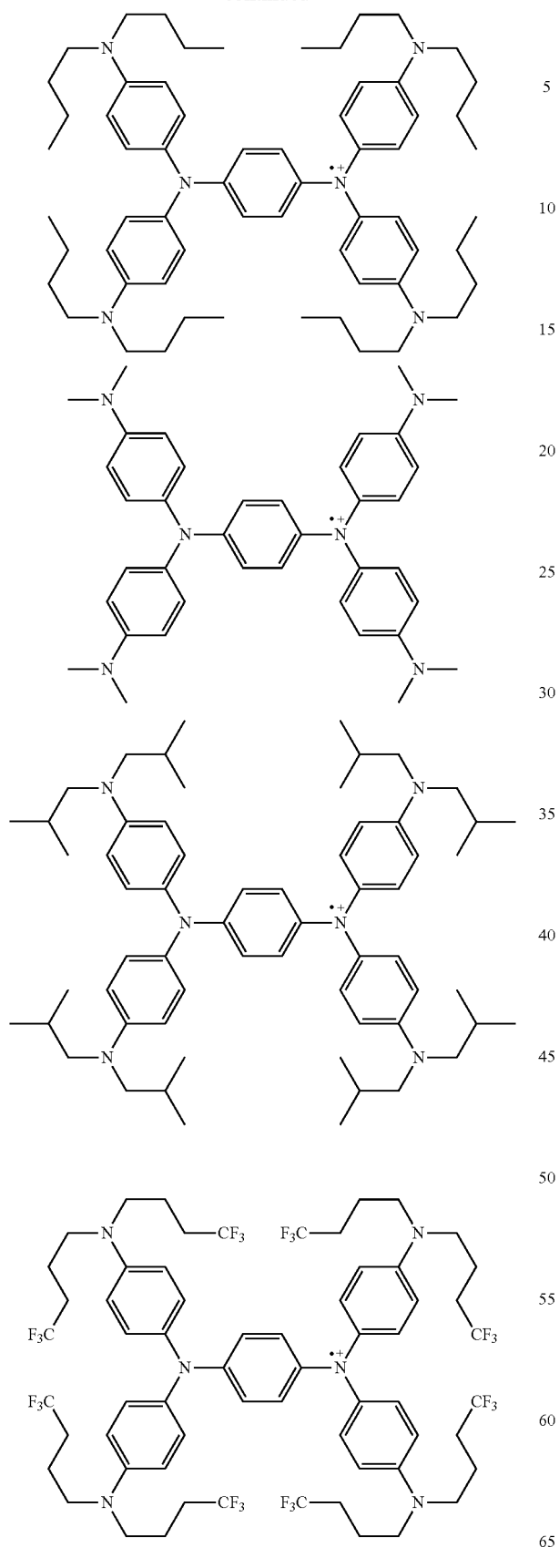
The cation of the NIR-absorbing dye of formula (8) is illustrated by the following exemplary structures, but not limited thereto.
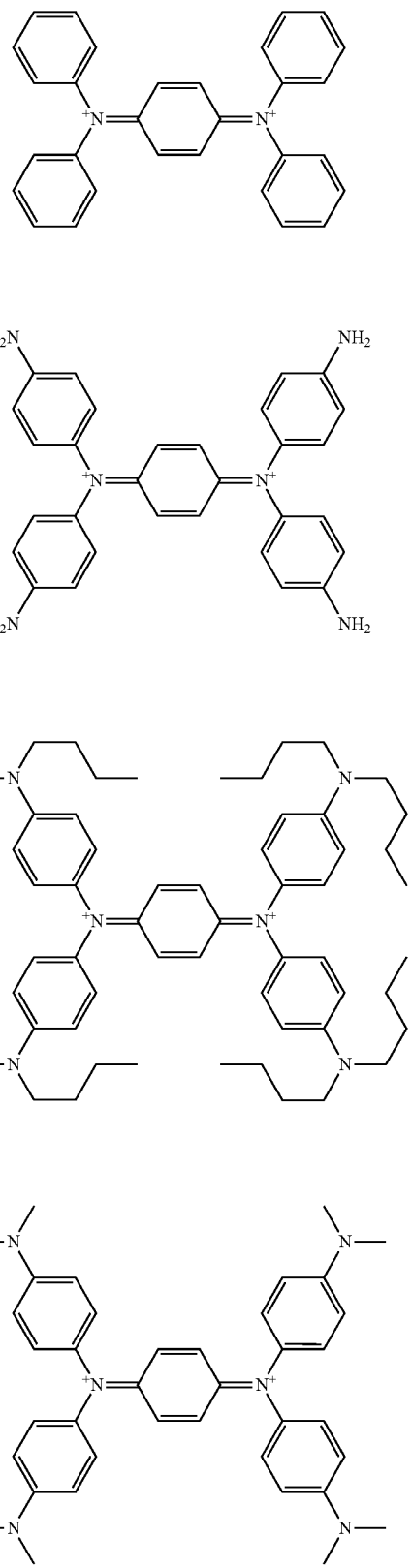

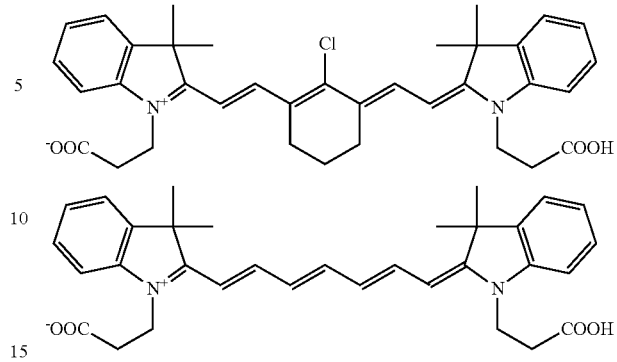

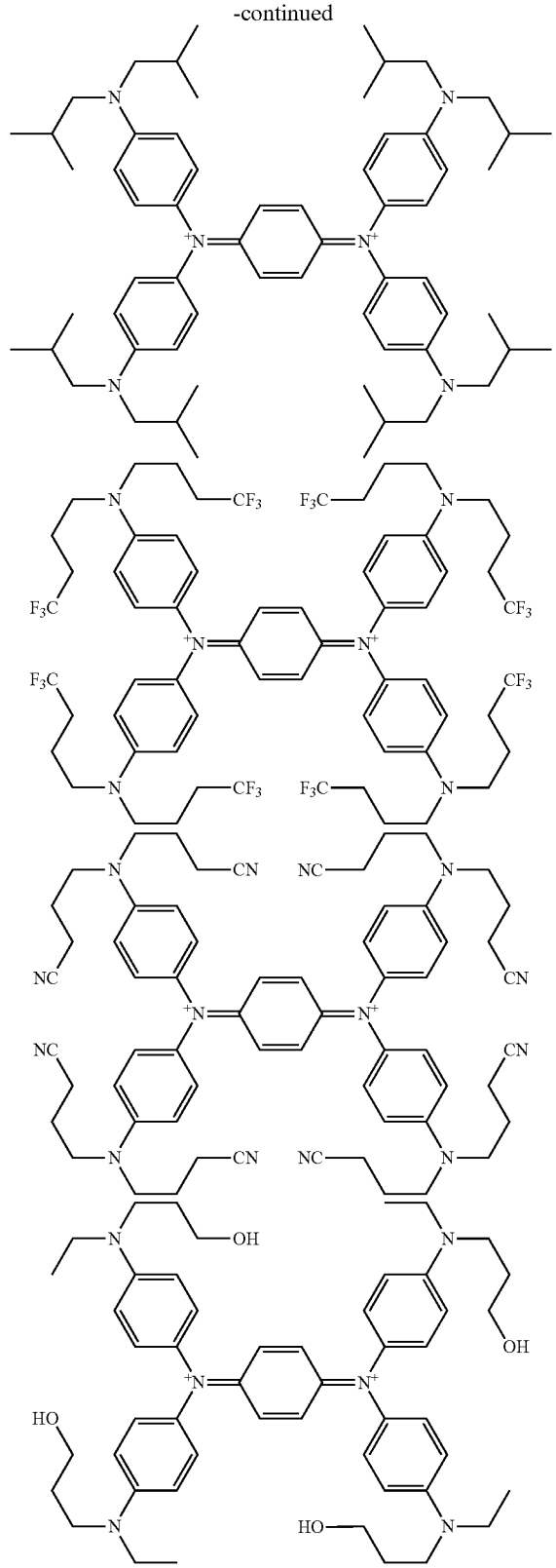

Examples of the ampho-ion structure are illustrated below, but not limited thereto.

As the NIR-absorbing dye, commercially available dyes may be used as purchased, or derivatives using them as the precursor may be used. The dyes may also be prepared by any well-known organic chemical procedure.

In particular, the NIR absorbing dyes comprising a cation of the structure having formula (5) combined with an anion $X^-$ having formula (14) may be prepared by the method described in Japanese Patent Application No. 2010-253448.

Specifically, the NIR absorbing dyes may be synthesized according to the following process of Schemes 1 and 2, for example.

Scheme 1

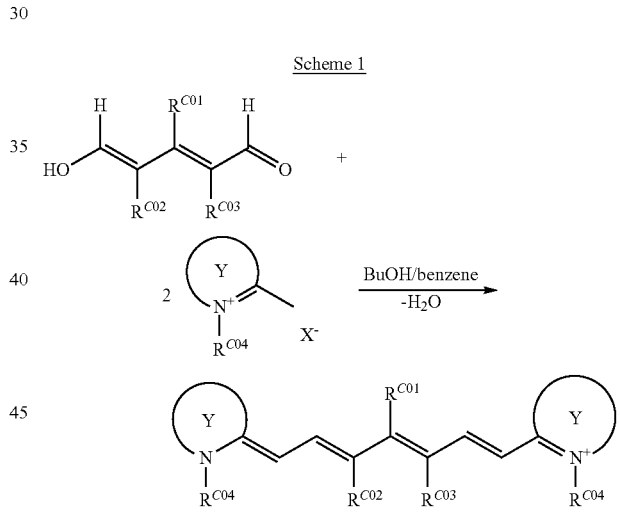

Scheme 2

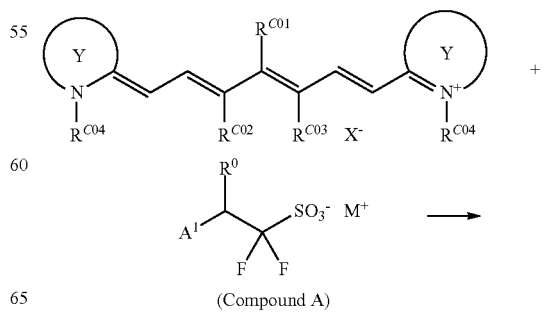

(Compound A)

-continued

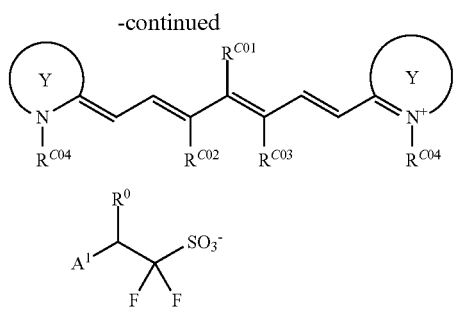

Herein $R^{C01}$, $R^{C02}$, $R^{C03}$, $R^{C04}$, $A^1$, and $R^0$ are as defined above, $X^-$ is an inorganic or organic anion, Pr is a cation, and the partial structures:

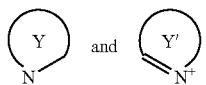

are as defined above.

The first step according to Scheme 1 is one exemplary step of synthesizing a cation or NIR absorbing dye precursor. Reference may be made to Journal of Organic Chemistry, 60, 2391 (1995). With respect to $R^{C01}$, a commercially available reactant may be used, or when $R^{C01}$ is a halogen atom such as chlorine, it may be converted into another substituent group following the Scheme 1 step, by utilizing any organic chemistry procedures such as nucleophilic displacement reaction or coupling reaction.

Exemplary anions represented by $X^-$ include halide ions such as chloride, bromide and iodide ions, conjugate bases of sulfonic acid such as mesylate and tosylate, and conjugate bases of mineral acids such as $BF_4^-$, $PF_6^-$, $ClO_4^-$, $NO_3^-$ and $SbF_6^-$.

The NIR absorbing dye precursor may be prepared according to Scheme 1 or commercially available from chemical suppliers.

Next the NIR absorbing dye precursor is reacted with Compound A according to Scheme 2 whereby it is converted through anion exchange into a NIR absorbing dye having an anion structure according to the invention. On ion exchange reaction, it is preferred for effective synthesis that $M^+$ be a lithium, sodium, potassium, or ammonium ion. With respect to ion exchange reaction, reference may be made to JP-A 2007-145797, for example. With respect to the synthesis of Compound A, reference may be made to JP-A 2007-145797 and JP-A 2009-258695, for example. For example, Compound A wherein $A^1$ is trifluoromethyl may be synthesized by a convenient organic chemistry procedure using a relatively inexpensive reactant like 1,1,1,3,3,3-hexafluoroisopropanol, and then the overall process becomes commercially acceptable.

The NIR absorbing dye is preferably used in an amount of 20 to 500 parts by weight, more preferably 30 to 400 parts by weight per 100 parts by weight of the overall polymers.

D) Solvent

In the NIR absorptive layer-forming composition, component (D) is a solvent. The solvent used herein may be any organic solvent in which the polymers, acid generator, crosslinker and other components are soluble. Illustrative, non-limiting, examples of the organic solvent include ketones such as cyclopentanone, cyclohexanone and methyl-2-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, preferred are diethylene glycol dimethyl ether, 1-ethoxy-2-propanol, ethyl lactate, PGMEA, cyclopentanone, cyclohexanone, γ-butyrolactone, and mixtures thereof.

The organic solvent is preferably added in an amount of 900 to 20,000 parts by weight, more preferably 1,000 to 15,000 parts by weight per 100 parts by weight of the overall polymers.

While the NIR absorptive layer-forming composition is defined as comprising (A) a polymer comprising repeat units of at least one type selected from formulae (1) to (4), (B) an aromatic ring-bearing polymer, (C) a NIR absorbing dye, and (D) a solvent, all defined above, it preferably further comprises (E) at least one acid generator and (F) at least one crosslinker.

In the embodiment of the NIR absorptive layer-forming composition containing an acid generator and a crosslinker, crosslink formation of the polymers (A) and (B) can be promoted by bake following spin coating, leading to formation of a harder, denser layer. This prevents the NIR absorptive layer from being thinned or the NIR absorbing dye from being leached out of the layer when another layer is coated directly on the NIR absorptive layer.

In a preferred embodiment, the NIR absorptive layer-forming composition further comprises (G) at least one surfactant. When a NIR absorptive layer is formed by spin coating the NIR absorptive layer-forming composition, a certain combination of a polymer with a NIR absorbing dye may result in defective layer formation, failing in coverage of the entire wafer surface with a layer of a uniform thickness. The addition of a surfactant to the NIR absorptive layer-forming composition improves coating characteristics and obviates any film formation failure.

E) Acid Generator

The acid generator (E) has a function of promoting crosslinking reaction during layer formation. While the acid generators include those capable of generating acid through thermal decomposition and those capable of generating acid upon light exposure, either one may be used.

In the NIR absorptive layer-forming composition, there may be used a variety of acid generators including sulfonium salts, iodonium salts, ammonium salts, and diazomethanes. Typical acid generators are illustrated in JP-A 2008-083668. The preferred acid generators are onium salts having α-fluoro-substituted sulfonate as an anion including triethylammonium nonafluorobutanesulfonate, (p-methoxyphenylmethyl)dimethylphenylammonium trifluoro-methanesulfonate, bis(p-tert-butylphenyl)iodonium nonafluorobutanesulfonate, triphenylsulfonium trifluoromethanesulfonate, (p-tert-butoxyphenyl)diphenylsulfonium trifluoromethane-sulfonate, tris(p-tert-butoxyphenyl) sulfonium trifluoromethanesulfonate, trinaphthylsulfonium trifluoromethanesulfonate, cyclohexylmethyl(2-oxocyclohexyl)sulfonium trifluoromethane-sulfonate, (2-norbornyl) methyl(2-oxocyclohexyl)sulfonium trifluoro-methanesulfonate, and 1,2'-naphthylcarbonylmethyltetrahydrothiophenium triflate. The acid generators may be used alone or in admixture of two or more.

The acid generator is preferably added in an amount of 0.1 to 50 parts by weight, more preferably 0.5 to 40 parts by weight per 100 parts by weight of the overall solids, i.e., the total of components (A), (B) and (C) in the composition. At least 0.1 pbw of the acid generator may generate a sufficient amount of acid to promote crosslinking reaction whereas up to 50 pbw may obviate a risk that the acid will be leached out of the layer.

The NIR absorptive layer-forming composition forms a cured film through heat or acid-induced crosslinking reaction. To further enhance the crosslinking ability at this point, a conjugate base of strong acid is preferably used as the anion moiety of the acid generator. If the anion of the NIR absorbing dye is a conjugate base of weak acid such as a chloride, bromide, iodide or tosylate ion, it may undergo an exchange reaction with the anion of the acid generator whereby the acid generator may fail to exert its own function. This is due to a phenomenon that a conjugate base of strong acid tends to form an ion pair with an onium cation. Therefore, the NIR absorbing dye should preferably have an anion which is a conjugate base of strong acid having at least an equivalent strength to the acid generator used.

F) Crosslinker

The crosslinker (F) is any compound which functions to promote crosslinking reaction during film formation. Suitable crosslinkers which can be separately added herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. Acid anhydrides, oxazoline compounds, and compounds having a plurality of hydroxyl groups are also useful as the crosslinker. Typical crosslinkers are illustrated in JP-A 2009-098639. Preferred examples of the crosslinker include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof.

To the NIR absorptive layer-forming composition, the crosslinker is preferably added in an amount of 0 to 50 parts by weight, more preferably 1 to 40 parts by weight per 100 parts by weight of the total of components (A), (B) and (C). An appropriate amount of the crosslinker is effective for curing a layer. However, if the amount is more than 50 pbw, part of the crosslinker may be released as outgas upon film formation, causing contamination to the exposure apparatus. The crosslinkers may be used alone or in admixture of two or more.

G) Surfactant

In a preferred embodiment, the NIR absorptive layer-forming composition further comprises (G) a surfactant. Illustrative, non-limiting, examples of the surfactant (G) include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Jemco Co., Ltd.), Megaface F171, F172, F173, R08, R30, R90, and R94 (DIC Corp.), Fluorad FC-430, FC-431, FC-4430 and FC-4432 (3M Sumitomo Co., Ltd.), Asahiguard AG710, Surflon S-381, S-382, SC101, SC102, SC103, SC104, SC105, SC106, KH-10, KH-20, KH-30 and KH-40 (Asahi Glass Co., Ltd.), and Surfynol E1004 (Nissin Chemical Industry Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Kagaku Kogyo Co., Ltd.). Additional useful surfactants include partially fluorinated oxetane ring-opened polymers having the structural formula (surf-1).

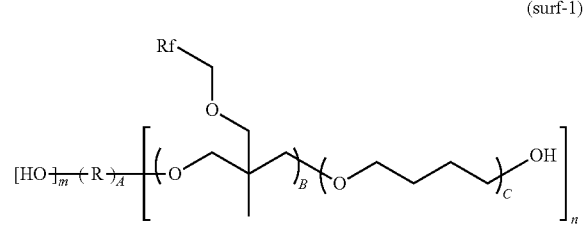

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

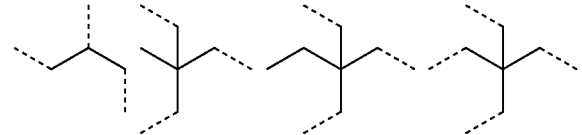

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

Of the foregoing surfactants, FC-4430, Surflon S-381, Surfynol E1004, KH-20, KH-30, and oxetane ring-opened polymers of formula (surf-1) are preferred. These surfactants may be used alone or in admixture.

To the NIR absorptive layer-forming composition, the surfactant is preferably added in an amount of up to 2 parts, more preferably up to 1 part by weight, relative to 100 parts by weight of the total of components (A), (B) and (C). When the surfactant is used, the amount is preferably at least 0.001 pbw, more preferably at least 0.01 pbw.

When the NIR absorptive layer-forming composition is coated, the resulting layer contains the dye capable of absorbing radiation in a wavelength range of 500 to 1,200 nm so that it may function as a layer for absorbing NIR radiation used in optical autofocus method.

Another embodiment of the invention is a multilayer film comprising a NIR absorptive layer which is formed typically on a substrate by coating the NIR absorptive layer-forming composition, and a photoresist layer which is formed typically on the NIR absorptive layer by coating a photoresist composition. In the practice of optical auto-focusing, the multilayer film prevents the NIR light transmitted by the resist layer from being reflected from the substrate and entering the focus detection system. This improves the accuracy of optical auto-focusing. Since the optical autofocus method used in the existing semiconductor fabrication site is applicable without substantial changes, the time taken for the method falls within a practically acceptable range.

The NIR absorptive layer is preferably used as an antireflective coating for exposure radiation used in optical lithography. Then the wafer layer stacking process currently used in the industry can be used without substantial modifications.

Due to thinning of resist layer and an etching selective ratio between resist layer and processable substrate, processing becomes more difficult. One current approach for obviating such difficulty is a trilayer process that uses a trilayer structure including a resist layer, a silicon-containing layer underneath the resist layer, and an underlayer (OPL) having a high carbon density and high etch resistance underneath the silicon-containing layer. On etching with oxygen gas, hydrogen gas or ammonia gas, a high etching selective ratio is established between the Si-containing layer and the underlayer, allowing the Si-containing layer to be thinned. Also the etching selective ratio between the single-layer resist layer and the Si-containing layer is relatively high, allowing the single-layer resist layer to be thinned. The reflection of exposure light may be effectively prevented by adjusting optical properties of these three layers.

When the NIR absorptive layer serves as the antireflective coating, it is most preferably used as the underlayer. In stacking the multilayer film, the NIR absorptive layer of the inventive composition includes a barrier layer of segregating polymer (A) at the surface, and this barrier prevents the NIR absorptive layer from being thinned or the NIR absorbing dye from being leached out of the layer when the layer is overlaid with another layer. Accordingly, exposure light used in the exposure of photoresist and NIR light used in focusing upon exposure can be controlled as designed, and any inconvenience in etch processing owing to a layer thickness loss can be avoided. Since the polymer (B) has an aromatic ring, the NIR absorptive layer has practically acceptable etch resistance.

The method of forming a NIR absorptive layer according to the invention is described. Like conventional photoresist layers, the NIR absorptive layer can be formed on a substrate by any suitable coating techniques including spin coating, roll coating, flow coating, dip coating, spray coating, and doctor coating. Once the NIR absorptive layer-forming composition is coated, the organic solvent is evaporated off and bake is preferably effected to promote crosslinking reaction in order to prevent intermixing with any overlying layer subsequently coated thereon. The bake is preferably at a temperature of 100 to 350° C. for a time of 10 to 300 seconds. While the thickness of the antireflective coating layer may be selected appropriate for enhancing the NIR absorbing effect, it preferably has a thickness of 10 to 300 nm, more preferably 20 to 250 nm.

Examples of the Si-containing layer within the multilayer film include Si-containing inorganic films formed by CVD, for example, a $SiO_2$ film (JP-A H07-183194) and a SiON film (JP-A H07-181688), and Si-containing films formed by spin coating, for example, a spin-on glass (SOG) film (JP-A H05-291208) and a crosslinked silsesquioxane film (JP-A 2005-520354). Polysilane films (JP-A H11-60735) are also useful. Of these, the $SiO_2$ and SiON films perform well as an etching mask when the underlying film is etched, but require a special equipment for film formation. In contrast, the SOG, crosslinked silsesquioxane and polysilane films can be formed simply by spin coating and heating, and these films are considered high in process efficiency.

The Si-containing layer of the multilayer film may be formed by coating and baking or CVD. Typical of the layer formed by the coating method is a crosslinked silsesquioxane film (JP-A 2005-520354). Typical of the layer formed by the CVD are silicon-containing inorganic films such as a $SiO_2$ film (JP-A H07-183194) and a SiON film (JP-A H07-181688). A polysiloxane base intermediate layer is preferably used as the silicon-containing intermediate layer in the trilayer process. Exemplary are silicon-containing intermediate layer films formed of the compositions described in JP-A 2004-310019, JP-A 2007-302873, and JP-A 2009-126940. An organic layer may intervene between the Si-containing intermediate layer and the resist layer. In this embodiment, the organic layer may be an antireflective coating layer. Although the thickness of the Si-containing layer is not particularly limited, it preferably has a thickness of 10 to 100 nm, and more preferably 20 to 80 nm.

The multilayer film includes a photoresist layer which is formed typically on the NIR absorptive layer by coating a photoresist composition. The photoresist composition may be any of well-known photoresist compositions as described, for example, in JP-A H09-73173, JP-A 2000-336121, and JP-A 2007-297590.

The resist layer may be formed by applying such a photoresist composition by any suitable coating techniques including spin coating, roll coating, flow coating, dip coating, spray coating, and doctor coating, and prebaking preferably on a hot plate at 50 to 150° C. for 1 to 10 minutes, more preferably at 60 to 140° C. for 1 to 5 minutes, thereby forming a layer of 0.01 to 2.0 μm thick.

In the event the immersion lithography using water is applied to the resist composition used herein, particularly in the absence of a resist protective layer, the resist composition may have added thereto a surfactant having a propensity to segregate at the resist surface after spin coating for achieving a function of minimizing water penetration or leaching. The preferred surfactant is a polymeric surfactant which is insoluble in water, but soluble in alkaline developer, and especially which is water repellent and enhances water slippage. Suitable polymeric surfactants are shown below.

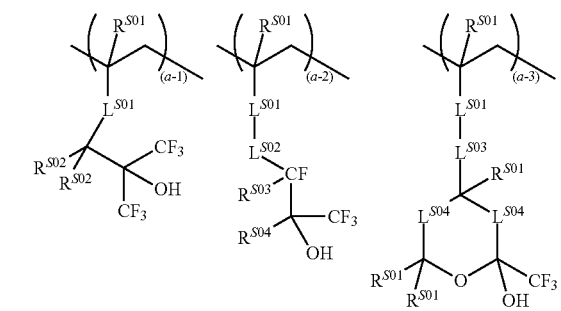

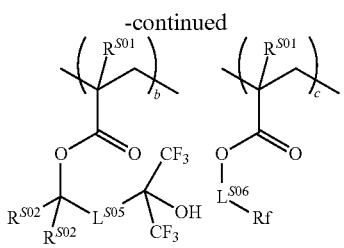

Herein $L^{S01}$ is each independently —C(=O)—O—, —O—, or —C(=O)-$L^{S07}$-C(=O)—O— wherein $L^{S07}$ is a straight, branched or cyclic $C_1$-$C_{10}$ alkylene group. $R^{S01}$ is each independently hydrogen, fluorine, methyl or trifluoromethyl. $R^{S02}$ is each independently hydrogen or a straight, branched or cyclic $C_1$-$C_{20}$ alkyl or fluoroalkyl group, or two $R^{S02}$ in a common unit may bond together to form a ring with the carbon atom to which they are attached, and in this event, they together represent a straight, branched or cyclic $C_2$-$C_{20}$ alkylene or fluoroalkylene group. $R^{S02}$ is fluorine or hydrogen, or $R^{S03}$ may bond with $L^{S02}$ in a common unit to form a $C_3$-$C_{10}$ non-aromatic ring with the carbon atom to which they are attached. $L^{S02}$ is a straight, branched or cyclic $C_1$-$C_6$ alkylene group in which at least one hydrogen atom may be substituted by a fluorine atom. $R^{S04}$ is a straight or branched $C_1$-$C_{10}$ alkyl group in which at least one hydrogen atom is substituted by a fluorine atom. Alternatively, $L^{S02}$ and $R^{S04}$ may bond together to form a non-aromatic ring with the carbon atoms to which they are attached, and in this event, the ring represents a trivalent organic group of 2 to 12 carbon atoms in total. $L^{S03}$ is a single bond or a $C_1$-$C_4$ alkylene. $L^{S04}$ is each independently a single bond, —O—, or —$CR^{S01}R^{S01}$—. $L^{S05}$ is a straight or branched $C_1$-$C_4$ alkylene group, or may bond with $R^{S02}$ within a common unit to form a $C_3$-$C_{10}$ non-aromatic ring with the carbon atom to which they are attached. $L^{S06}$ is methylene, 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. The subscripts (a-1), (a-2), (a-3), b and c are numbers in the range: $0\leq$(a-1)<1, $0\leq$(a-2)<1, $0\leq$(a-3)<1, 0<(a-1)+(a-2)+(a-3)<1, $0\leq$b<1, $0\leq$c<1, and 0<(a-1)+(a-2)+(a-3)+b+c$\leq$1.

In the resist composition, the polymeric surfactant is preferably formulated in an amount of 0.001 to 20 parts, and more preferably 0.01 to 10 parts by weight, per 100 parts by weight of the base resin. Reference should also be made to JP-A 2007-297590.

The multilayer film may include a resist protective layer so that it may be applied to the immersion lithography using water. The protective layer prevents any component from being leached out of the resist layer, thereby improving the water slip on the layer surface. The protective layer may preferably be formed of a base resin which is insoluble in water, but soluble in alkaline developer, for example, a polymer having an alcohol structure having a plurality of fluorine atoms substituted at β-position such as a polymer having 1,1,1,3,3,3-hexafluoro-2-propanol residue. Typically a protective layer-forming composition comprising such a base resin in a higher alcohol of at least 4 carbon atoms or an ether compound of 8 to 12 carbon atoms is used. The protective layer may be formed by spin coating the protective layer-forming composition onto a resist layer as prebaked, and prebaking the coating. The protective layer preferably has a thickness of 10 to 200 nm.

EXAMPLE

Synthesis Examples, Experiments, Examples, and Comparative Examples are given below by way of illustration of the invention although the invention is not limited thereby. For all polymers, a weight average molecular weight Mw is determined in tetrahydrofuran solvent by GPC versus polystyrene standards. The amount "pbw" is parts by weight. MAIB is dimethyl 2,2'-azobisisobutyrate. AIBN is 2,2'-azobisisobutyronitrile.

Synthesis Example 1

Polymer A1

In a nitrogen atmosphere, a flask was charged with 12.48 g of 1,1,1,3,3,3-hexafluoroisopropyl methacrylate, 7.52 g of glycidyl methacrylate, 0.731 g of MAIB, and 20.00 g of PGMEA to form a monomer solution A1. Another flask in a nitrogen atmosphere was charged with 10.00 g of PGMEA and heated at 80° C. while stirring. Thereafter, monomer solution A1 was added dropwise to the other flask over 4 hours. The solution was continuously stirred for 4 hours to effect polymerization while maintaining the temperature of 80° C. With the heat interrupted, the flask was allowed to cool down to room temperature. The polymerization solution was diluted with 16.67 g of PGMEA and added dropwise to a mixture of 64 g of water and 256 g of methanol being stirred, for precipitation. The polymer precipitate was collected by filtration, washed twice with a mixture of 24 g of water and 96 g of methanol, and vacuum dried at 50° C. for 20 hours, yielding 16.86 g of a polymer in white powder solid form, designated Polymer A1. The yield was 84%. Polymer A1 had a Mw of 16,800 and a dispersity Mw/Mn of 1.99. Upon $^{13}$C-NMR analysis, Polymer A1 had a copolymer compositional ratio of 48/52 mol %, expressed as (units derived from 1,1,1,3,3,3-hexafluoroisopropyl methacrylate)/(units derived from glycidyl methacrylate).

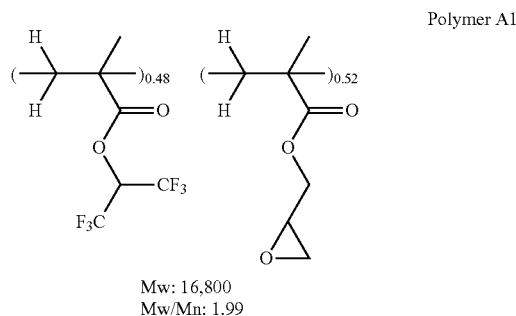

Polymer A1
Mw: 16,800
Mw/Mn: 1.99

Synthesis Example 2

Polymer A2

In a nitrogen atmosphere, a flask was charged with 12.67 g of 2,2,3,3,4,4,5,5-octafluoropentyl methacrylate, 7.33 g of glycidyl methacrylate, 0.648 g of MAIB, and 20.00 g of PGMEA to form a monomer solution A2. Another flask in a nitrogen atmosphere was charged with 10.00 g of PGMEA and heated at 80° C. while stirring. Thereafter, monomer solution A2 was added dropwise to the other flask over 4 hours. The solution was continuously stirred for 2 hours to effect polymerization while maintaining the temperature of 80° C. With the heat interrupted, the flask was allowed to cool down to room temperature. The polymerization solution was diluted with 16.67 g of PGMEA and added dropwise to a mixture of 64 g of water and 256 g of methanol being stirred, for precipitation. The polymer precipitate was collected by filtration, washed twice with a mixture of 24 g of water and 96 g of methanol, and vacuum dried at 50° C. for 20 hours, yielding 18.31 g of a polymer in white powder solid form, designated Polymer A2. The yield was 92%. Polymer A2 had a Mw of 20,900 and a dispersity Mw/Mn of 1.97. Upon $^{13}$C-NMR analysis, Polymer A1 had a copolymer compositional ratio of 47/53 mol %, expressed as (units from 2,2,3,3,4,4,5,5-octafluoropentyl methacrylate)/(units from glycidyl methacrylate).

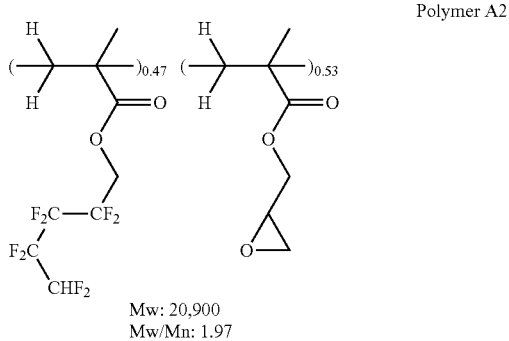

Polymer A2

Mw: 20,900
Mw/Mn: 1.97

Synthesis Example 3

Polymer A3

In a nitrogen atmosphere, a flask was charged with 67.19 g of 2,3,4,5,6-pentafluorostyrene, 32.81 g of glycidyl methacrylate, 0.947 g of AIBN, 7.50 g of methyl ethyl ketone (MEK), and 67.50 g of toluene to form a monomer solution A3. Another flask in a nitrogen atmosphere was charged with 7.50 g of MEK and 67.50 g of toluene and heated at 80° C. while stirring. Thereafter, monomer solution A3 was added dropwise to the other flask over 4 hours. The solution was continuously stirred for 4 hours to effect polymerization while maintaining the temperature of 80° C. With the heat interrupted, the flask was allowed to cool down to room temperature. The polymerization solution was added dropwise to 1,000 g of n-hexane being stirred, for precipitation. The polymer precipitate was collected by filtration, washed twice with 600 g of n-hexane, and vacuum dried at 60° C. for 20 hours, yielding 76.45 g of a polymer in white powder solid form, designated Polymer A3. The yield was 77%. Polymer A3 had a Mw of 22,200 and a dispersity Mw/Mn of 1.71. Upon $^{13}$C-NMR analysis, Polymer A3 had a copolymer compositional ratio of 58/42 mol %, expressed as (units from 2,3,4,5,6-pentafluorostyrene)/(units from glycidyl methacrylate).

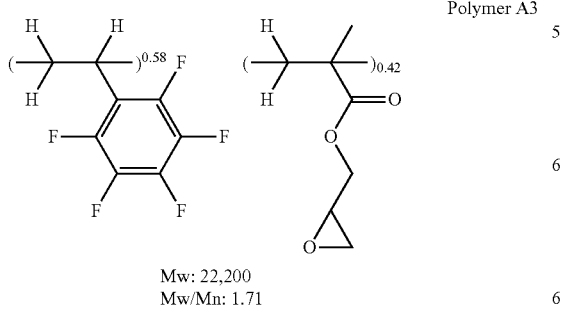

Polymer A3

Mw: 22,200
Mw/Mn: 1.71

Synthesis Example 4

Polymer A4

In a nitrogen atmosphere, a flask was charged with 8.12 g of 2,4-difluorobenzyl methacrylate, 6.44 g of 1,1,1-trifluoro-2-hydroxy-6-methyl-2-(trifluoromethyl)heptan-4-yl methacrylate, 5.44 g of glycidyl methacrylate, 0.157 g of AIBN, 1.50 g of MEK, and 13.50 g of toluene to form a monomer solution A4. Another flask in a nitrogen atmosphere was charged with 1.50 g of MEK and 13.50 g of toluene and heated at 80° C. while stirring. Thereafter, monomer solution A4 was added dropwise to the other flask over 4 hours. The solution was continuously stirred for 4 hours to effect polymerization while maintaining the temperature of 80° C. With the heat interrupted, the flask was allowed to cool down to room temperature. The polymerization solution was added dropwise to 200 g of n-hexane being stirred, for precipitation. The polymer precipitate was collected by filtration, washed twice with 120 g of n-hexane, and vacuum dried at 50° C. for 20 hours, yielding 16.74 g of a polymer in white powder solid form, designated Polymer A4. The yield was 84%. Polymer A4 had a Mw of 30,800 and a dispersity Mw/Mn of 2.14. Upon $^{13}$C-NMR analysis, Polymer A4 had a copolymer compositional ratio of 40/19/41 mol %, expressed as (units from 2,4-difluorobenzyl methacrylate)/(units from 1,1,1-trifluoro-2-hydroxy-6-methyl-2-(trifluoromethyl)heptan-4-yl methacrylate)/(units from glycidyl methacrylate).

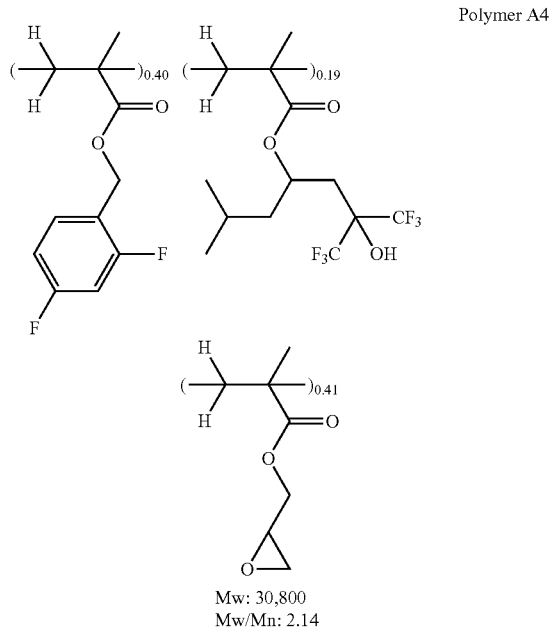

Polymer A4

Mw: 30,800
Mw/Mn: 2.14

Synthesis Example 5

Polymer A5

In a nitrogen atmosphere, a flask was charged with 12.62 g of 1,1,1-trifluoro-2-isopropylcarbonyloxy-3-methyl-2-trifluoromethylbutan-3-yl methacrylate, 7.38 g of glycidyl methacrylate, 0.598 g of MAIB, and 20.00 g of PGMEA to form a monomer solution A5. Another flask in a nitrogen atmosphere was charged with 10.00 g of PGMEA and heated at 80° C. while stirring. Thereafter, monomer solution A5 was added dropwise to the other flask over 4 hours. The solution was continuously stirred for 4 hours to effect polymerization while maintaining the temperature of 80° C. With the heat interrupted, the flask was allowed to cool down to room temperature. The polymerization solution was diluted with 16.67 g of PGMEA and added dropwise to a mixture of 64 g of water and 256 g of methanol being stirred, for precipitation. The polymer precipitate was collected by filtration, washed twice with a mixture of 24 g of water and 96 g of methanol, and vacuum dried at 50° C. for 20 hours, yielding 18.35 g of a polymer in white powder solid form, designated Polymer A5. The yield was 92%. Polymer A5 had a Mw of 18,300 and a dispersity Mw/Mn of 1.94. Upon $^{13}$C-NMR analysis, Polymer A5 had a copolymer compositional ratio of 38/62 mol %, expressed as (units from 1,1,1-trifluoro-2-isopropylcarbonyloxy-3-methyl-2-trifluoromethylbutan-3-yl methacrylate)/(units from glycidyl methacrylate).

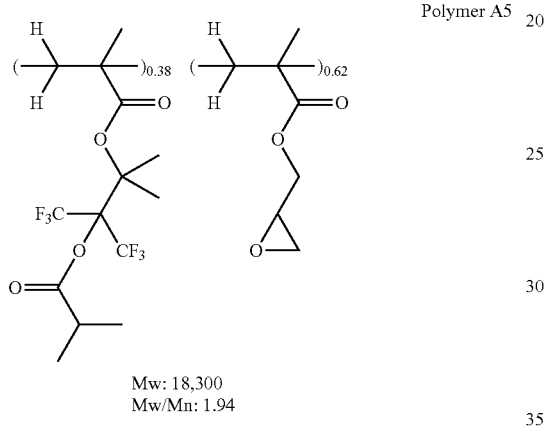

Mw: 18,300
Mw/Mn: 1.94

Synthesis Example 6

Polymer B1

In a nitrogen atmosphere, a flask was charged with 56.32 g of 3,4-epoxycyclohexylmethyl methacrylate, 43.68 g of acenaphthylene, 3.965 g of MAIB, and 100.00 g of PGMEA to form a monomer solution B1. Another flask in a nitrogen atmosphere was charged with 50.00 g of PGMEA and heated at 80° C. while stirring. Thereafter, monomer solution B1 was added dropwise to the other flask over 2 hours. The solution was continuously stirred for 6 hours to effect polymerization while maintaining the temperature of 80° C. With the heat interrupted, the flask was allowed to cool down to room temperature. The polymerization solution was diluted with 150.00 g of PGMEA and added dropwise to 1,600 g of methanol being stirred, for precipitation. The polymer precipitate was collected by filtration, washed twice with 600 g of methanol, and vacuum dried at 50° C. for 20 hours, yielding 94.90 g of a polymer in white powder solid form, designated Polymer B1. The yield was 95%. Polymer B1 had a Mw of 12,100 and a dispersity Mw/Mn of 1.97. Upon $^{13}$C-NMR analysis, Polymer B1 had a copolymer compositional ratio of 48/52 mol %, expressed as (units derived from 3,4-epoxycyclohexylmethyl methacrylate)/(units derived from acenaphthylene).

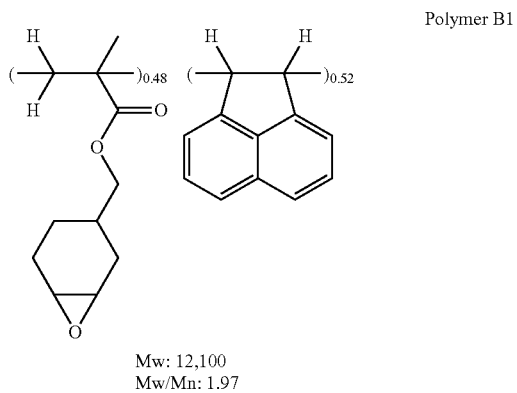

Mw: 12,100
Mw/Mn: 1.97

Synthesis Example 7

Polymer B2

In a nitrogen atmosphere, a flask was charged with 46.23 g of 3,4-epoxycyclohexylmethyl methacrylate, 53.77 g of acenaphthylene, 4.068 g of MAIB, and 100.00 g of PGMEA to form a monomer solution B2. Another flask in a nitrogen atmosphere was charged with 50.00 g of PGMEA and heated at 80° C. while stirring. Thereafter, monomer solution B2 was added dropwise to the other flask over 2 hours. The solution was continuously stirred for 6 hours to effect polymerization while maintaining the temperature of 80° C. With the heat interrupted, the flask was allowed to cool down to room temperature. The polymerization solution was diluted with 150.00 g of PGMEA and added dropwise to 1,600 g of methanol being stirred, for precipitation. The polymer precipitate was collected by filtration, washed twice with 600 g of methanol, and vacuum dried at 50° C. for 20 hours, yielding 91.04 g of a polymer in white powder solid form, designated Polymer B2. The yield was 91%. Polymer B2 had a Mw of 12,100 and a dispersity Mw/Mn of 2.03. Upon $^{13}$C-NMR analysis, Polymer B2 had a copolymer compositional ratio of 36/64 mol %, expressed as (units from 3,4-epoxycyclohexylmethyl methacrylate)/(units from acenaphthylene).

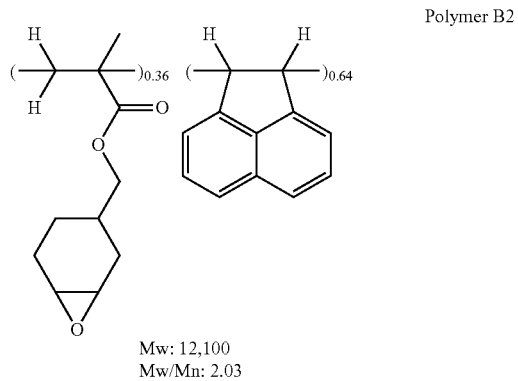

Mw: 12,100
Mw/Mn: 2.03

Synthesis Example 8

Polymer B3

In a nitrogen atmosphere, a flask was charged with 35.59 g of 3,4-epoxycyclohexylmethyl methacrylate, 64.41 g of acenaphthylene, 4.176 g of MAIB, and 100.00 g of PGMEA to form a monomer solution B3. Another flask in a nitrogen atmosphere was charged with 50.00 g of PGMEA and heated at 80° C. while stirring. Thereafter, monomer solution B3 was added dropwise to the other flask over 2 hours. The solution was continuously stirred for 6 hours to effect polymerization while maintaining the temperature of 80° C. With the heat interrupted, the flask was allowed to cool down to room temperature. The polymerization solution was diluted with 150.00 g of PGMEA and added dropwise to 1,600 g of methanol being stirred, for precipitation. The polymer precipitate was collected by filtration, washed twice with 600 g of methanol, and vacuum dried at 50° C. for 20 hours, yielding 88.11 g of a polymer in white powder solid form, designated Polymer B3. The yield was 88%. Polymer B3 had a Mw of 10,800 and a dispersity Mw/Mn of 1.90. Upon $^{13}$C-NMR analysis, Polymer B3 had a copolymer compositional ratio of 26/74 mol %, expressed as (units from 3,4-epoxycyclohexylmethyl methacrylate)/(units from acenaphthylene).

Polymer B3

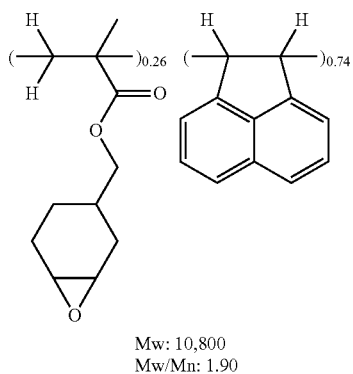

Mw: 10,800
Mw/Mn: 1.90

Synthesis Example 9

Polymer B4

A 1-L flask was charged with 95 g of 9,9-bis(4-hydroxyphenyl)fluorene, 7 g of 37% formalin, 5 g of p-toluenesulfonic acid, and 200 g of dioxane, which were heated and stirred at 100° C. for 24 hours. Methyl isobutyl ketone, 500 ml, was added to the reaction solution, which was washed with water to remove the catalyst and metal impurities. The solvent was distilled off in vacuum, yielding a polymer B4. Polymer B4 had a Mw of 9,500 and a dispersity Mw/Mn of 3.90.

Polymer B4

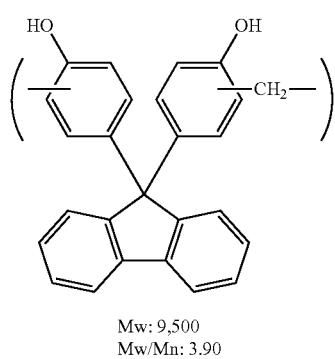

Mw: 9,500
Mw/Mn: 3.90

Synthesis Example 10

Polymer B5

Polymer B5 is a poly(4-hydroxystyrene) purchased from Sigma Aldrich. It has a Mw of 11,000.

Polymer B5

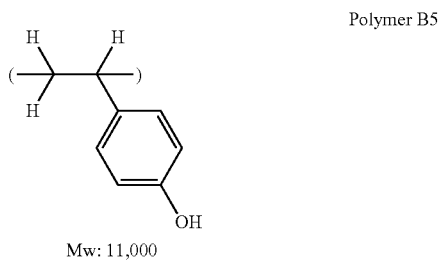

Mw: 11,000

Synthesis Example 11

NIR-Absorbing Dye C1

NIR-absorbing dye C1 is 3-butyl-2-(2-{3-[2-(3-butyl-1,1-dimethyl-1H-benzo[e]indol-2(3H)-ylidene)ethylidene]-2-(phenylsulfonyl)cyclohex-1-en-1-yl}ethenyl)-1,1-dimethyl-1H-benzo[e]indol-3-ium bis(trifluoromethylsulfonyl)imide which is commercially available. Its structure is shown below.

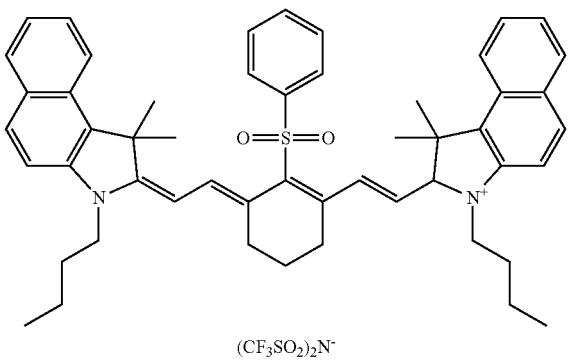 [SMILES: CCCCN1/C(=C/C=C2\CCCC(/C=C/C3[NH+](CCCC)c4ccc5ccccc5c4C3(C)C)=C2S(=O)(=O)c2ccccc2)C(C)(C)c2c1ccc1ccccc21 ; "(CF3SO2)2N-"]

Synthesis Example 12

Preparation of NIR-Absorbing Dye C2

NIR-absorbing dye C2 is 3-butyl-2-(2-{3-[2-(3-butyl-1,1-dimethyl-1H-benzo[e]indol-2(3H)-ylidene)ethylidene]-2-(phenylsulfonyl)cyclopent-1-en-1-yl}ethenyl)-1,1-dimethyl-1H-benzo[e]indol-3-ium bis(trifluoromethylsulfonyl) imide. It was prepared by the following procedure.

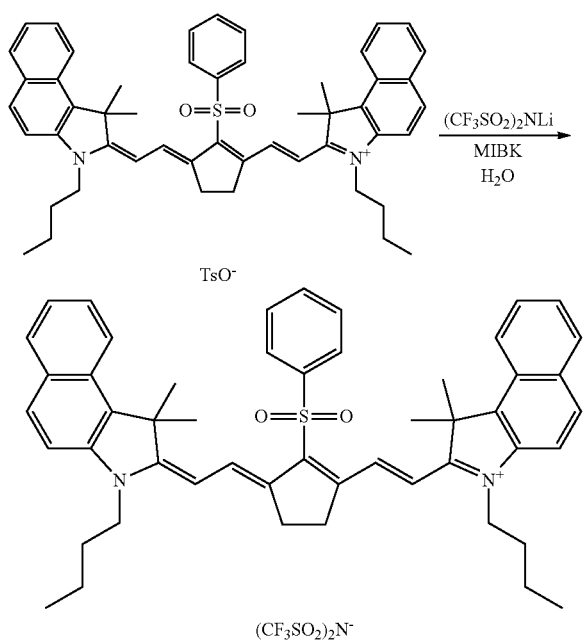

A mixture of 2.87 g (3 mmol) of 3-butyl-2-(2-{3-[(2-(3-butyl-1,1-dimethyl-1H-benzo[e]indol-2(3H)-ylidene)-ethylidene]-2-(phenylsulfonyl)cyclopent-1-en-1-yl}ethenyl)-1,1-dimethyl-1H-benzo[e]indol-3-ium p-toluenesulfonate, 1.31 g (4.5 mmol) of lithium bis(trifluoromethanesulfonyl)imide, 40 g of water, and 40 g of methyl isobutyl ketone was stirred for 8 hours at room temperature, whereupon the organic layer was taken out. The organic layer was combined with 0.43 g (1.5 mmol) of lithium bis(trifluoromethanesulfonyl)imide and 40 g of water and stirred overnight, whereupon the organic layer was taken out. The organic layer was washed with water and concentrated in vacuum. Diisopropyl ether was added to the residue for recrystallization. The crystal was collected and dried in vacuum, obtaining the target compound, 3-butyl-2-(2-{3-[2-(3-butyl-1,1-dimethyl-1H-benzo[e]indol-2(3H)-ylidene)ethylidene]-2-(phenylsulfonyl)cyclopent-1-en-1-yl}ethenyl)-1,1-dimethyl-1H-benzo[e]indol-3-ium bis(trifluoromethylsulfonyl)imide. Brown crystal, 2.9 g, yield 87%.

Figure 2:
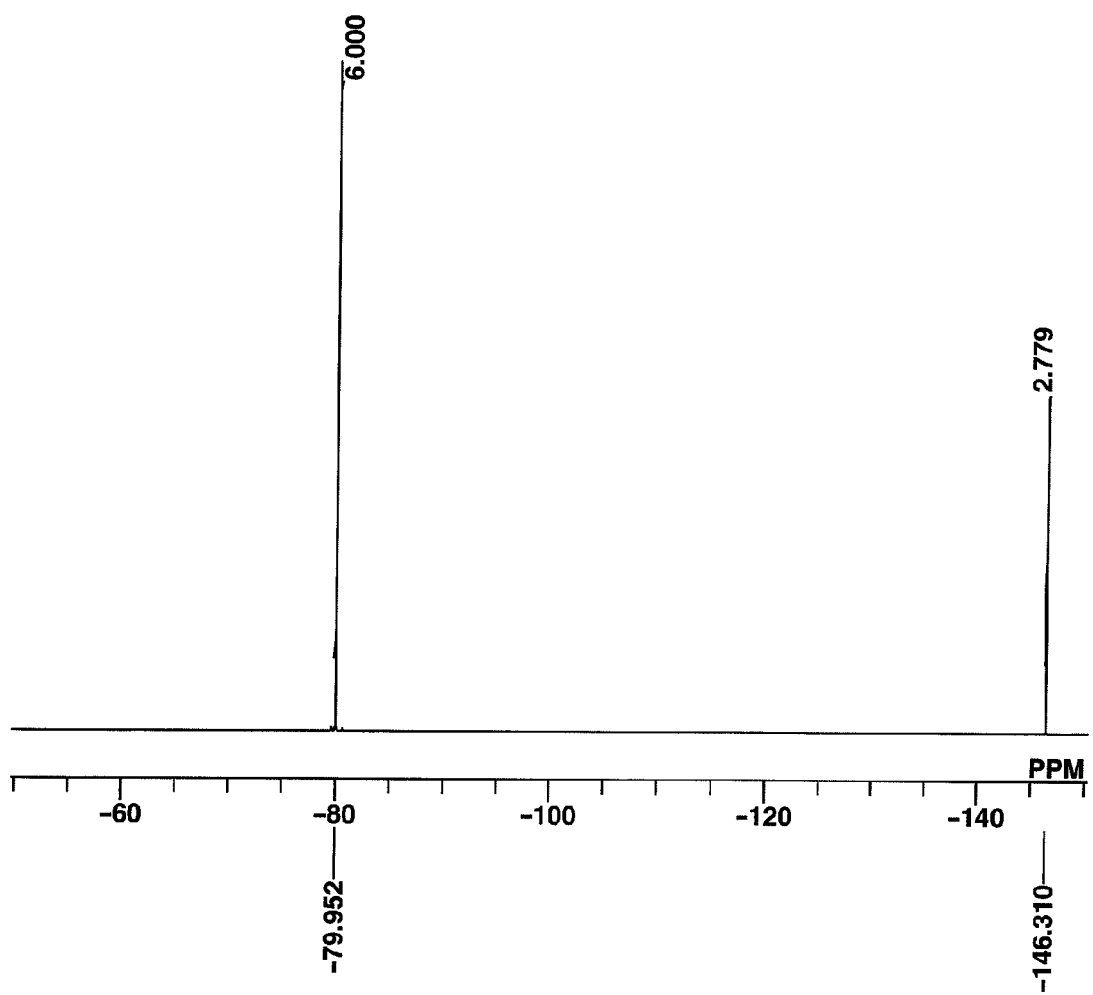
FIG. 2 is a $^{19}$F-NMR/DMSO-$d_6$ spectrum of NIR absorbing dye C2 in Synthesis Example 12.

The compound was analyzed by infrared absorption and nuclear magnetic resonance spectroscopies. The spectral data are shown below. The NMR spectra ($^1$H-NMR and $^{19}$F-NMR/DMSO-$d_6$) are shown in FIGS. 1 and 2. It is noted that in $^1$H-NMR analysis, traces of residual solvents (diisopropyl ether, methyl isobutyl ketone, water) were observed. From the data of $^1$H-NMR and $^{19}$F-NMR spectroscopies using 1,2,4,5-tetrafluoro-3,6-dimethylbenzene as the internal standard, an anion/cation ratio was computed to be 1.00/0.99.

Infrared absorption spectrum IR (KBr)
  3432, 2961, 2933, 2873, 1624, 1599, 1584, 1536, 1503, 1460, 1441, 1432, 1416, 1387, 1352, 1280, 1228, 1182, 1166, 1137, 1102, 1061, 1013, 958, 922, 897, 864, 832, 808, 786, 748, 725, 680, 651, 616, 588, 569, 553, 534, 525, 511 cm$^{-1}$ Time-of-flight mass spectroscopy (TOF-MS); MALDI
  Positive M$^+$759 (corresponding to $C_{51}H_{55}N_2O_2S$)
  Negative M$^+$279 (corresponding to $C_2F_6O_4NS_2$)

Experiments 1 to 3

Evaluation of Dry Etch Resistance

Polymer B1, B2 or B3 was mixed with NIR-absorbing dye C1, an acid generator (AG1), a surfactant FC-4430 (3M Sumitomo Co., Ltd.), and a solvent in accordance with the formulation shown in Table 1. The compositions were filtered through a Teflon® filter with a pore size of 0.2 μm. Each of the resulting coating solutions (Experiments 1 to 3) was applied onto a silicon substrate and baked at 195° C. for 60 seconds to form a film for dry etching test.

Using a dry etching apparatus TE-8500P (Tokyo Electron Ltd.), the film was etched with CHF$_3$/CF$_4$ gas under the following conditions.

| Chamber pressure | 300 mTorr |
|---|---|
| RF power | 1000 W |
| Gap | 9 mm |
| CHF$_3$ gas flow rate | 50 mL/min |
| CF$_4$ gas flow rate | 50 mL/min |
| He gas flow rate | 200 mL/min |
| O$_2$ gas flow rate | 7 mL/min |
| Time | 60 sec |

A film thickness was measured before and after etching. The results are also shown in Table 1.

TABLE 1

| | | Polymer (pbw) | NIR-absorbing dye (pbw) | Acid generator (pbw) | Surfactant (pbw) | Organic solvent (pbw) | Film thickness loss by CHF$_3$/CF$_4$ gas etching (nm) |
|---|---|---|---|---|---|---|---|
| Experiment | 1 | B1 (67) | C1 (33) | AG1 (5) | FC-4430 (0.1) | PGMEA (150) cyclohexanone (1,348) | 105 |
| | 2 | B2 (67) | C1 (33) | AG1 (5) | FC-4430 (0.1) | PGMEA (150) cyclohexanone (1,348) | 100 |
| | 3 | B3 (67) | C1 (33) | AG1 (5) | FC-4430 (0.1) | PGMEA (150) cyclohexanone (1,348) | 95 |

In Table 1, acid generator AG1 is triethylammonium perfluorobutanesulfonate.

Experiments 4 and 5

Evaluation of Solvent Resistance

Polymer B1 or B3 was mixed with NIR-absorbing dye C1, an acid generator (AG1), a surfactant FC-4430 (3M Sumitomo Co., Ltd.), and a solvent in accordance with the formulation shown in Table 2. The compositions were filtered through a Teflon® filter with a pore size of 0.2 μm. Each of the resulting coating solutions (Experiments 4 and 5) was applied onto a silicon substrate and baked at 195° C. for 60 seconds to form a NIR-absorptive film for a solvent resistance test.

Figure 3:
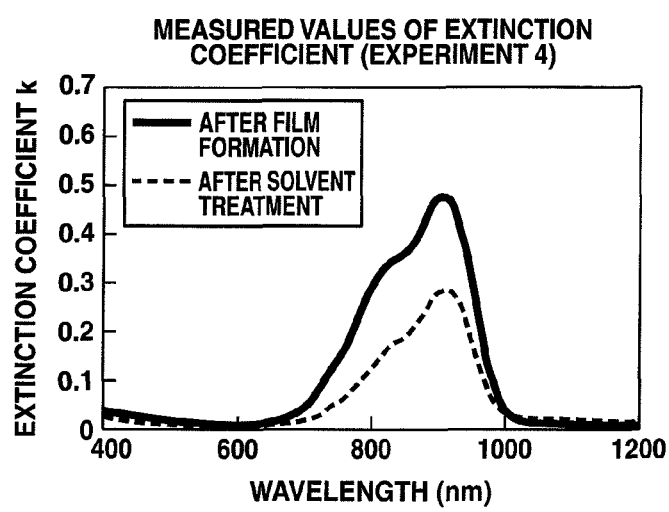
FIG. 3 is a diagram showing the extinction coefficient (k) over a NIR light range (400 to 1,200 nm) of a NIR-absorptive film in Experiment 4 before and after solvent treatment.
Figure 4:
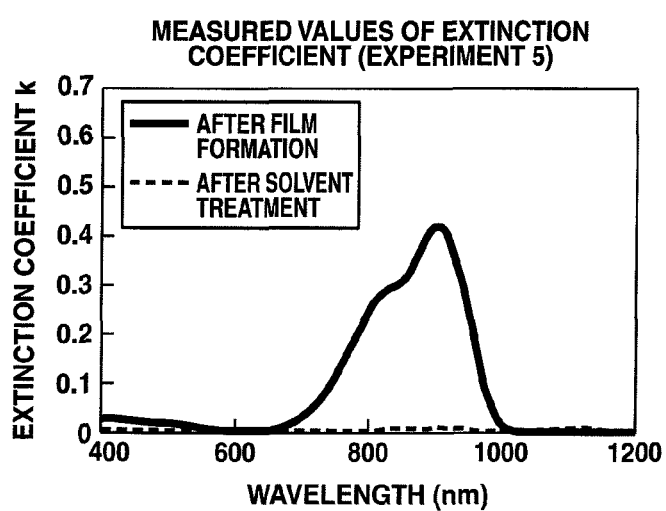
FIG. 4 is a diagram showing the extinction coefficient (k) over a NIR light range (400 to 1,200 nm) of a NIR-absorptive film in Experiment 5 before and after solvent treatment.

A mixture of n-butyl acetate and γ-butyrolactone in a weight ratio of 30:70 was spin coated onto the film, followed by baking at 100° C. for 30 seconds. A difference in film thickness before and after the solvent treatment was determined. The results are also shown in Table 2. For each film before and after the solvent treatment, an extinction coefficient (k) was measured over a NIR light range of 400 to 1,200 nm, with the results shown in FIGS. 3 and 4. FIG. 3 shows the measured k values of Experiment 4 after the film formation and after the solvent treatment. FIG. 4 shows the measured k values of Experiment 5 after the film formation and after the solvent treatment.

be involved in stacking films one on another causes the film to lose its thickness (Table 2) and the NIR absorbing dye to be leached out of the film (FIGS. 3 and 4). The film encounters a contradictory choice between the two desired properties, etch resistance and solvent resistance.

Examples 1 to 14 and Comparative Examples 1 to 8

Measurement of Contact Angle of Polymer Film

Polymers A1 to A5, Polymers B3 to B5, NIR-absorbing dye C2, an acid generator (AG1), and a crosslinker (CR1) were mixed in a solvent in accordance with the formulation shown in Table 3. Each composition was filtered through a Teflon® filter with a pore size of 0.2 μm. Each of the resulting coating solutions (Examples 1 to 14 and Comparative Examples 1 to 8) was coated onto a silicon substrate and

TABLE 2

|  | | Polymer (pbw) | NIR-absorbing dye (pbw) | Acid generator (pbw) | Surfactant (pbw) | Organic solvent (pbw) | Difference in film thickness by solvent treatment (nm) |
|---|---|---|---|---|---|---|---|
| Experiment | 4 | B1 (67) | C1 (33) | AG1 (5) | FC-4430 (0.1) | PGMEA (150) Cyclohexanone (1,348) | 27 |
|  | 5 | B3 (67) | C1 (33) | AG1 (5) | FC-4430 (0.1) | PGMEA (150) cyclohexanone (1,348) | 56 |

In Table 2, acid generator AG1 is triethylammonium perfluorobutanesulfonate.

Tables 1 and 2 and FIGS. 3 and 4 demonstrate that with respect to the use of a polymer comprising repeat units for providing etch resistance and repeat units of the structure capable of crosslinking reaction, a trial to seek for etch resistance needs to reduce an incorporation rate of the structure capable of crosslinking reaction, resulting in a film losing solvent resistance. That is, the solvent treatment which may baked at 195° C. for 60 seconds in Example 1 to 14 and Comparative Examples 1, 2, 5, 7, at 180° C. for 60 seconds in Comparative Examples 3 and 4, at 200° C. for 60 seconds in Comparative Example 6, or at 130° C. for 60 seconds and then at 220° C. for 120 seconds in Comparative Example 8 to form a coating film. A contact angle with water of the film was measured by using a contact angle meter Drop Master 500 (Kyowa Interface Science Co., Ltd.) and applying 5 μL of water onto the film. The results are shown in Table 3.

TABLE 3

|  | | | Polymer (pbw) | NIR-absorbing dye (pbw) | Acid generator (pbw) | Crosslinker (pbw) | Surfactant (pbw) | Organic solvent (pbw) | Contact angle (deg.) |
|---|---|---|---|---|---|---|---|---|---|
| Comparative Example | 1 | | A1 (100) | — | AG1 (0) | CR1 (0) | FC-4430 (0) | PGMEA (0) cyclohexanone (1,470) | 95 |
| | 2 | | A2 (100) | — | AG1 (0) | CR1 (0) | FC-4430 (0) | PGMEA (0) cyclohexanone (1,470) | 87 |
| | 3 | | A3 (100) | — | AG1 (0) | CR1 (0) | FC-4430 (0) | PGMEA (2,400) cyclohexanone (0) | 89 |
| | 4 | | A4 (100) | — | AG1 (0) | CR1 (0) | FC-4430 (0) | PGMEA (2,400) cyclohexanone (0) | 89 |
| | 5 | | A5 (100) | — | AG1 (0) | CR1 (0) | FC-4430 (0) | PGMEA (0) cyclohexanone (1,470) | 88 |
| | 6 | | B3 (100) | — | AG1 (0) | CR1 (0) | FC-4430 (0) | PGMEA (0) cyclohexanone (1,470) | 72 |
| | 7 | | B4 (100) | — | AG1 (0) | CR1 (0) | FC-4430 (0) | PGMEA (337) cyclohexanone (1,130) | 56 |
| | 8 | | B5 (100) | — | AG1 (0) | CR1 (0) | FC-4430 (0) | PGMEA (2,400) cyclohexanone (0) | 44 |
| Example | 1 | | A1 (6.7) B3 (60.3) | C2 (33) | AG1 (2) | CR1 (3) | FC-4430 (0.1) | PGMEA (148) cyclohexanone (1,332) | 95 |
| | 2 | | A1 (6.7) B4 (60.3) | C2 (33) | AG1 (2) | CR1 (3) | FC-4430 (0.1) | PGMEA (203) cyclohexanone (1,275) | 95 |
| | 3 | | A1 (6.7) B5 (60.3) | C2 (33) | AG1 (2) | CR1 (3) | FC-4430 (0.1) | PGMEA (148) cyclohexanone (1,332) | 95 |
| | 4 | | A2 (6.7) | C2 | AG1 | CR1 | FC-4430 | PGMEA (148) | 86 |

TABLE 3-continued

| | Polymer (pbw) | NIR-absorbing dye (pbw) | Acid generator (pbw) | Crosslinker (pbw) | Surfactant (pbw) | Organic solvent (pbw) | Contact angle (deg.) |
|---|---|---|---|---|---|---|---|
| | B3 (60.3) | (33) | (2) | (3) | (0.1) | cyclohexanone (1,332) | |
| 5 | A2 (6.7) | C2 | AG1 | CR1 | FC-4430 | PGMEA (203) | 87 |
| | B4 (60.3) | (33) | (2) | (3) | (0.1) | cyclohexanone (1,275) | |
| 6 | A2 (6.7) | C2 | AG1 | CR1 | FC-4430 | PGMEA (148) | 87 |
| | B5 (60.3) | (33) | (2) | (3) | (0.1) | cyclohexanone (1,332) | |
| 7 | A3 (6.7) | C2 | AG1 | CR1 | FC-4430 | PGMEA (148) | 86 |
| | B3 (60.3) | (33) | (2) | (3) | (0.1) | cyclohexanone (1,332) | |
| 8 | A3 (6.7) | C2 | AG1 | CR1 | FC-4430 | PGMEA (203) | 87 |
| | 84 (60.3) | (33) | (2) | (3) | (0.1) | cyclohexanone (1,275) | |
| 9 | A3 (6.7) | C2 | AG1 | CR1 | FC-4430 | PGMEA (148) | 88 |
| | B5 (60.3) | (33) | (2) | (3) | (0.1) | cyclohexanone (1,332) | |
| 10 | A4 (6.7) | C2 | AG1 | CR1 | FC-4430 | PGMEA (203) | 87 |
| | B4 (60.3) | (33) | (2) | (3) | (0.1) | cyclohexanone (1,275) | |
| 11 | A4 (6.7) | C2 | AG1 | CR1 | FC-4430 | PGMEA (148) | 87 |
| | B5 (60.3) | (33) | (2) | (3) | (0.1) | cyclohexanone (1,332) | |
| 12 | A5 (6.7) | C2 | AG1 | CR1 | FC-4430 | PGMEA (148) | 88 |
| | B3 (60.3) | (33) | (2) | (3) | (0.1) | cyclohexanone (1,332) | |
| 13 | A5 (6.7) | C2 | AG1 | CR1 | FC-4430 | PGMEA (203) | 89 |
| | B4 (60.3) | (33) | (2) | (3) | (0.1) | cyclohexanone (1,275) | |
| 14 | A5 (6.7) | C2 | AG1 | CR1 | FC-4430 | PGMEA (148) | 89 |
| | B5 (60.3) | (33) | (2) | (3) | (0.1) | cyclohexanone (1,332) | |

In Table 3, acid generator AG1 is triethylammonium perfluorobutanesulfonate, and crosslinker CR1 is tetramethoxymethyl glycoluril.

It is seen from Table 3 that the films formed of Polymers A1 to A5 comprising repeat units of at least one type selected from formulae (1) to (4) (Comparative Examples 1 to 5) have a larger contact angle than the films formed of Polymers B3 to B5 (Comparative Examples 6 to 8). The films formed of a mixture of one of Polymers A1 to A5 and one of Polymers B3 to B5 (Examples 1 to 14) have a contact angle which is as large as the corresponding one of Polymers A1 to A5 added. These results demonstrate that the films include a layer of Polymers A1 to A5 segregated on their surface.

Examples 15 to 17 and Comparative Example 9

Evaluation of Solvent Resistance

Polymer A1, NIR-absorbing dye C1, an acid generator (AG1), and a surfactant FC-4430 (3M Sumitomo Co., Ltd.) were mixed in a solvent in accordance with the formulation shown in Table 4. Each composition was filtered through a Teflon® filter with a pore size of 0.2 μm. Each of the resulting coating solutions (Example 15 and Comparative Example 9) was coated onto a silicon substrate and baked at 195° C. for 60 seconds to form a NIR absorptive film.

Figure 5:
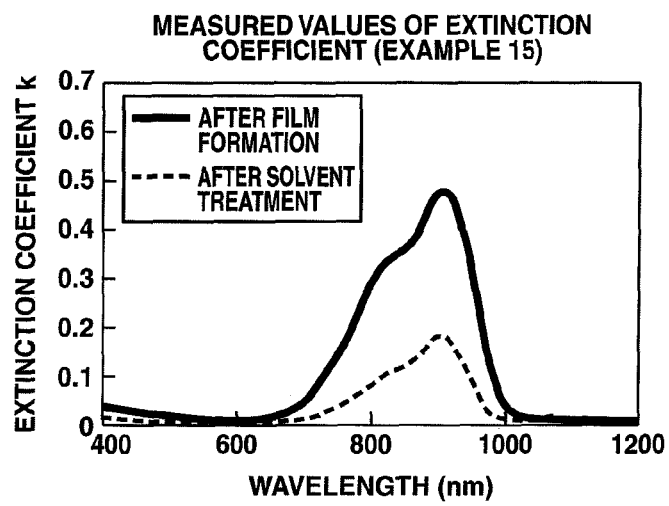
FIG. 5 is a diagram showing the extinction coefficient (k) over a NIR light range (400 to 1,200 nm) of a NIR-absorptive film in Example 15 before and after solvent treatment.
Figure 6:
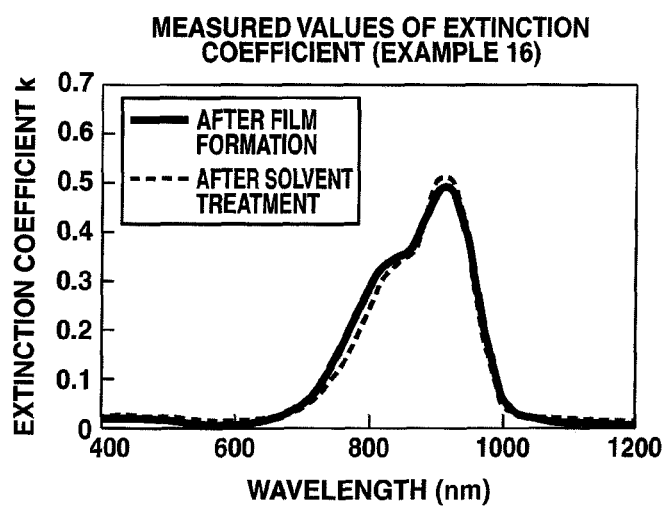
FIG. 6 is a diagram showing the extinction coefficient (k) over a NIR light range (400 to 1,200 nm) of a NIR-absorptive film in Example 16 before and after solvent treatment.
Figure 7:
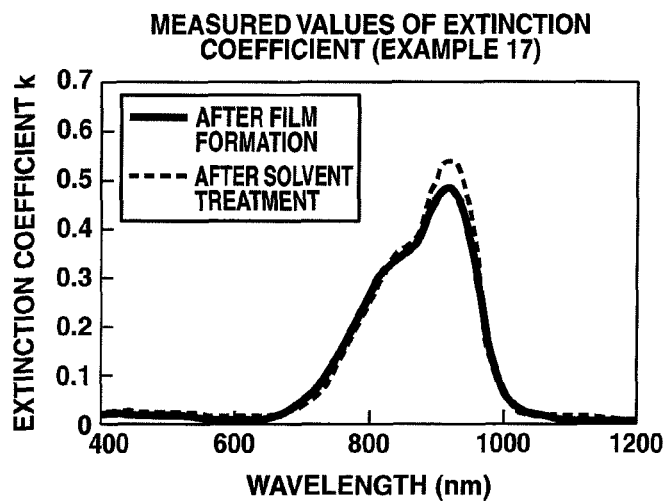
FIG. 7 is a diagram showing the extinction coefficient (k) over a NIR light range (400 to 1,200 nm) of a NIR-absorptive film in Example 17 before and after solvent treatment.
Figure 8:
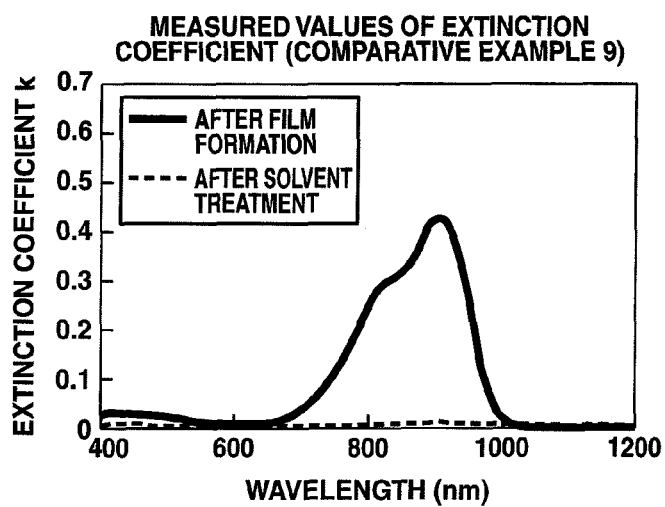
FIG. 8 is a diagram showing the extinction coefficient (k) over a NIR light range (400 to 1,200 nm) of a NIR-absorptive film in Comparative Example 9 before and after solvent treatment.

A mixture of n-butyl acetate and γ-butyrolactone in a weight ratio of 30:70 was spin coated onto the film, followed by baking at 100° C. for 30 seconds. A difference in film thickness before and after the solvent treatment was determined. The results are also shown in Table 4. For each film before and after the solvent treatment, an extinction coefficient (k) was measured over a NIR light range of 400 to 1,200 nm, with the results shown in FIGS. 5 to 8. FIG. 5 shows the measured k values of Example 15 after the film formation and after the solvent treatment. FIG. 6 shows the measured k values of Example 16 after the film formation and after the solvent treatment. FIG. 7 shows the measured k values of Example 17 after the film formation and after the solvent treatment. FIG. 8 shows the measured k values of Comparative Example 9 after the film formation and after the solvent treatment.

TABLE 4

| | | Polymer (pbw) | NIR-absorbing dye (pbw) | Acid generator (pbw) | Surfactant (pbw) | Organic solvent (pbw) | Difference in film thickness by solvent treatment (nm) |
|---|---|---|---|---|---|---|---|
| Example | 15 | A1 (6.7) | C1 | AG1 | FC-4430 | PGMEA (157) | 41 |
| | | B3 (67) | (33) | (5) | (0.1) | cyclohexanone (1,417) | |
| | 16 | A1 (13.4) | C1 | AG1 | FC-4430 | PGMEA (167) | 2 |
| | | B3 (67) | (33) | (5) | (0.1) | cyclohexanone (1,502) | |
| | 17 | A1 (20.1) | C1 | AG1 | FC-4430 | PGMEA (176) | 0 |
| | | B3 (67) | (33) | (5) | (0.1) | cyclohexanone (1,587) | |
| Comparative Example | 9 | B3 (67) | C1 (33) | AG1 (5) | FC-4430 (0.1) | PGMEA (150) cyclohexanone (1,348) | 56 |

In Table 4, acid generator AG1 is triethylammonium perfluorobutanesulfonate.

It is seen from Table 4 and FIGS. 5 to 8 that by adding Polymer A1 to the film having poor solvent resistance, but good etch resistance (Comparative Example 9, see also Experiment 3), the film can be endowed with solvent resistance (Examples 15 to 17). The film containing Polymer A1 meets both solvent resistance and etch resistance in a compatible way.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

The invention claimed is:

1. A near-infrared absorptive layer-forming composition comprising
   (A) at least one polymer comprising
      repeat units having an oxirane structure and/or an oxetane structure, said units capable of undergoing crosslinking reaction with the aid of heat or acid, and
      repeat units of at least one type selected from the general formula (2)

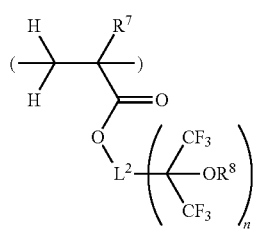

wherein
   $R^7$ is hydrogen, methyl, fluorine or trifluoromethyl,
   $R^8$ is a straight, branched or cyclic, monovalent organic group of 1 to 20 carbon atoms,
   $L^2$ is a straight, branched or cyclic, di- or trivalent hydrocarbon group of 1 to 15 carbon atoms, and
   n is 1 or 2,
   (B) at least one aromatic ring-containing polymer other than the polymer (A), polymer (B) being a polymer resulting from polyaddition and comprising a repeat unit derived from acenaphthylene or a polymer resulting from polycondensation of an aromatic ring-bearing compound,
   (C) at least one near-infrared absorbing dye which comprises at least one cyanine dye capable of absorbing radiation in a wavelength range of 500 to 1,200 nm, wherein said near-infrared absorbing dye (C) has an anion of the general formula (14),

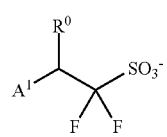

wherein $A^1$ is hydrogen or trifluoromethyl, $R^0$ is hydroxyl or —OC(=O)—R', and R' is a straight, branched, or cyclic $C_1$-$C_{50}$ monovalent hydrocarbon group which may contain a heteroatom, and
   (D) at least one solvent.

2. The composition of claim 1 wherein the polymer (A) accounts for at least 2% by weight of the overall polymers.

3. The composition of claim 1 wherein the polymer (B) comprises repeat units of at least one type capable of undergoing crosslinking reaction with the aid of heat or acid.

4. The composition of claim 3 wherein the repeat units capable of undergoing crosslinking reaction with the aid of heat or acid have an oxirane structure and/or oxetane structure.

5. The composition of claim 1, further comprising at least one component selected from an acid generator, a crosslinker, and a surfactant.

6. A multilayer film comprising a near-infrared absorptive layer which is formed by coating the near-infrared absorptive layer-forming composition of claim 1, and a photoresist layer which is formed on the near-infrared absorptive layer by coating a photoresist composition.

7. The multilayer film of claim 6, further comprising a silicon-containing layer disposed beneath the photoresist layer, the near-infrared absorptive layer being disposed beneath the silicon-containing layer.

8. The multilayer film of claim 6 wherein the near-infrared absorptive layer functions as a layer for absorbing near-infrared radiation used in optical auto-focusing.

9. The multilayer film of claim 6 wherein the near-infrared absorptive layer functions as an antireflective coating for preventing reflection of exposure radiation used in resist pattern formation.

10. The composition of claim 1, wherein the near-infrared absorbing dye (C) has the general formula (5):

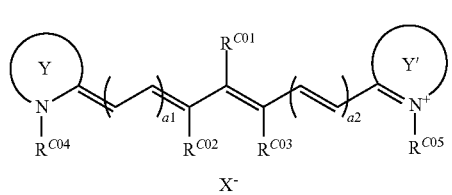

wherein
   $R^{C01}$ is hydrogen, halogen, cyano or a straight, branched or cyclic $C_1$-$C_{20}$ monovalent hydrocarbon group which may contain a heteroatom,
   $R^{C02}$ and $R^{C03}$ are each independently hydrogen or a straight or branched $C_1$-$C_{10}$ monovalent hydrocarbon group, and $R^{C02}$ and $R^{C03}$ may bond together to form a ring with the carbon atoms to which they are attached and the intervening carbon atom,
   $R^{C04}$ and $R^{C05}$ are each independently a straight, branched or cyclic $C_1$-$C_{20}$ monovalent hydrocarbon group which may contain a heteroatom,
   the subscripts a1 and a2 are each independently an integer of 0 to 5,
   the partial structures in formula (5):

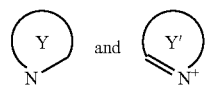

are each independently an aliphatic or aromatic nitrogen-containing heterocyclic compound of 4 to 15 carbon atoms which may contain a heteroatom such as oxygen atom or sulfur atom, and
   $X^-$ is an anion of the general formula (14).

11. The composition of claim 1, wherein polymer (A) comprises 41 to 90 mol %, in total, of repeat units capable of heat or acid-induced crosslinking reaction and having oxirane structure and/or oxetane structure, and polymer (B) comprises 52 to 100 mol % of aromatic ring-bearing repeat units.

12. A near-infrared absorptive layer-forming composition comprising:
(A) at least one polymer comprising repeat units of at least one type selected from the general formula (2), and repeat units of at least one type capable of undergoing crosslinking reaction with the aid of heat or acid and having oxirane structure and/or oxetane structure

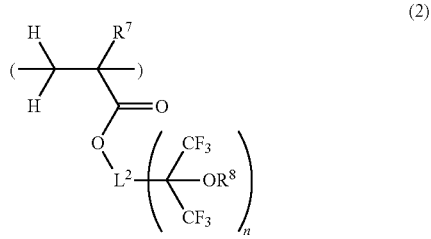

(2)

wherein
$R^7$ is hydrogen, methyl, fluorine or trifluoromethyl,
$R^8$ is a straight, branched or cyclic, monovalent organic group of 1 to 20 carbon atoms,
$L^2$ is a straight, branched or cyclic, di- or trivalent hydrocarbon group of 1 to 15 carbon atoms, and
n is 1 or 2
(B) at least one aromatic ring-containing polymer other than the polymer (A), polymer (B) being a polymer resulting from polyaddition and comprising a repeat unit derived from acenaphthylene or a polymer resulting from polycondensation of an aromatic ring-bearing compound;
(C) at least one near-infrared absorbing dye, wherein said near-infrared absorbing dye (C) has an anion of the general formula (14),

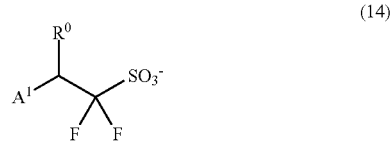

(14)

wherein $A^1$ is hydrogen or trifluoromethyl, $R^0$ is hydroxyl or —OC(=O)—R', and R' is a straight, branched, or cyclic $C_1$-$C_{50}$ monovalent hydrocarbon group which may contain a heteroatom, and
(D) at least one solvent.

13. The composition of claim 12 wherein the polymer (A) accounts for at least 2% by weight of the overall polymers.

14. The composition of claim 12 wherein the polymer (B) comprises repeat units of at least one type capable of undergoing crosslinking reaction with the aid of heat or acid.

15. The composition of claim 14 wherein the repeat units capable of undergoing crosslinking reaction with the aid of heat or acid have an oxirane structure and/or oxetane structure.

16. The composition of claim 12 wherein the near-infrared absorbing dye (C) comprises at least one cyanine dye capable of absorbing radiation in a wavelength range of 500 to 1,200 nm.

17. The composition of claim 12, further comprising at least one component selected from an acid generator, a crosslinker, and a surfactant.

18. A multilayer film comprising
a near-infrared absorptive layer which is formed by coating the near-infrared absorptive layer-forming composition of any one of claims 12 to 17, and
a photoresist layer which is formed on the near-infrared absorptive layer by coating a photoresist composition.

19. The multilayer film of claim 18, further comprising a silicon-containing layer disposed beneath the photoresist layer, the near-infrared absorptive layer being disposed beneath the silicon-containing layer.

20. The multilayer film of claim 18, wherein the near-infrared absorptive layer functions as a layer for absorbing near-infrared radiation used in optical auto-focusing.

21. The multilayer film of claim 18, wherein the near-infrared absorptive layer functions as an antireflective coating for preventing reflection of exposure radiation used in resist pattern formation.

22. The composition of claim 12, wherein the near-infrared absorbing dye (C) is at least one selected from the general formulae (5) to (8):

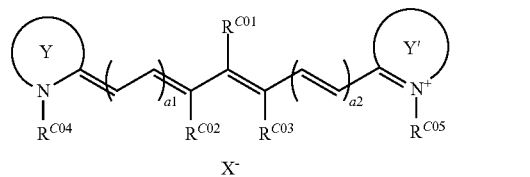

(5)

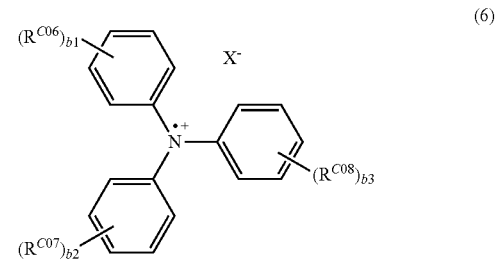

(6)

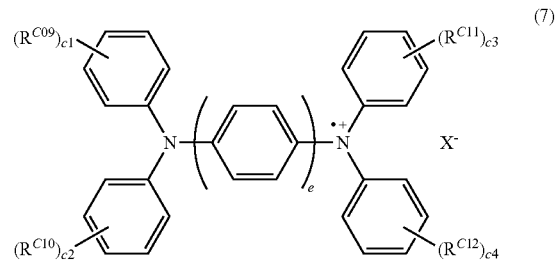

(7)

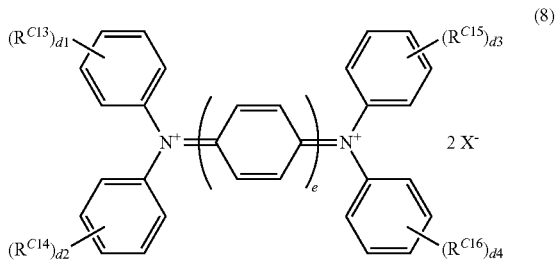

(8)

wherein
$R^{C01}$ is hydrogen, halogen, cyano or a straight, branched or cyclic $C_1$-$C_{20}$ monovalent hydrocarbon group which may contain a heteroatom, $R^{C02}$ and $R^{C03}$ are each independently hydrogen or a straight or branched $C_1$-$C_{10}$ monovalent hydrocarbon group, and $R^{C02}$ and $R^{C03}$ may bond together to form a ring with the carbon atoms to which they are attached and the intervening carbon atom, $R^{C04}$ and $R^{C05}$ are each independently a straight, branched or cyclic $C_1$-$C_{20}$ monovalent hydrocarbon group which may contain a heteroatom, the subscripts a1 and a2 are each independently an integer of 0 to 5, the partial structures in formula (5):

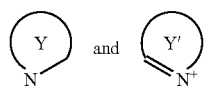

are each independently an aliphatic or aromatic nitrogen-containing heterocyclic compound of 4 to 15 carbon atoms which may contain a heteroatom such as oxygen atom or sulfur atom, $R^{C06}$, $R^{C07}$, and $R^{C08}$ are each independently hydrogen, halogen, cyano, amino, —$R^{C18}$, —$OR^{C18}$, —$SR^{C18}$, —$SO_2R^{C18}$, —$O_2CR^{C18}$, —$CO_2R^{C18}$, or —$N(R^{C18})_2$ wherein $R^{C18}$ is a monovalent organic group optionally containing a heteroatom, the subscripts b1, b2, and b3 are each independently an integer of 0 to 5, $R^{C09}$, $R^{C10}$, $R^{C11}$, and $R^{C12}$ are each independently hydrogen, halogen, cyano, amino, —$R^{C18}$, —$OR^{C18}$, —$SR^{C18}$, —$SO_2R^{C18}$, —$O_2CR^{C18}$, —$CO_2R^{C18}$, or —$N(R^{C18})_2$ wherein $R^{C18}$ is as defined above, the subscripts c1, c2, c3, and c4 are each independently an integer of 0 to 5, and e is 1 or 2, $R^{C13}$, $R^{C14}$, $R^{C15}$, and $R^{C16}$ are each independently hydrogen, halogen, cyano, amino, —$R^{C18}$, —$OR^{C18}$, —$SR^{C18}$, —$SO_2R^{C18}$, —$O_2CR^{C18}$, —$CO_2R^{C18}$, or —$N(R^{C18})_2$ wherein $R^{C18}$ is as defined above, the subscripts d1, d2, d3, and d4 are each independently an integer of 0 to 5, and $X^-$ is an anion of the general formula (14).

23. The composition of claim 12, wherein polymer (A) comprises 41 to 90 mol %, in total, of repeat units capable of heat or acid-induced crosslinking reaction and having oxirane structure and/or oxetane structure, and polymer (B) comprises 52 to 100 mol % of aromatic ring-bearing repeat units.

* * * * *